United States Patent [19]

Blanchard

[11] Patent Number: 4,767,722
[45] Date of Patent: Aug. 30, 1988

[54] METHOD FOR MAKING PLANAR VERTICAL CHANNEL DMOS STRUCTURES

[75] Inventor: Richard A. Blanchard, Los Altos, Calif.

[73] Assignee: Siliconix incorporated, Santa Clara, Calif.

[21] Appl. No.: 843,454

[22] Filed: Mar. 24, 1986

[51] Int. Cl.$^4$ .................... H01L 21/38; H01L 21/425
[52] U.S. Cl. ..................................... 437/41; 437/913; 357/23.4
[58] Field of Search ........................ 29/571, 580, 576 J, 29/576 E; 156/643; 357/57, 55, 23.4; 148/DIG. 168, DIG. 50; 437/41

[56] References Cited

U.S. PATENT DOCUMENTS

| | | | |
|---|---|---|---|
| 3,398,339 | 8/1968 | Blanchard et al. | 29/571 |
| 3,412,297 | 11/1968 | Amlinger | 357/23.4 |
| 3,500,139 | 3/1970 | Fruin et al. | 148/DIG. 50 |
| 3,518,509 | 6/1970 | Cullis | 357/23.4 |
| 4,344,081 | 8/1982 | Pao et al. | 357/43 |
| 4,345,265 | 8/1982 | Blachard | 29/571 |
| 4,353,086 | 10/1982 | Jaccodine et al. | 29/580 |
| 4,364,074 | 12/1982 | Garnache et al. | 148/188 |
| 4,374,455 | 2/1983 | Goodman | 29/580 |
| 4,454,646 | 6/1984 | Joy et al. | 29/576 W |
| 4,454,647 | 6/1984 | Joy et al. | 29/576 W |
| 4,455,740 | 6/1984 | Iwai | 148/DIG. 50 |
| 4,509,249 | 4/1985 | Goto et al. | 29/576 W |
| 4,520,552 | 6/1985 | Arnould | 29/580 |
| 4,528,047 | 7/1985 | Beyer et al. | 148/175 |
| 4,546,367 | 10/1985 | Schutten et al. | 357/55 |
| 4,554,728 | 11/1985 | Shepard | 148/DIG. 50 |
| 4,571,815 | 2/1986 | Baliga et al. | 29/578 |
| 4,582,565 | 4/1986 | Kawakatsu | 29/580 |
| 4,593,302 | 6/1986 | Lidow et al. | 357/23.4 |
| 4,596,999 | 6/1986 | Gobrecht et al. | 357/55 |
| 4,631,803 | 12/1986 | Hunter et al. | 29/578 |
| 4,639,754 | 1/1987 | Wheatley, Jr. et al. | 357/23.4 |
| 4,680,853 | 7/1987 | Lidow et al. | 29/571 |
| 4,682,405 | 7/1987 | Blanchard et al. | 29/571 |

FOREIGN PATENT DOCUMENTS

| | | | |
|---|---|---|---|
| 0164095 | 12/1985 | European Pat. Off. | 357/23.4 |
| 53-149771 | 12/1978 | Japan | 357/23.4 |
| 55-146976 | 11/1980 | Japan | . |
| 0003287 | 1/1983 | Japan | 357/23.4 |
| 0050752 | 3/1983 | Japan | 29/576 W |
| 0065447 | 4/1984 | Japan | 29/576 W |
| 0108325 | 6/1984 | Japan | 29/576 W |

OTHER PUBLICATIONS

Ueda, 'A New Vertical Power MOSFET Structure with Extremely Reduced On-Resistance,' IEEE Tras. on Electron Devices, vol. Ed. 32, No. 1, Jan. 85, pp. 2-6.

Baliga, "The Insulated Gate Transistor: A New Three-Terminal MOS Controlled Dipolar Power Device, IEEE Trans. on Elect. Dev., vol. Ed. 31, Jun. 84, pp. 821-828.

Ghandhi, "VLSI Fabrication Principles", John Wiley & Sons, N.Y., 1983, pp. 582-585.

Ammar et al., "UMOS Transistors on (110) Silicon", IEEE Transactions on Electron Devices, vol. ED-27, No. 5, May 1980, pp. 907-914.

Pshaenich, "MOS Thyristor Improves Power-Switching Circuits", Electronic Design, May 12, 1983, pp. 165-170.

Rung et al., "Deep Trench Isolated CMOS Devices", IEDM 1982, pp. 237-240.

Primary Examiner—George T. Ozaki
Attorney, Agent, or Firm—Kenneth E. Leeds; Alan H. MacPherson; Paul J. Winters

[57] ABSTRACT

A DMOS power transistor has a vertical gate and a planar top surface. A vertical gate fills a rectangular groove lined with a dielectric material which extends downward so that source and body regions lie on each side of the dielectric groove. Carriers flow vertically between source and body regions and the structure has a flat surface for all masking steps.

11 Claims, 5 Drawing Sheets

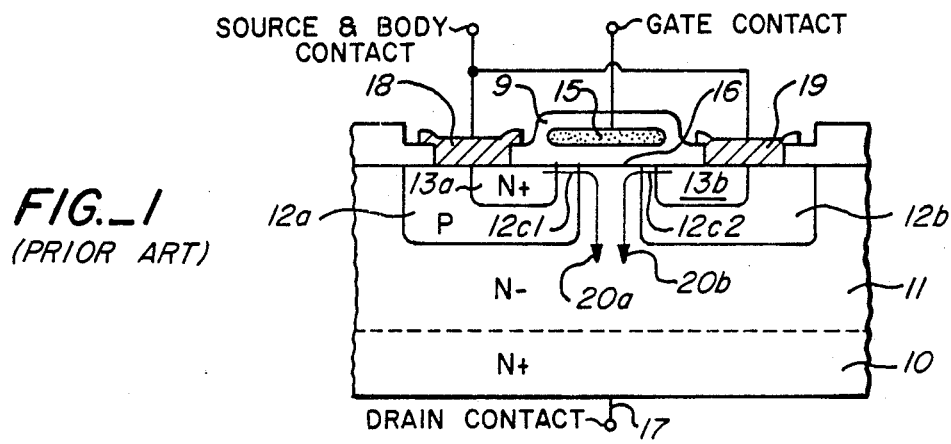
FIG._1 (PRIOR ART)
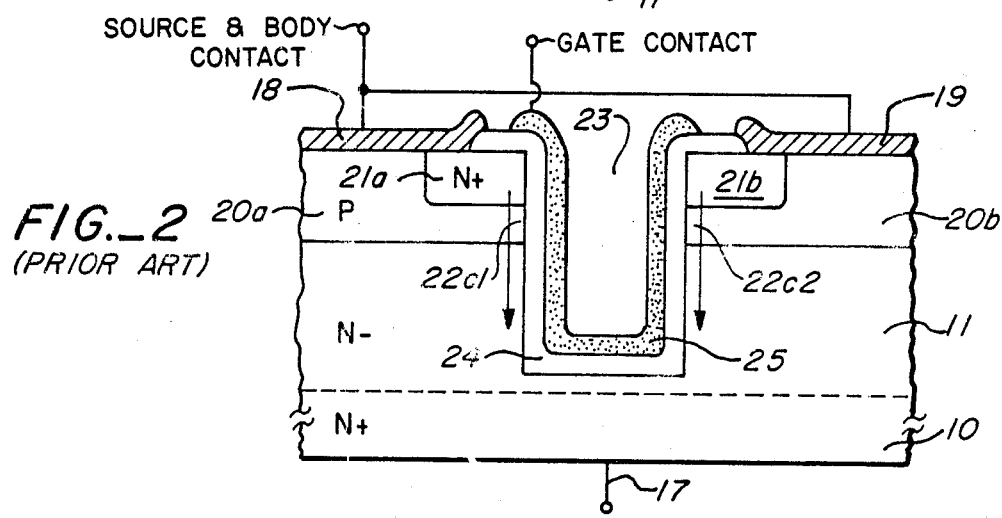
FIG._2 (PRIOR ART)
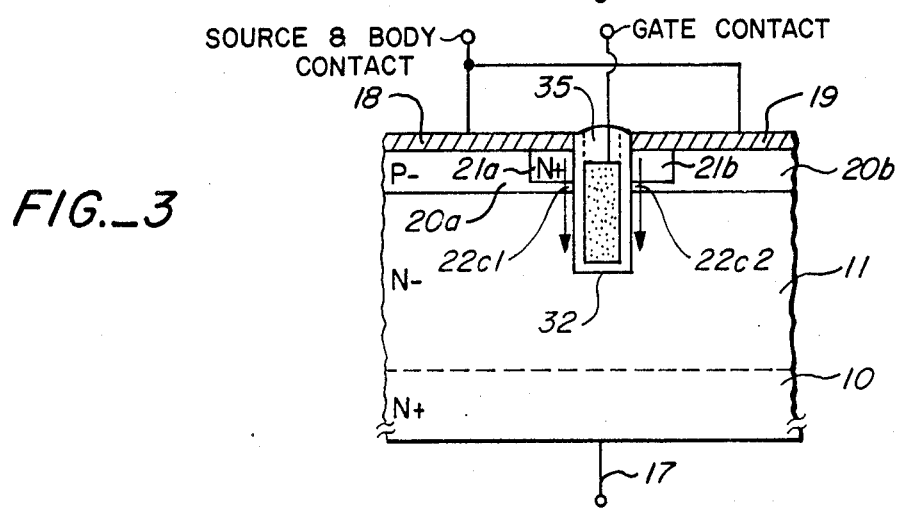
FIG._3

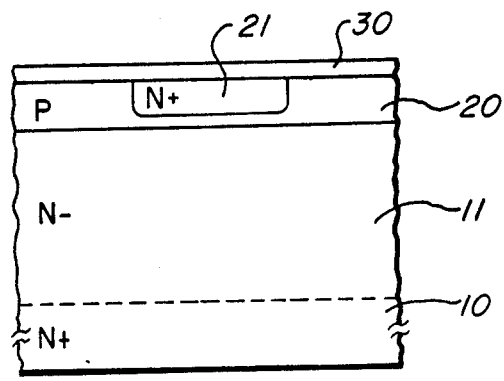
FIG._4a
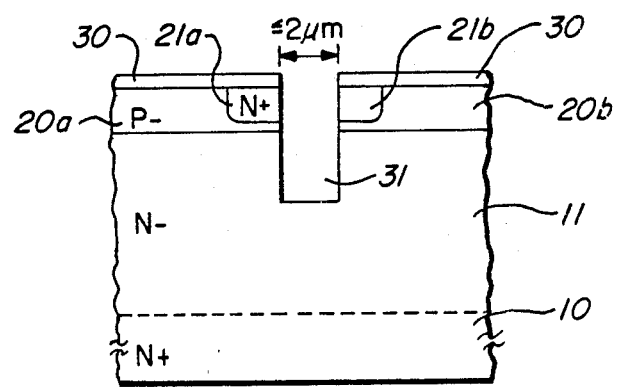
FIG._4b
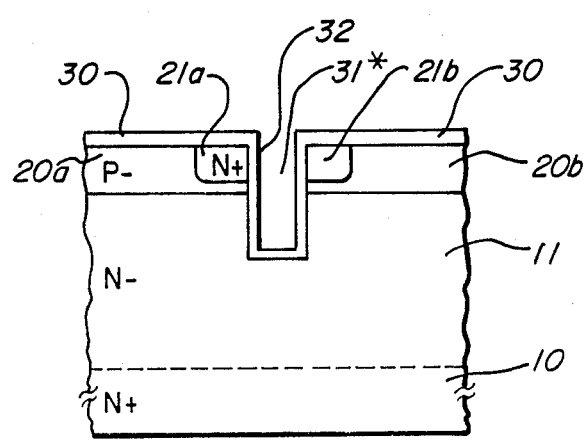
FIG._4c

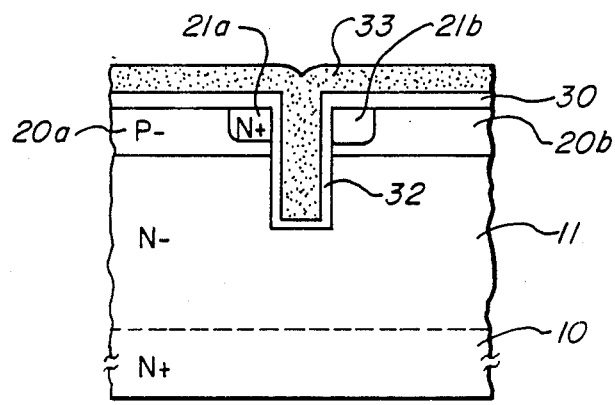
FIG._4d
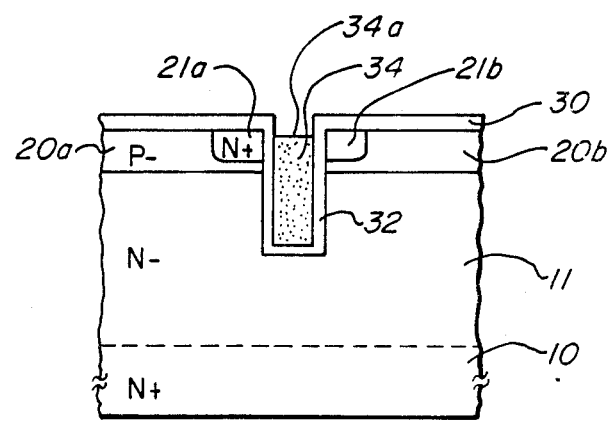
FIG._4e
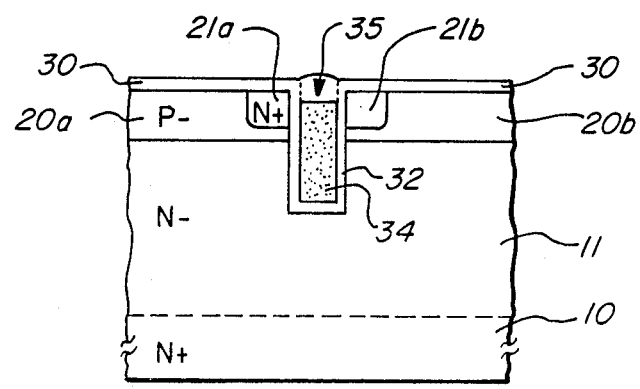
FIG._4f

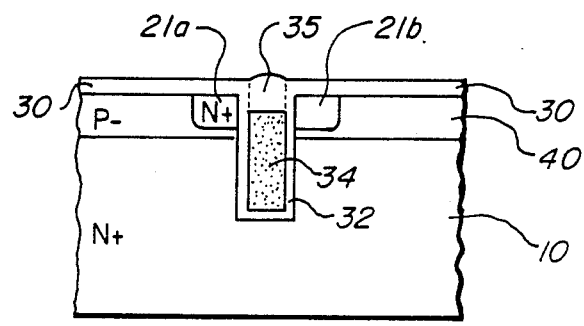
FIG._5
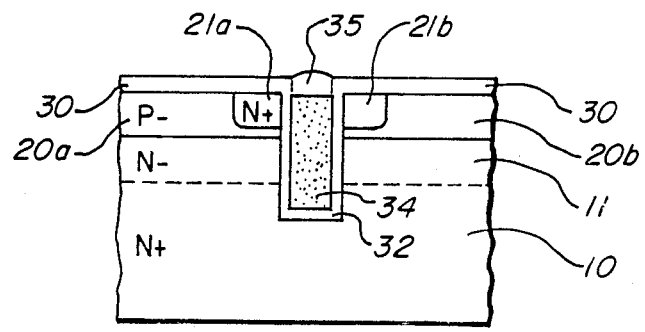
FIG._6
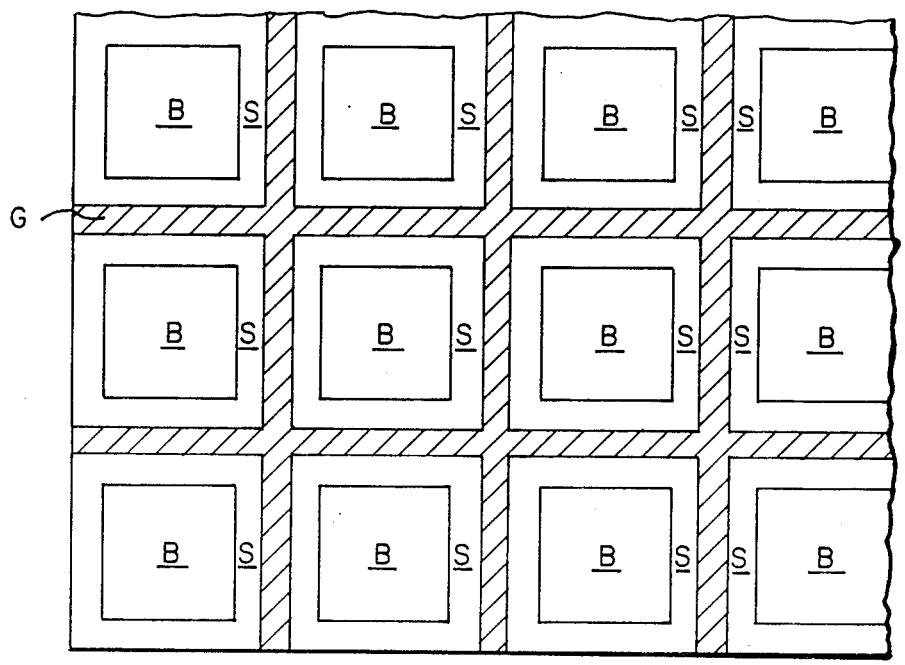
FIG._9

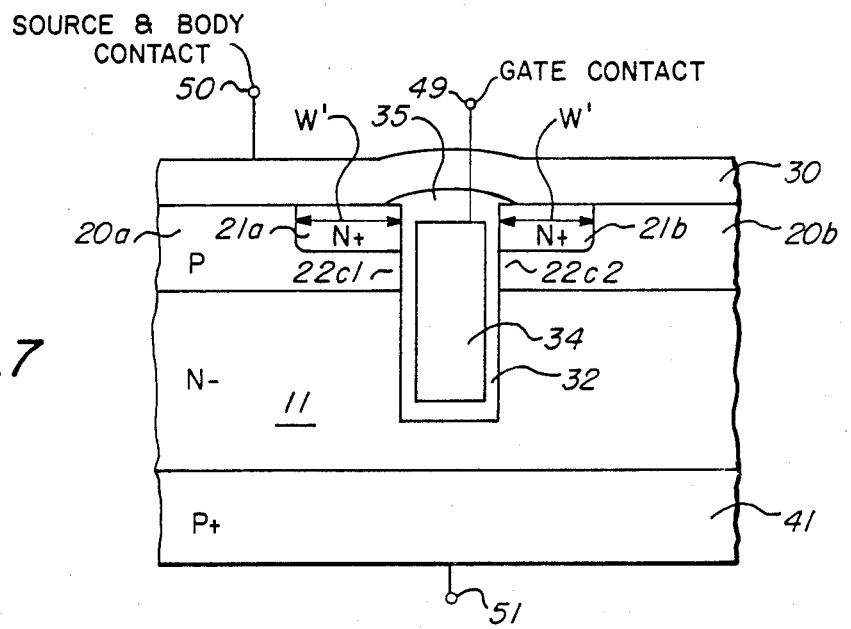
FIG._7
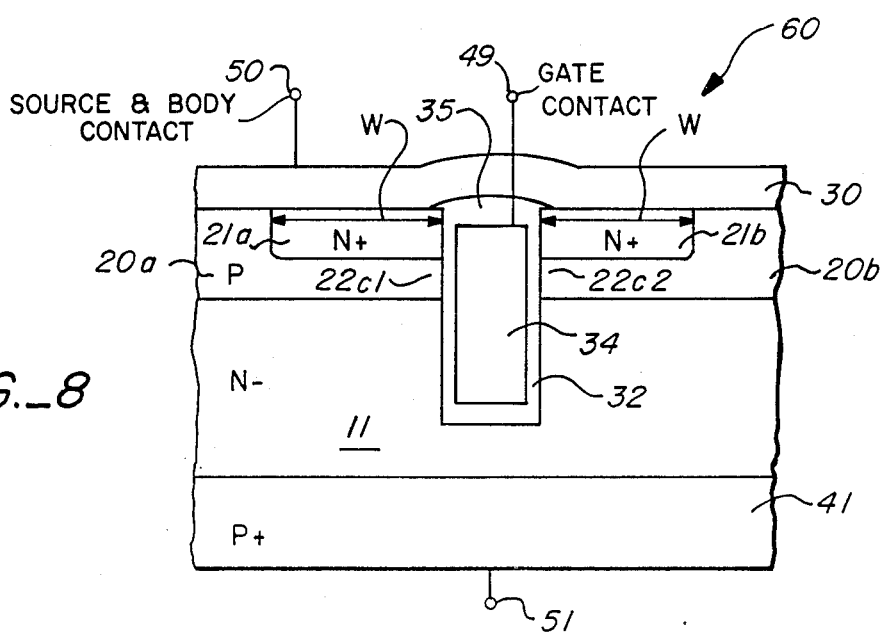
FIG._8

METHOD FOR MAKING PLANAR VERTICAL CHANNEL DMOS STRUCTURES

FIELD OF THE INVENTION

This invention relates to a double diffused MOS (DMOS) transistor having a vertical channel region, and in particular to a planar DMOS transistor having a vertical gate.

BACKGROUND OF THE APPLICATION

Double diffused MOS (DMOS) transistors are well known in the prior art. For example, U.S. Pat. No. 4,344,081, issued to Pao et al. on Aug. 10, 1982, which is incorporated herein by reference, shows on such prior art structure. FIG. 1 shows a cross section of a prior art N-channel DMOS power transistor. This prior art structure includes an N$^-$ epitaxial layer 11 formed on an N$^+$ silicon substrate 10. Gate oxide layer 16 is formed on epitaxial layer 11 and doped polysilicon gate 15 is formed on oxide layer 16. Oxide layer 9 covers gate 15. P-type body regions 12a and 12b are diffused into epitaxial layer 11, and N$^+$ source regions 13a and 13b are diffused into body regions 12a and 12b, respectively. Source regions 13a and 13b are electrically tied to body regions 12a and 12b by metal contacts 18 and 19, respectively. Contacts 18 and 19 are also electrically tied together. Regions 12c1 and 12c2 beneath gate 15 in body regions 12a and 12b, respectively, are channel regions. When the potential between gate 15 and source regions 13a and 13b is sufficiently high and with a positive voltage on drain contact 17, carriers flow laterally from source regions 13a and 13b through channel regions 12a and 12b, respectively, to drain region 11 and then vertically downward through drain region 11 and N$^+$ substrate 10 to drain contact 17, as indicated by arrows 20a and 20b in FIG. 1. P-channel DMOS transistors have a similar structure, but P-type and N-type regions are reversed, and a voltage of the opposite sign produces current flow.

As explained above, the carriers that flow in the prior art vertical DMOS transistors shown in FIG. 1 must change direction, first flowing laterally and then vertically. Carrier flow is more efficient if the source, body and drain regions are arranged vertically as shown in FIG. 2. FIG. 2 shows a cross section of a prior art DMOS transistor with a U shaped gate extending into the epitaxial layer. This structure is due to Ueda et al. and is explained in more detail in *A New Vertical Power MOSFET Structure with Extremely Reduced On-Resistance*, IEEE TRANSACTIONS ON ELECTRON DEVICES, Vol. ED-32, NO. 1, January 1985, which is incorporated herein by reference. In this prior art structure N$^-$ epitaxial layer 11 is again formed on N$^+$ substrate 10. A P-type dopant is diffused into epitaxial layer 11 and an N$^+$-type dopant is diffused into a portion of the epitaxial layer that has been doped with a P-type dopant. Rectangular groove 23, having vertical walls, is then etched in the epitaxial layer using reactive ion beam etching, thereby creating P-type body regions 20a and 20b and corresponding N$^+$ source regions 21a and 21b as shown in FIG. 2. Source regions 21a and 21b are electrically tied to body regions 20a and 20b, respectively, by metal contacts 18 and 19 which are also electrically tied together. A slight wet etch is then applied to smooth the surface of groove 23. Gate oxide 24 is formed in rectangular groove 23, and a U shaped polysilicon gate 25 is formed over gate oxide 24.

The prior art structure of FIG. 2 has the advantage that when the gate to source potential is sufficient to turn on the transistor, carriers flow vertically from N$^+$ source regions 21a and 21b through channel regions 22c1 and 22c2 in body regions 20a and 20b, respectively, and continue to flow vertically downward through drain region 11 to N$^+$ substrate 10 and drain contact 17. However, the structure of FIG. 2 has a disadvantage in that it is difficult to fabricate because it requires the formation of a U-shaped gate and results in a transistor with a nonplanar surface.

SUMMARY OF THE INVENTION

A DMOS device is disclosed which has a vertical gate and a planar surface. The device has a flat surface for all masking steps while still allowing contact to be made to the vertical gate.

In one embodiment, a DMOS power transistor is disclosed which has a drain region of a first conductivity type, a body region of a second conductivity type formed above the drain region, and a source region is first conductivity type. An upward opening rectangular groove extends downward through the source and body regions and into the drain region so that a first source region in a first body region lies on one side of the rectangular groove and a second source region in a second body region lies on the other side of the rectangular groove.

The upward opening rectangular groove is lined with an upward opening dielectric region which is filled with the gate region so that a vertical gate is formed having a top surface which lies between the first and second source regions. An insulating layer is then formed over the above structure so that a transistor with a planar surface is obtained. In operation, carriers flow vertically between the source and drain regions.

In another embodiment, a semiconductor device having a vertical gate region is formed in a block of semiconductor material. The vertical gate region lies in an upward opening dielectric region which lines an upward opening rectangular groove. A source region of a first conductivity type is formed above a body region of a second conductivity type which lies above a drain region of a first conductivity type. The source, body and drain regions are all adjacent one vertical surface of the dielectric material. The top surface of the vertical gate region lies opposite the source region and the bottom surface of the gate region lies opposite the drain region. The second embodiment also includes an insulating layer formed over the gate, source and body regions resulting in a device with a planar top surface. Still other embodiments are described below.

BRIEF DESCRIPTION OF THE DRAWING

FIG. 1 shows a prior art N-channel DMOS transistor;

FIG. 2 shows a prior art DMOS transistor having vertical channel regions;

FIG. 3 shows one embodiment of the DMOS structure of the present invention;

FIGS. 4a through 4f show process steps in the formation of the transistor shown in FIG. 3;

FIG. 5 shows a second embodiment of the DMOS transistor of the present invention;

FIG. 6 shows a third embodiment of the DMOS transistor of the present invention;

FIG. 7 shows a cross-section of an insulated gate transistor formed according to the present invention;

FIG. 8 shows a cross-section of an MOS-gated silicon controlled rectifier formed according to the present invention; and FIG. 9 shows a top view of one surface geometry employed by the present invention.

DETAILED DESCRIPTION OF THE INVENTION

FIG. 3 shows one embodiment of the vertical gate planar DMOS power transistor of the present invention. The process sequence for fabricating this N-channel transistor is shown in FIGS. 4a–4f. In other embodiments, the vertical gate planar DMOS transistor of the present invention is a P-channel device.

Substrate 10 shown in FIG. 4a is a silicon wafer doped with N-type impurities so that its resistivity is within the range of 0.005 to 0.1 ohm-cm (in one embodiment, 0.02 ohm-cm). An N-type epitaxial layer 11 having a resistivity between 0.2 and 100 ohm-cm (in one embodiment, 2.4 ohm-cm) is then grown on substrate 10 to a thickness between 6 and 150 microns (in one embodiment, 13.5$\mu$). Substrate 10 and epitaxial layer 11 typically have a [100] crystal orientation.

A layer of dielectric material (not shown) is then formed over the wafer by heating the wafer in an oxygen atmosphere at about 900°–1200° C. to form a silicon dioxide layer approximately 1,000–10,000 Å thick over the surface of the wafer. Using standard photoresist techniques, a body mask pattern is transferred to the surface of the silicon dioxide layer which exposes those regions of the silicon dioxide layer through which ions are implanted to form P region 20. (In one version, no body mask is needed, and P-type dopant is implanted to form region 20.) In one embodiment, P region 20 is formed by implanting boron ions at a dosage between $10^{13}$ and $2 \times 10^{14}$ ions/cm$^2$ at an energy level between 40 and 120 KEV and then annealing the structure for approximately 4 to 12 hours in an atmosphere of oxygen or nitrogen. P region 20 typically ranges in depth from 2 to 4 microns. Alternatively, P region 20 may be formed using standard diffusion techniques.

After a source mask is applied to the wafer, the wafer may then be etched to thin or remove the silicon dioxide formed during the annealing process. (If the oxide formed after the body diffusion is not too thick, i.e., it does not block the implant, no thinning etch is needed.) An N-type ion implantation is performed using arsenic or phosphorus ions at a dosage between $5 \times 10^{14}$ and $1 \times 10^{16}$ ions/cm$^2$ using an implant energy of 50 to 150 KEV. The wafer is then annealed at a temperature of 900°–1200° C. for approximately 0.5 to 3 hours in an atmosphere of oxygen and nitrogen to form N+ source region 21 which typically ranges in depth from 1 to 2 microns.

The silicon dioxide layer 30 is formed during the above source drive-in. A gate groove mask (not shown) is applied, and the SiO$_2$ layer is etched using buffered HF.

As shown in FIG. 4b, rectangular groove 31 having vertical sidewalls is then etched using reactive ion beam etching or other etching technique which permits anisotropic etching regardless of crystallographic orientation. Groove 31 preferably has a width less than or equal to 2 $\mu$m and a depth between 3 $\mu$m and 10 $\mu$m. As shown in FIG. 4c, gate dielectric layer 32 is then formed over the surfaces of the groove 31. In one embodiment, gate dielectric layer 32 is silicon dioxide having a thickness in a range of 500–1000 Å and is formed by heating the wafer in an oxygen ambient containing water at a temperature of 900°–1100° C. for 0.5 to two hours (in another embodiment, insulating layer 32 is a combination of silicon dioxide and silicon nitride which is either grown or deposited). The gate dielectric forms an inner, upward opening, rectangular groove 31*.

Polysilicon layer 33 (shown in FIG. 4d) is then deposited using a low pressure chemical vapor deposition process (LPCVD) to a thickness sufficient to fill rectangular groove 31*. For example, if groove 31 is 1.5 microns wide and 6 microns deep, polycrystalline silicon layer 33 is deposited with a thickness of 1–2 $\mu$m. Polycrystalline silicon layer 33 is doped either during deposition or subsequent to deposition, typically using phosphorus, so that it has a sheet resistance of between 30 and 50 ohms/square. Alternatively, in another embodiment, layer 33 comprises a layer of silicide formed using conventional techniques to a depth sufficient to fill rectangular groove 31*.

Polycrystalline silicon layer 33 is then subjected to a CF$_4$ etch or another etch technique without using a mask in the trenched area, groove 31*, (except for a mask (not shown) which may be placed at any convenient point along the length of groove 31 in order to keep a contact pad (not shown) to the to-be-formed gate 34 shown in FIG. 4e) in order to remove the polycrystalline silicon not in groove 31*. The portion of polycrystalline silicon layer 33 remaining in groove 31* after the CF$_4$ etch is denoted by 34 in FIG. 4e and serves as the gate of the vertical DMOS transistor. The etch is continued until top surface 34a lies 0.25–0.5 $\mu$m below the top surface of layer 30. This top surface depth is controlled by etch time past clearing the field. The etch must be terminated so that gate 34 overlaps N+ regions 21a and 21b shown in FIG. 4f after the subsequent oxidizing step. The wafer is then oxidized in an atmosphere containing oxygen (which consumes a portion of polysilicon layer 33 in groove 31*) until the top surface of the oxidized portion 35 above gate 34 forms an essentially flat (planar) surface with the top surface of passivating layer 30 whose thickness may also be slightly increased during the formation of region 35. Of importance, the etch to form surface 34a must be terminated sufficiently soon so that after the oxidation which forms silicon dioxide layer 35, the top portion of gate 34 overlaps N+ source regions 21a and 21b (see FIG. 4f).

The above structure has a flat surface for all masking steps while still allowing contact to be made to the gate region. The source/body contact shown schematically in FIG. 3 is fabricated using prior art techniques, and in cross section typically appears as shown in FIG. 1.

When the gate-to-source potential is sufficiently high and with a positive potential on drain 17 (FIG. 3), electrons flow vertically from N+ source regions 21a and 21b through channel regions 22c1 and 22c2 in body regions 20a and 20b, respectively, and continue to flow vertically downward through drain 11 and N+ substrate (drain) 10 to drain contact 17.

Typically, many DMOS devices similar to the one shown in cross section in FIG. 3 are formed simultaneously. Layout efficiency varies with surface geometry. There is a wide variety of layouts. FIG. 9 shows a top view of one surface geometry employed by this invention, namely, a square source and body region on a square gate grid 35. In FIG. 9, S denotes the locations of the source regions, B the locations of the body regions, and G the locations of the gate regions. The dotted line shown in FIG. 9 corresponds to the cross section shown in FIG. 3. In another layout, (not shown) the gate and source and body regions are interdigited. Another layout (not shown) has hexagonal source and body regions on an hexagonal gate grid. Still another layout employs square source and body regions on a hexagonal gate grid. The latter layout is more efficient than the others. Other source geometries include rectangles, circles and triangles.

The structure shown in FIG. 3 reduces the total area requirement from 30% to 50% below that of the Ueda device shown in FIG. 2.

FIG. 5 shows a cross section of an alternate embodiment of the invention in which a P− epitaxial layer 40 is formed on substrate 10 in place of N− epitaxial layer 11 and in which gate 34 in groove 31 reaches through to the N+ substrate. In this embodiment the P− epitaxial layer serves as the body region of the transistor. This embodiment results in a transistor having a lower on resistance than the device shown in FIG. 4a by as much as a factor of 2 and a lower breakdown voltage (typically around 30 volts) than the device shown in FIG. 4a.

FIG. 6 shows another alternate embodiment of the invention which is similar to the embodiment shown in FIG. 4f except that groove 31 is formed sufficiently deep so that gate 34 extends completely through the epitaxial layer 11 and into substrate region 10. This alternate embodiment also has a lower on resistance and a lower breakdown voltage (typically about 30 volts) than the device shown in FIG. 4a. This is acceptable in low voltage applications, for example, low voltage motors and Schottky diode replacements.

The above description has been given in terms of DMOS transistors, but the invention also applies to other MOS-gated devices such as an MOS-gated SCR or a MOS-gated conductivity modulated device.

FIG. 7 shows a cross section of one embodiment for an insulated gate transistor. FIG. 8 shows a cross section of one embodiment for an MOS-gated silicon controlled rectifier.

The silicon controlled rectifier shown in FIG. 8 is fabricated in the same manner as explained above for the transistor shown in FIG. 3 in connection with FIGS. 4a through 4f except that the starting material is a silicon substrate 41 heavily doped with P-type material, for example doped with Boron to a resistivity of 0.01 ohm-cm.

In operation, silicon controlled rectifier 60 is switched on by appropriately biasing source/body terminal 50 (shown schematically in FIG. 8), which provides electrical contact to source regions 21a and 21b and body regions 20a and 20b, gate terminal 49, which contacts gate 34, and substrate contact 51. Gate contact 49 and substrate contact 51 are biased positive relative to source/body contact 50. MOSFET mode conduction is initiated by electrons flowing from source regions 21a and 21b through channel regions 22c1 and 22c2, respectively, to N− drain region 11.

Drain region 11 also serves as the base for the PNP bipolar (junction) transistors comprising emitter region 20a, base 11, and collector region 41; and emitter region 20b, base 11, and collector region 41, respectively. With substrate contact 51 biased positively with respect to source/body contact 50 and with electrons flowing into base 11, the bipolar transistors are triggered into conduction and may latch in the on state even when the gate bias is removed.

The insulated gate transistor shown in FIG. 7 is similar to the structure shown in FIG. 8 except that in order to suppress thyristor action, the IGT shown in FIG. 7 is designed with narrow N+ source regions 21a and 21b which reduce the lateral body resistance beneath the source regions. See *The Insulated Gate Transistor: A New Three-Terminal MOS-Controlled Bipolar Power Device*, IEEE Trans. on Electron Devices, Vol. ED-31 No. 6, June 1984, which is incorporated herein by reference. For example, the width w′ of N+ source regions 21a and 21b in FIG. 7 is typically between 2 μm and 4 μm whereas the width w of N+ source regions 21a and 21b in FIG. 8 is typically between 6 μm and 8 μm. The doping profile of the body regions beneath source regions 21a and 21b in FIG. 7 is also selected to reduce lateral body resistance beneath source regions 21a and 21b. See Blanchard, U.S. Pat. No. 4,345,265, issued Aug. 17, 1982, which is incorporated herein by reference. A low lateral body resistance beneath source regions 21a and 21b in FIG. 7 prevents the NPN transistor formed by source regions 21a and 21b, body regions 22c1 and 22c2, and the N-type drain region 11 from becoming active. As long as this NPN bipolar transistor does not turn on, the regenerative action characteristic of an SCR does not occur.

The above embodiments are meant to be exemplary and not limiting. In view of the above disclosure, many modifications and substitutions will be obvious to one of average skill in the art without departing from the scope of the invention.

I claim:

1. A method of making a semiconductor device comprising the following steps:

forming a first region of a semiconductor material having a first conductivity type;

forming a second region of a semiconductor material having a second conductivity type above and in contact with said first region, said second region having a top surface;

forming a third region of said first conductivity type in a first portion of said second region, said third region extending to a first portion of said top surface;

forming a first groove in said first portion of said top surface, said first groove extending downward through said third and said second regions into said first region so that a first portion of said third region and a first portion of said second region lie on one side of said first groove and a second portion of said third region and a second portion of said second region lie on the other side of said first groove;

lining said first groove with a dielectric material, thereby forming a second, inner groove;

filling the bottom portion of said second, inner groove with a conductive material so that a top surface of said conductive material in said second, inner groove lies between said first portion and said second portion of said third region, said conductive material serving as a gate; and forming an insulating layer having a planar top surface over the device resulting from the preceding steps, the thickness of the portion of said insulating layer over said conductive material being greater than the thickness of the portion of said insulating layer over said third region.

2. A method as in claim 1 wherein said first region is formed on a fourth region of semiconductor material of said second conductivity type.

3. A method of making a semiconductor device comprising the following steps:
   forming a first region of a semiconductor material having a first conductivity type;
   forming a second region of a semiconductor material having a second conductivity type above and in contact with said first region, said second region having a top surface;
   forming a third region of said first conductivity type in a first portion of said second region, said third region extending to a first portion of said top surface;
   forming a first groove in said top surface, and first groove extending downward into said first region so that a portion of said third region and a portion of said second region lies adjacent said first groove on one side of said first groove;
   lining said first groove with a dielectric material, thereby forming a second, inner groove;
   filling the bottom portion of said second, inner groove with a conductive material so that a top surface of said conductive material in said second, inner groove lies opposite said portion of said third region, said conductive material serving as a gate; and
   forming an insulating layer having a planar top surface over the device resulting from the preceding steps, the thickness of the portion of said insulating layer over said conductive material being greater than the thickness of the portion of said insulating layer over said third region.

4. A method as in claim 3 wherein said first region is formed on a fourth region of semiconductor material of said second conductivity type.

5. A method for making a semiconductor device comprising the following steps:
   providing a first region of semiconductor material having a first conductivity type;
   forming a second region of semiconductor material having a second conductivity type above said first region;
   forming a third region of said first conductivity type above a portion of said second region;
   forming a first groove, said first groove extending downward through said third and said second regions into said first region so that a first portion of said third region and a first portion of said second region lie on at least one side of said first groove;
   lining said first groove with a dielectric material, thereby forming a second, inner groove;
   filling the bottom portion of said second, inner groove but not the top portion of said second inner groove with a conductive material so that the top surface of said conductive material in said second, inner groove lies adjacent to the portion of dielectric material adjacent to said third region, said conductive material serving as a gate;
   forming an insulating layer having a planar top surface over the device resulting from the preceding steps, wherein the portion of the insulating layer over said conductive material is thicker than the portion of the insulating layer over said third region;
   removing at least a portion of said insulating layer over said third region; and
   forming a conductive layer electrically contacting said third region.

6. The method of claim 5 further comprising the steps of:
   forming a mask on a first portion of said conductive material in said second, inner groove, a second portion of said conductive material not being covered by said mask;
   removing part of said second portion of said conductive material, the remaining conductive material in said second, inner groove serving as a gate; and
   and forming an electrically conductive layer for electrically contacting said first portion of said conductive material.

7. The method of claim 5 further comprising the step of removing a portion of said conductive material in said second, inner groove so that a top portion of said second, inner groove adjacent to said dielectric material is not filled with conductive material, said step of forming an insulating layer comprising the step of forming insulating material in said top portion of said second, inner groove.

8. The method of claim 5 wherein said step of filling the bottom portion comprises the steps of forming said conductive material in said second, inner groove and on the surface of said third region and then etching said conductive material so that said conductive material on the surface of said third region adjacent to said second, inner groove is removed.

9. The method of claim 5 wherein said step of filling the bottom portion comprises the step of forming said conductive material in said second inner groove and etching a portion of said conductive material in said second, inner groove.

10. A method for making a semiconductor device comprising the steps of:
    providing a first region of semiconductor material of a first conductivity type;
    forming a second region of semiconductor material of a second conductivity type on said first region;
    forming a plurality of semiconductor regions of said first conductivity type within said second region;
    etching a plurality of grooves so that each groove extends through an associated one of said regions within said plurality of semiconductor regions, through said second region and into said first region;
    lining said plurality of grooves with an insulating layer;
    filling the bottom portion of said grooves with conductive material, said conductive material serving as a gate;
    forming an insulating layer on said conductive material so that the top surface of said semiconductor device is planar; and
    electrically contacting the bottom surface of said first region and the top surface of said plurality of semiconductor regions,
      wherein said plurality of semiconductor regions, first region, second region, and the conductive material in said plurality of grooves serve as a plurality of cells of a vertical transistor.

11. The method of claim 10 wherein at the conclusion of said step of etching a plurality of grooves, each said grooves divide said second region into a plurality of semiconductor regions of said second conductivity type, and wherein said plurality of grooves laterally surround said plurality of semiconductor regions of said first conductivity type and said plurality of semiconductor regions of said second conductivity type, and wherein at the conclusion of said step of filling the bottom portion of said grooves, said gate laterally surrounds said plurality of semiconductor regions of said first and second conductivity type.

* * * * *

(12) EX PARTE REEXAMINATION CERTIFICATE (6423rd)
United States Patent
Blanchard

(10) Number: US 4,767,722 C1
(45) Certificate Issued: Sep. 9, 2008

(54) METHOD FOR MAKING PLANAR VERTICAL CHANNEL DMOS STRUCTURES

(75) Inventor: Richard A. Blanchard, Los Altos, CA (US)

(73) Assignee: Siliconix Incorporated

Reexamination Request:
No. 90/007,086, Jun. 17, 2004
No. 90/007,216, Sep. 21, 2004

Reexamination Certificate for:
Patent No.: 4,767,722
Issued: Aug. 30, 1988
Appl. No.: 06/843,454
Filed: Mar. 24, 1986

(51) Int. Cl.
*H01L 21/336* (2006.01)
*H01L 21/02* (2006.01)
*H01L 29/739* (2006.01)
*H01L 29/06* (2006.01)
*H01L 29/40* (2006.01)

(52) U.S. Cl. .................. 438/270; 438/589; 257/341; 257/E21.419; 257/E29.126; 257/E29.131; 257/E29.201; 257/E29.216; 257/E29.26; 257/E29.067; 257/E29.028

(58) Field of Classification Search .................. None
See application file for complete search history.

(56) References Cited

U.S. PATENT DOCUMENTS

| | | |
|---|---|---|
| 2,981,877 A | 4/1961 | Noyce |
| 3,025,589 A | 3/1962 | Hoerni |
| 3,355,291 A | 11/1967 | Baird et al. |
| 3,356,858 A | 12/1967 | Wanlass |
| 3,383,568 A | 5/1968 | Cunningham |
| 3,412,297 A | 11/1968 | Amlinger |
| 3,436,611 A | 4/1969 | Perry |
| 3,481,781 A | 12/1969 | Kern |
| 3,482,119 A | 12/1969 | Tantraporn et al. |
| 3,497,407 A | 2/1970 | Esch et al. |
| 3,503,124 A | 3/1970 | Wanlass et al. |
| 3,507,716 A | 4/1970 | Nishida et al. |
| 3,536,547 A | 10/1970 | Chilcote |
| 3,546,013 A | 12/1970 | Perri et al. |
| 3,575,743 A | 4/1971 | Chiovarou et al. |

(Continued)

FOREIGN PATENT DOCUMENTS

| | | |
|---|---|---|
| CH | 657230 A5 | 8/1986 |
| DE | 2545908 A | 5/1976 |
| DE | 2855546 C2 | 7/1979 |
| DE | 2855546 A1 | 7/1979 |
| DE | 3030538 A1 | 4/1981 |
| DE | 3147075 A1 | 7/1982 |
| DE | 3242736 | 11/1982 |
| DE | 3324017 A1 | 1/1984 |
| DE | 3407975 A1 | 9/1984 |
| DE | 3411020 A1 | 10/1984 |

(Continued)

OTHER PUBLICATIONS

Ghandi, VLSI Fabrication Principles, 2nd ed., John Wiley & Sons: New York, 1994, p. 601.*

Siliconix Incorporated's Opening Claim Construction Brief, filed Jul. 2, 2004 in U.S. District Court, Northern District of California, Case No. C 03–4803 WHA, 35 pgs.

Defendants Alpha and Omega Semiconductor Incorporated and Alpha and Omega Semiconductor Limited's Opposition Claim Construction Brief, filed Jul. 14, 2004 in U.S. District Court, Northern District of California, Case No. C 03–4803 WHA, 37 pgs.

(Continued)

*Primary Examiner*—Erik Kielin

(57) ABSTRACT

A DMOS power transistor has a vertical gate and a planar top surface. A vertical gate fills a rectangular groove lined with a dielectric material which extends downward so that source and body regions lie on each side of the dielectric groove. Carriers flow vertically between source and body regions and the structure has a flat surface for all masking steps.

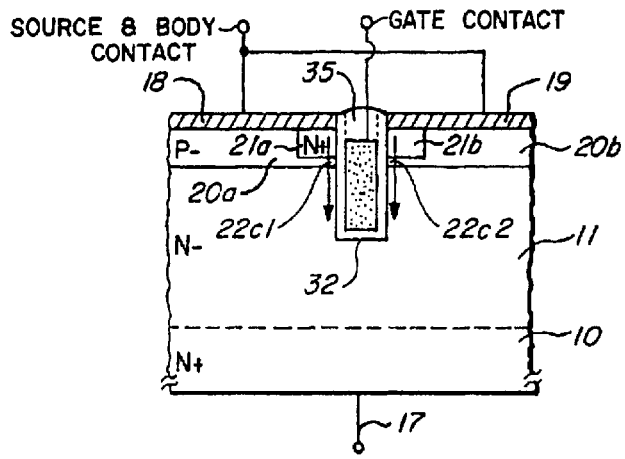

U.S. PATENT DOCUMENTS

| | | |
|---|---|---|
| 3,620,837 A | 11/1971 | Leff |
| 3,632,433 A | 1/1972 | Tokuyama et al. |
| 3,759,761 A | 9/1973 | Mori et al. |
| 3,784,424 A | 1/1974 | Chang |
| 3,785,793 A | 1/1974 | Park |
| 3,798,514 A | 3/1974 | Hayashi et al. |
| 3,825,442 A | 7/1974 | Moore |
| 3,833,919 A | 9/1974 | Naber |
| 3,855,608 A | 12/1974 | George et al. |
| 3,893,155 A | 7/1975 | Ogiue |
| 3,911,562 A | 10/1975 | Youmans |
| 3,913,126 A | 10/1975 | Hooker et al. |
| 3,913,211 A | 10/1975 | Seeds et al. |
| 3,924,265 A | 12/1975 | Rodgers |
| 3,925,572 A | 12/1975 | Naber |
| 3,938,241 A | 2/1976 | George et al. |
| 3,947,299 A | 3/1976 | Weijland et al. |
| 3,956,033 A | 5/1976 | Roberson |
| 3,975,221 A | 8/1976 | Rodgers |
| 3,979,769 A | 9/1976 | Houston et al. |
| 3,998,673 A | 12/1976 | Chow |
| 4,003,126 A | 1/1977 | Holmes et al. |
| 4,025,411 A | 5/1977 | Hom-Ma et al. |
| 4,038,110 A | 7/1977 | Feng |
| 4,044,452 A | 8/1977 | Abbas et al. |
| 4,048,649 A | 9/1977 | Bohn |
| 4,065,783 A | 12/1977 | Ouyang |
| 4,070,690 A | 1/1978 | Wickstrom |
| 4,072,975 A | 2/1978 | Ishitani |
| 4,104,086 A | 8/1978 | Bondur et al. |
| 4,105,475 A | 8/1978 | Jenne |
| 4,123,565 A | 10/1978 | Sumitomo et al. |
| 4,128,440 A | 12/1978 | Baliga |
| 4,129,879 A | 12/1978 | Tantraporn et al. |
| 4,140,558 A | 2/1979 | Murphy et al. |
| 4,145,703 A | 3/1979 | Blanchard et al. |
| 4,152,714 A | 5/1979 | Hendrickson et al. |
| 4,157,610 A | 6/1979 | Kamei et al. |
| 4,191,602 A | 3/1980 | Baliga |
| 4,199,774 A | 4/1980 | Plummer |
| 4,200,968 A | 5/1980 | Schroeder |
| 4,206,469 A | 6/1980 | Hanes et al. |
| 4,219,835 A | 8/1980 | van Loon et al. |
| 4,236,166 A | 11/1980 | Cho et al. |
| 4,236,947 A | 12/1980 | Baliga |
| 4,238,278 A | 12/1980 | Antipov |
| 4,243,997 A | 1/1981 | Natori et al. |
| 4,249,190 A | 2/1981 | Cho |
| 4,251,299 A | 2/1981 | Baliga et al. |
| 4,252,579 A | 2/1981 | Ho et al. |
| 4,260,425 A | 4/1981 | Ulrich et al. |
| 4,262,296 A | 4/1981 | Shealy et al. |
| 4,271,582 A | 6/1981 | Shirai et al. |
| 4,280,855 A | 7/1981 | Bertin et al. |
| 4,296,429 A | 10/1981 | Schroeder |
| 4,303,841 A | 12/1981 | Baker |
| 4,305,974 A | 12/1981 | Abe et al. |
| 4,324,038 A | 4/1982 | Chang et al. |
| 4,327,476 A | 5/1982 | Iwai et al. |
| 4,329,705 A | 5/1982 | Baker |
| 4,333,227 A | 6/1982 | Horng et al. |
| 4,339,690 A | 7/1982 | Regan et al. |
| 4,339,767 A | 7/1982 | Horng et al. |
| 4,343,015 A | 8/1982 | Baliga et al. |
| 4,344,081 A | 8/1982 | Pao et al. |
| 4,345,265 A | 8/1982 | Blanchard |
| 4,349,584 A | 9/1982 | Flatley et al. |
| 4,353,086 A | 10/1982 | Jaccodine et al. |
| 4,364,073 A | 12/1982 | Becke et al. |
| 4,364,074 A | 12/1982 | Garnache et al. |
| 4,364,167 A | 12/1982 | Donley |
| 4,366,495 A | 12/1982 | Goodman et al. |
| 4,369,565 A | 1/1983 | Muramatsu |
| 4,372,034 A | 2/1983 | Bohr |
| 4,374,455 A | 2/1983 | Goodman |
| 4,375,124 A | 3/1983 | Cogan |
| 4,378,410 A | 3/1983 | Bailey |
| 4,378,630 A | 4/1983 | Horng et al. |
| 4,397,341 A | 8/1983 | Kent |
| 4,398,339 A | 8/1983 | Blanchard et al. |
| 4,402,003 A | 8/1983 | Blanchard |
| 4,406,052 A | 9/1983 | Cogan |
| 4,409,609 A | 10/1983 | Fukuda |
| 4,417,914 A | 11/1983 | Lehrer |
| 4,420,503 A | 12/1983 | Leung et al. |
| 4,433,008 A | 2/1984 | Schnable et al. |
| 4,437,925 A | 3/1984 | Cogan |
| 4,443,931 A | 4/1984 | Baliga et al. |
| 4,445,270 A | 5/1984 | Hsu |
| 4,446,194 A | 5/1984 | Candelaria et al. |
| 4,451,326 A | 5/1984 | Gwozdz |
| 4,453,305 A | 6/1984 | James et al. |
| 4,455,325 A | 6/1984 | Razouk |
| 4,455,740 A | 6/1984 | Iwai |
| 4,458,259 A | 7/1984 | Cogan |
| 4,462,040 A | 7/1984 | Ho et al. |
| 4,466,173 A | 8/1984 | Baliga |
| 4,468,682 A | 8/1984 | Cogan |
| 4,472,873 A | 9/1984 | Ko |
| 4,473,598 A | 9/1984 | Ephrath et al. |
| 4,474,831 A | 10/1984 | Downey |
| 4,476,622 A | 10/1984 | Cogan |
| 4,477,310 A | 10/1984 | Park et al. |
| 4,477,963 A | 10/1984 | Cogan |
| 4,486,266 A | 12/1984 | Yamaguchi |
| 4,486,943 A | 12/1984 | Ryden et al. |
| 4,492,717 A | 1/1985 | Pliskin et al. |
| 4,497,107 A | 2/1985 | Cogan |
| 4,503,449 A | 3/1985 | David et al. |
| 4,505,026 A | 3/1985 | Bohr et al. |
| 4,506,282 A | 3/1985 | Baliga |
| 4,506,435 A | 3/1985 | Pliskin et al. |
| 4,507,171 A | 3/1985 | Bhatia et al. |
| 4,507,849 A | 4/1985 | Shinozaki |
| 4,509,249 A | 4/1985 | Goto et al. |
| 4,510,676 A | 4/1985 | Anantha et al. |
| 4,515,652 A | 5/1985 | Gimpelson et al. |
| 4,519,128 A | 5/1985 | Chesebro et al. |
| 4,520,552 A | 6/1985 | Arnould et al. |
| 4,523,111 A | 6/1985 | Baliga |
| 4,523,975 A | 6/1985 | Groves et al. |
| 4,528,047 A | 7/1985 | Beyer et al. |
| 4,532,022 A | 7/1985 | Takasaki et al. |
| 4,532,534 A | 7/1985 | Ford et al. |
| 4,541,001 A | 9/1985 | Schutten et al. |
| 4,542,396 A | 9/1985 | Schutten et al. |
| 4,543,706 A | 10/1985 | Bencuya et al. |
| 4,545,852 A | 10/1985 | Barton |
| 4,546,016 A | 10/1985 | Kern |
| 4,546,367 A | 10/1985 | Schutten et al. |
| 4,546,538 A | 10/1985 | Suzuki |
| 4,549,927 A | 10/1985 | Goth et al. |
| 4,551,909 A | 11/1985 | Cogan et al. |
| 4,553,151 A | 11/1985 | Schutten et al. |
| 4,554,570 A | 11/1985 | Jastrzebski et al. |
| 4,554,728 A | 11/1985 | Shepard |
| 4,558,243 A | 12/1985 | Schutten et al. |
| 4,566,172 A | 1/1986 | Bencuya et al. |
| 4,567,502 A | 1/1986 | Nakagawa et al. |
| 4,567,641 A | 2/1986 | Baliga et al. |
| 4,568,958 A | 2/1986 | Baliga |

| | | | | | |
|---|---|---|---|---|---|
| 4,569,118 A | 2/1986 | Baliga et al. | 4,782,379 A | 11/1988 | Baliga |
| 4,570,330 A | 2/1986 | Cogan | 4,783,238 A | 11/1988 | Roesner |
| 4,571,512 A | 2/1986 | Schutten et al. | 4,786,614 A | 11/1988 | Cogan |
| 4,571,513 A | 2/1986 | Lade et al. | 4,786,953 A | 11/1988 | Morie et al. |
| 4,571,815 A | 2/1986 | Baliga et al. | 4,791,462 A | 12/1988 | Blanchard et al. |
| RE32,090 E | 3/1986 | Jaccodine et al. | 4,794,436 A | 12/1988 | Blanchard |
| 4,574,207 A | 3/1986 | Benjamin et al. | 4,798,810 A | 1/1989 | Blanchard et al. |
| 4,582,745 A | 4/1986 | Schnable | 4,799,095 A | 1/1989 | Baliga |
| 4,586,240 A | 5/1986 | Blackstone et al. | 4,799,100 A | 1/1989 | Blanchard et al. |
| 4,587,712 A | 5/1986 | Baliga | 4,801,985 A | 1/1989 | Baliga et al. |
| 4,587,713 A | 5/1986 | Goodman et al. | 4,801,986 A | 1/1989 | Chang et al. |
| 4,589,193 A | 5/1986 | Goth et al. | 4,803,176 A | 2/1989 | Bower |
| 4,593,453 A | 6/1986 | Tam et al. | 4,811,065 A | 3/1989 | Cogan |
| 4,601,939 A | 7/1986 | Gati et al. | 4,816,882 A | 3/1989 | Blanchard et al. |
| 4,611,384 A | 9/1986 | Bencuya et al. | 4,818,720 A | 4/1989 | Iwasaki |
| 4,618,872 A | 10/1986 | Baliga | 4,818,725 A | 4/1989 | Lichtel, Jr. et al. |
| 4,620,211 A | 10/1986 | Baliga et al. | 4,823,176 A | 4/1989 | Baliga et al. |
| 4,622,569 A | 11/1986 | Lade et al. | 4,824,795 A | 4/1989 | Blanchard |
| 4,630,088 A | 12/1986 | Ogura et al. | 4,827,321 A | 5/1989 | Baliga |
| 4,630,237 A | 12/1986 | Miura et al. | 4,827,324 A | 5/1989 | Blanchard |
| 4,631,564 A | 12/1986 | Neilson et al. | 4,830,975 A | 5/1989 | Bovaird et al. |
| 4,631,803 A | 12/1986 | Hunter et al. | 4,833,098 A | 5/1989 | Kato |
| 4,633,281 A | 12/1986 | Benjamin et al. | 4,835,584 A | 5/1989 | Lancaster |
| 4,634,496 A | 1/1987 | Mase et al. | 4,835,585 A | 5/1989 | Panousis |
| 4,635,344 A | 1/1987 | Havemann | 4,835,586 A | 5/1989 | Cogan et al. |
| 4,636,281 A | 1/1987 | Buiguez et al. | 4,845,051 A | 7/1989 | Cogan et al. |
| 4,639,754 A | 1/1987 | Wheatley, Jr. et al. | 4,847,671 A | 7/1989 | Pattanayak et al. |
| 4,641,164 A | 2/1987 | Dolny et al. | 4,857,983 A | 8/1989 | Baliga et al. |
| 4,641,174 A | 2/1987 | Baliga | 4,860,081 A | 8/1989 | Cogan |
| 4,645,957 A | 2/1987 | Baliga | 4,868,537 A | 9/1989 | Blanchard |
| 4,654,113 A | 3/1987 | Tuchiya et al. | 4,873,560 A | 10/1989 | Sunami et al. |
| 4,662,064 A | 5/1987 | Hsu et al. | 4,879,253 A | 11/1989 | Wakamatsu |
| 4,663,547 A | 5/1987 | Baliga et al. | 4,888,087 A | 12/1989 | Moslehi et al. |
| 4,666,553 A | 5/1987 | Blumenfeld et al. | 4,888,627 A | 12/1989 | Pattanayak et al. |
| 4,666,556 A | 5/1987 | Fulton et al. | 4,891,247 A | 1/1990 | Shamshoian |
| 4,670,764 A | 6/1987 | Benjamin et al. | 4,893,160 A | 1/1990 | Blanchard |
| 4,672,410 A | 6/1987 | Miura et al. | 4,894,351 A | 1/1990 | Batty |
| 4,674,173 A | 6/1987 | Hahn et al. | 4,896,196 A | 1/1990 | Blanchard et al. |
| 4,676,867 A | 6/1987 | Elkins et al. | 4,896,293 A | 1/1990 | McElroy |
| 4,676,868 A | 6/1987 | Riley et al. | 4,903,189 A | 2/1990 | Ngo et al. |
| 4,679,300 A | 7/1987 | Chan et al. | 4,907,063 A | 3/1990 | Okada et al. |
| 4,682,405 A | 7/1987 | Blanchard et al. | 4,912,541 A | 3/1990 | Baliga et al. |
| 4,683,643 A | 8/1987 | Nakajima et al. | 4,914,058 A | 4/1990 | Blanchard |
| 4,685,196 A | 8/1987 | Lee | 4,914,740 A | 4/1990 | Kenney |
| 4,686,000 A | 8/1987 | Heath | 4,916,509 A | 4/1990 | Blanchard et al. |
| 4,689,871 A | 9/1987 | Malhi | 4,920,388 A | 4/1990 | Blanchard et al. |
| 4,692,344 A | 9/1987 | Kaganowicz et al. | RE33,209 E | 5/1990 | Plummer |
| 4,692,780 A | 9/1987 | Bencuya et al. | 4,929,991 A | 5/1990 | Blanchard |
| 4,697,201 A | 9/1987 | Mihara | 4,937,641 A | 6/1990 | Sunami et al. |
| 4,699,825 A | 10/1987 | Sakai et al. | 4,941,026 A | 7/1990 | Temple |
| 4,700,464 A | 10/1987 | Okada et al. | 4,942,445 A | 7/1990 | Baliga et al. |
| 4,707,909 A | 11/1987 | Blanchard | 4,944,826 A | 7/1990 | Zollman et al. |
| 4,710,790 A | 12/1987 | Okamoto et al. | 4,949,138 A | 8/1990 | Nishimura |
| 4,716,126 A | 12/1987 | Cogan | 4,951,102 A | 8/1990 | Beitman et al. |
| 4,717,679 A | 1/1988 | Baliga et al. | 4,952,274 A | 8/1990 | Abraham |
| 4,733,291 A | 3/1988 | Levy et al. | 4,952,992 A | 8/1990 | Blanchard |
| 4,737,831 A | 4/1988 | Iwai | 4,956,700 A | 9/1990 | Blanchard et al. |
| 4,743,952 A | 5/1988 | Baliga | 4,958,204 A | 9/1990 | Blanchard et al. |
| 4,745,081 A | 5/1988 | Beyer et al. | 4,961,100 A | 10/1990 | Baliga et al. |
| 4,749,661 A | 6/1988 | Bower | 4,962,063 A | 10/1990 | Maydan et al. |
| 4,751,556 A | 6/1988 | Cogan et al. | 4,965,216 A | 10/1990 | Scovell et al. |
| 4,753,901 A | 6/1988 | Ellsworth et al. | 4,965,220 A | 10/1990 | Iwasaki |
| 4,756,793 A | 7/1988 | Peek | 4,967,245 A | 10/1990 | Cogan et al. |
| 4,759,836 A | 7/1988 | Hill et al. | 4,977,108 A | 12/1990 | Haskell |
| 4,763,180 A | 8/1988 | Hwang et al. | 4,977,436 A | 12/1990 | Tsuchiya et al. |
| 4,767,722 A | 8/1988 | Blanchard | 4,978,419 A | 12/1990 | Nanda et al. |
| 4,769,685 A | 9/1988 | MacIver et al. | 4,978,631 A | 12/1990 | Blanchard |
| 4,774,196 A | 9/1988 | Blanchard | 4,983,535 A | 1/1991 | Blanchard |
| 4,774,198 A | 9/1988 | Cantiero et al. | 4,984,030 A | 1/1991 | Sunami et al. |
| 4,775,550 A | 10/1988 | Chu et al. | 4,984,037 A | 1/1991 | Ditchek et al. |
| 4,779,123 A | 10/1988 | Bencuya et al. | 4,986,878 A | 1/1991 | Malazgirt et al. |

| | | | | | |
|---|---|---|---|---|---|
| 4,989,055 A | 1/1991 | Redwine | 5,742,076 A | 4/1998 | Sridevan et al. |
| 4,990,980 A | 2/1991 | Wada | 5,742,087 A | 4/1998 | Lidow et al. |
| 4,992,390 A | 2/1991 | Chang | 5,845,051 A | 12/1998 | Oh |
| 4,994,871 A | 2/1991 | Chang et al. | 5,883,411 A | 3/1999 | Ueda et al. |
| 5,001,078 A | 3/1991 | Wada | 5,894,149 A | 4/1999 | Uenishi et al. |
| 5,001,526 A | 3/1991 | Gotou | 6,111,290 A | 8/2000 | Uenishi et al. |
| 5,001,535 A | 3/1991 | Nishizawa et al. | 6,281,549 B1 | 8/2001 | Davies |
| 5,003,062 A | 3/1991 | Yen | 6,627,950 B1 | 9/2003 | Buluccea et al. |
| 5,017,504 A | 5/1991 | Nishimura et al. | | | |
| 5,021,359 A | 6/1991 | Young et al. | | FOREIGN PATENT DOCUMENTS | |
| 5,021,845 A | 6/1991 | Hashimoto | DE | 3485831 T2 | 11/1984 |
| 5,021,846 A | 6/1991 | Ueno | DE | 3739417 A1 | 6/1988 |
| 5,032,529 A | 7/1991 | Beitman et al. | DE | 3790800 C2 | 6/1988 |
| 5,032,888 A | 7/1991 | Seki | DE | 3790800 T1 | 6/1988 |
| 5,034,785 A | 7/1991 | Blanchard | EP | 0029932 A1 | 6/1981 |
| 5,040,034 A | 8/1991 | Murakami et al. | EP | 0063749 A2 | 11/1982 |
| 5,072,266 A | 12/1991 | Bulucea et al. | EP | 0080044 A2 | 6/1983 |
| 5,072,269 A | 12/1991 | Hieda | EP | 0091094 A2 | 10/1983 |
| 5,077,228 A | 12/1991 | Eklund et al. | EP | 0091686 A2 | 10/1983 |
| 5,082,795 A | 1/1992 | Temple | EP | 0106072 A2 | 4/1984 |
| 5,086,007 A | 2/1992 | Ueno | EP | 0108945 A1 | 5/1984 |
| 5,098,865 A | 3/1992 | Machado et al. | EP | 0111803 A1 | 6/1984 |
| 5,100,822 A | 3/1992 | Mitani | EP | 0111804 A1 | 6/1984 |
| 5,104,482 A | 4/1992 | Monkowski et al. | EP | 0113334 A2 | 7/1984 |
| 5,106,776 A | 4/1992 | Shen et al. | EP | 0118007 A2 | 9/1984 |
| 5,108,938 A | 4/1992 | Solomon | EP | 0097866 A2 | 11/1984 |
| 5,112,776 A | 5/1992 | Marks et al. | EP | 0125504 B1 | 11/1984 |
| 5,114,865 A | 5/1992 | Kimura | EP | 0134456 A2 | 3/1985 |
| 5,132,235 A | 7/1992 | Williams et al. | EP | 0144654 A2 | 6/1985 |
| 5,139,608 A | 8/1992 | Grivna | EP | 0144909 A2 | 6/1985 |
| 5,142,640 A | 8/1992 | Iwamatsu | EP | 0145566 A2 | 6/1985 |
| 5,144,408 A | 9/1992 | Iwasaki | EP | 0164095 A2 | 12/1985 |
| 5,148,247 A | 9/1992 | Miura et al. | EP | 0238749 A2 | 3/1986 |
| 5,155,059 A | 10/1992 | Hieda | EP | 0199293 A2 | 10/1986 |
| 5,155,064 A | 10/1992 | Mise | EP | 0202477 A2 | 11/1986 |
| 5,156,989 A | 10/1992 | Williams et al. | EP | 0222326 A2 | 5/1987 |
| 5,160,491 A | 11/1992 | Mori | EP | 0273030 A2 | 6/1988 |
| 5,164,325 A | 11/1992 | Cogan et al. | EP | 0139266 B1 | 1/1989 |
| 5,166,101 A | 11/1992 | Lee et al. | EP | 0218084 B1 | 5/1992 |
| 5,168,331 A | 12/1992 | Yilmaz | JP | 47-17381 | 9/1972 |
| 5,177,572 A | 1/1993 | Murakami | JP | 47-27687 | 10/1972 |
| 5,188,973 A | 2/1993 | Omura et al. | JP | 49-28790 | 7/1974 |
| 5,204,288 A | 4/1993 | Marks et al. | JP | 53-149771 | 12/1978 |
| 5,225,697 A | 7/1993 | Malhi et al. | JP | 54-39579 | 3/1979 |
| 5,229,310 A | 7/1993 | Sivan | JP | 55-3677 | 1/1980 |
| 5,237,481 A | 8/1993 | Soo et al. | JP | 2032686 A | 5/1980 |
| 5,242,845 A | 9/1993 | Baba et al. | JP | 55-91874 | 7/1980 |
| 5,252,845 A | 10/1993 | Kim et al. | JP | 56-21373 | 2/1981 |
| 5,256,893 A | 10/1993 | Yasuoka | JP | 56-40280 | 4/1981 |
| 5,280,188 A | 1/1994 | Iwasaki | JP | 56-58267 | 5/1981 |
| 5,290,399 A | 3/1994 | Reinhardt | JP | 56-61167 | 5/1981 |
| 5,296,092 A | 3/1994 | Kim | JP | 56-62365 | 5/1981 |
| 5,298,110 A | 3/1994 | Schoenborn et al. | JP | 56-83074 | 7/1981 |
| 5,298,442 A | 3/1994 | Bulucea et al. | JP | 56162839 | 12/1981 |
| 5,324,689 A | 6/1994 | Yoo | JP | 56165360 | 12/1981 |
| 5,336,640 A | 8/1994 | Sato | JP | 57018365 | 1/1982 |
| 5,352,915 A | 10/1994 | Hutchings et al. | JP | 57075432 | 5/1982 |
| 5,378,941 A | 1/1995 | Nishio et al. | JP | 57-139963 | 8/1982 |
| 5,393,708 A | 2/1995 | Hsia et al. | JP | 57-164570 | 10/1982 |
| 5,399,389 A | 3/1995 | Hieber et al. | JP | 58003287 | 1/1983 |
| 5,413,966 A | 5/1995 | Schoenborn | JP | 58-61673 | 4/1983 |
| 5,441,094 A | 8/1995 | Pasch | JP | 58-106870 | 6/1983 |
| 5,441,915 A | 8/1995 | Lee | JP | 58-158931 | 9/1983 |
| 5,444,026 A | 8/1995 | Kim et al. | JP | 58-162070 | 9/1983 |
| 5,445,998 A | 8/1995 | Zimmer | JP | 58-162071 | 9/1983 |
| 5,481,178 A | 1/1996 | Wilcox et al. | JP | 58-164265 | 9/1983 |
| 5,482,900 A | 1/1996 | Yang | JP | 58-180061 | 10/1983 |
| 5,488,007 A | 1/1996 | Kim et al. | JP | 58-184767 | 10/1983 |
| 5,489,553 A | 2/1996 | Chen | JP | 59-16379 | 1/1984 |
| 5,637,898 A | 6/1997 | Baliga | JP | 59005673 | 1/1984 |
| 5,679,966 A | 10/1997 | Baliga et al. | JP | 59008375 | 1/1984 |

| | | |
|---|---|---|
| JP | 59-29437 | 2/1984 |
| JP | 59035463 | 2/1984 |
| JP | 59-80970 | 5/1984 |
| JP | 59145573 | 8/1984 |
| JP | 59-181668 | 10/1984 |
| JP | 59-188976 | 10/1984 |
| JP | 59-193064 | 11/1984 |
| JP | 59204252 | 11/1984 |
| JP | 59-231862 | 12/1984 |
| JP | 60003157 | 1/1985 |
| JP | 60007170 A | 1/1985 |
| JP | 60042866 | 3/1985 |
| JP | 60066862 | 4/1985 |
| JP | 60-89971 | 5/1985 |
| JP | 60-124970 | 7/1985 |
| JP | 60189962 A | 9/1985 |
| JP | 60-195974 | 10/1985 |
| JP | 60-226185 | 11/1985 |
| JP | 60-253275 | 12/1985 |
| JP | 61-26261 | 2/1986 |
| JP | 61-49474 | 3/1986 |
| JP | 61051879 A | 3/1986 |
| JP | 60-70764 | 4/1986 |
| JP | 61070760 | 4/1986 |
| JP | 61-97973 | 5/1986 |
| JP | 61-161766 | 7/1986 |
| JP | 61-166127 | 7/1986 |
| JP | 61-220377 | 9/1986 |
| JP | 61-234578 | 10/1986 |
| JP | 61-276347 | 12/1986 |
| JP | 62-13050 | 1/1987 |
| JP | 62-13062 | 1/1987 |
| JP | 62-122165 | 6/1987 |
| JP | 62-126674 | 6/1987 |
| JP | 61026261 A | 8/1987 |
| JP | 62-213128 | 9/1987 |
| JP | 62219667 | 9/1987 |
| JP | 62272561 A | 11/1987 |
| JP | 62-272570 | 11/1987 |
| JP | 62274771 A | 11/1987 |
| JP | 63-47138 | 9/1988 |
| JP | 63-269548 | 11/1988 |
| JP | 2-16022 | 4/1990 |
| JP | 2-43333 | 9/1990 |
| JP | 4-44432 | 7/1992 |
| JP | 4-47988 | 8/1992 |
| JP | 4-65551 | 10/1992 |
| JP | 4-81345 | 12/1992 |
| JP | 5-76787 | 10/1993 |
| JP | 6-7597 | 1/1994 |
| JP | 6163889 | 6/1994 |
| JP | 6275818 | 9/1994 |
| JP | 7-83115 | 9/1995 |
| JP | 7335878 | 12/1995 |
| JP | 2662217 | 6/1997 |
| WO | WO 88/04472 | 6/1988 |

OTHER PUBLICATIONS

Siliconix Incorporated's Reply Claim Construction Brief, filed Jul. 21, 2004 in U.S. District Court, Northern District of California, Case No. C 03–4803 WHA, 19 pgs.

Claim Constrcution Order filed Sep. 10, 2004 in U.S. District Court, Northern District of California, Case No. C 03–4803 WHA, 15 pgs.

Plaintiff Siliconix Incorporated's Opening Claim Construction Brief, dated Mar. 31, 2006 in U.S. District Court, Northern District of California, Case No. C 05–01507 WHA, 30 pgs.

Defendants' Joint Claim Construction Brief, filed Apr. 14, 2006 in U.S. District Court, Northern District of California, Case No. C 05–01507 WHA, 28 pgs.

Plaintiff Siliconix Incorporated's Reply Claim Construction Brief, dated Apr. 21, 2006 in U.S. District Court, Northern District of California, Case No. C 05–01507 WHA, 15 pgs.

Abowitz et al., "Surface States and 1/f Noise in MOS Transistors," IEEE Transactions on Electron Devices, vol. ED–14, No. 11, pp. 775–777 (Nov. 1967).

Adachi et al., "Two–dimensional Analysis of V–MOS Transistor" Musashino Electrical Communication Laboratory NTT, vol. 79, No. 30, pp. 9–15 (Jun. 1979).

Adams et al. "Characterization of Plasma–Deposited Silicon Dioxide", Bell Laboratories, Murray Hill, New Jersey (1981).

Adams et al., "Planarization of Phosphorus–Doped Silicon Dioxide," Journal of Electrochemical Society, vol. 128, No. 2, pp. 423–429 (Feb. 1981).

Adler et al., "Device Physics and Modeling of Integrated Power Devices", General Electric Company, Corporate Research and Development, Schenectady, New York, Nasecode V (Jun. 1987).

Adler et al., "Limitations on Injection Efficiency In Power Devices", IEEE Transactions on Electron Devices, vol. ED–23, No. 8, pp. 858–863 (Aug. 1976).

Adler et al., "A General Method of Predicting the Avalanche Breakdown Voltage and Negative Bevelled Devices", IEEE Transactions on Electron Devices, vol. ED–23, No. 8, pp. 956–960 (Aug. 1976).

Adler et al., "Theory and Breakdown Voltage for Planar Devices with a Single Field Limiting Ring", IEEE Transactions on Electron Devices, vol. ED–24, No. 2, pp. 107–112 (Feb. 1977).

Adler et al., "The Dynamics of the Thyristor Turn–on Process", IEEE Transactions on Electron Devices, vol. ED–27, No. 2, pp. 483–494 (Feb. 1980).

Adler et al., "A Simple Method for Predicting the Forward Blocking Gain of Gridded Field Effect Devices with Rectangular Grids", Solid State Electronics, vol. 23, pp. 735–740 (Jul. 1980).

Adler et al., "Theoretical Basis for Field Calculations on Multi–Dimensional Reverse Biased Semiconductor Devices", Solid–State Electronics, vol. 25, No. 12, pp. 1179–1186 (1982).

Adler et al., "The Evolution of Power Device Technology", IEEE Transactions on Electron Devices, vol. ED–31, No. 11, pp. 1570–1591 (Nov. 1984).

Aina et al., "w–temperature sintered AuGe/GaAs ohmic contact", Journal of Applied Physics, vol. 53, No. 1, pp. 777–780 (Jan. 1982).

Akinwande et al., "Experimental Determination of the Temperature Dependence of Argon Annealed Fixed Oxide Charge at the $Si/SiO_2$ Interface", Applied Physics Letters, vol. 45, No. 3, pp. 263–265 (Aug. 1984).

Akcasu et al., "Computer–Aided Optimization of the p–n–p Load RAM Cells," IEEE Transactions on Electron Devices, vol. ED–33, No. 11, p. 1854 (Nov. 1986).

Alvi et al., "Reflow of Phosphosilicate Glass by Rapid Thermal Annealing", Solid–State Science, vol. 133, No. 12, pp. 2625–2631 (Dec. 1986).

Ammar et al., "UMOS Transistors on (110) Silicon," IEEE Transactions on Electron Devices, vol. ED–27, No. 5, pp. 907–914 (May 1980).

Anstead, "Failure Analysis Using a Scanning Electron Microscope", Sixth Annual Reliability Physics Symposium Proceedings, pp. 127–132 (Nov. 1967).

Antognetti et al., "Deep Depletion and Avalanche Studies on the Miniature Avalanche MOS Diode", Proceedings of the International Conference on the Physics and Chemistry of Semiconductors, pp. 55–63.

Antognetti et al. "Misure C–V dispostivo MIS in condizione di forte svoutamento", pp. 1–4 (1970).

Arai et al., "Submicron MOS VLSI Process Technologies", IEEE, pp. 19–22 (1983).

Arienzo et al., "LPCVD In–Situ Arsenic Doped Polysilicon for VLSI Applications", IEEE, pp. 220–223 (1985).

Armstrong et al., "A Scanning Electron Microscope Investigation of Glass Flow in MOS Integrated Circuit Fabrication", Solid–State Science, pp. 307–310 (Feb. 1974).

Arnett, P.C., "Spatial Charge Distribution on MNOS Modeling," Semiconductor Silicon, The Electrochemical Society, Inc., pp. 802–811 (1973).

Asada et al., "A GaAs Laser Driver IC", Smiconductor Laboratory, Matsushita Electronics Corporation.

Ashcraft et al., "MOS Integrated Circuits: Theory, Fabrication, Design, and Systems Applications of MOS LSI", The Engineering Staff of American Micro–System, Inc. (1972).

Ashok et al., "Modification of Schottky Barriers in Silicon by Reactive Ion Etching with $NF_3$", Applied Physics Letters, vol. 42, No. 8, pp. 687–689 (Apr. 1983).

Ashok et al., "Effect of Antimony Ion Implantation on Al–Silicon Schottyky Diode Characteristics", Journal of Applied Physics, vol. 56, No. 4, pp. 1234–1239 (Aug. 1984).

Auld et al., "An Electronically Addressed Bulk Acoustic Wave Fourier Transform Device", IEEE, 1979 Ultrasonics Symposium, pp. 184–188 (1979).

Avigal, "Inter–Metal Dielectric and Passivation–Related Properties of Plasma BPSG", Solid State Technology, pp. 217–224 (Oct. 1983).

Baba et al., "A Study on a High Blocking Voltage UMOS–FET with a Double Gate Structure", Proceedings of 1992 International Symposium on Power Semiconductor Devices & ICs, Tokyo, pp. 300–302 (1992).

Baglee et al., "Properties of Trench Capacitors for High Density Dram Applications", IEEE, pp. 384–387 (1985).

Bakoglu et al., "New CMOS Driver and Receiver Circuits Reduce Interconnection Propagation Delays," Stanford University Center for Integrated System, Stanford, California, pp. 54–55.

Bakoglu et al., "CMOS Driver and Receiver Circuits for Reduced Interconnection Delays", 1985 International Symposium on VLSI Technology, Systems and Applications, pp. 171–175 (1985).

Bakoglu et al., "A Symmetric Clock–Distribution Tree and Optimized High–Speed Interconnections for Reduced Clock Skew in ULSI and WSI Circuits", IEEE, pp. 118–122 (1986).

Bakoglu et al., "Optimal Interconnection Circuits for VLSI", IEEE Transactions on Electron Devices, vol. ED–32, No. 5, pp. 903–909 (May 1985).

Baliga et al., "The New Generations of MOS Power Devices", General Elecrtric Company, pp. 139–141.

Baliga et al., "PSG Masks for Diffusions in Gallium Arsenide", IEEE Transaction on Electron Devices, vol. ED–19, No. 6, pp. 761–764 (Jun. 1972).

Baliga et al., "Growth of Silica and Phosphosilicate Films", Journal of Applied Physics, vol. 44, No. 3, pp. 990–994 (Mar. 1973).

Baliga et al., "Lateral Diffusion in GaAs", Technical Digest, 1973 International Electron Devices Meeting, pp. 256–258 (1973).

Baliga et al., "Lateral Diffusion of Zinc and Tin in Gallium Arsenide", IEEE, Transactions on Electron Devices, vol. ED–21, No. 7, pp. 410–415 (Jul. 1974).

Baliga et al., "Heteroepitaxial InAs Grown on GaAs from Triethylindium and Arsine", Journal of Electrochemical Society, vol. 121, No. 12, pp. 1642–1646 (Dec. 1974).

Baliga et al., "Growth and Properties of Heteroepitaxial GaInAs Alloys on GaAs Substrates Using Trimethlygallium, Triethylindium, and Arsine", Journal of the Electrochemical Society, vol. 122, No. 5, pp. 683–687 (May 1975).

Baliga et al., "Measurement of Energy Band Gap Using and Electrolyte–Semiconductor Junction: Water Gallium Indium Arsenide Alloys", Journal of Applied Physics, vol. 46, No. 9, pp. 3941–3945 (Sep. 1975).

Baliga et al., "Composition Dependence of Energy gap in GaInAs Alloys", Journal of Applied Physics, vol. 46, No. 10, p. 4608 (Oct. 1975).

Baliga et al., "Gambit: Gate Modulated Bipolar Transitor", Solid–State Electronics, vol. 18, No. 11, pp. 937–941 (Nov. 1975).

Baliga et al., "Chemical Vapor Deposition of Tin Oxide Films", Technical Digest 1975, International Electron Devices Meeting, pp. 105–107 (1975).

Baliga et al., "Influence of Low Lifetime Regions on Recombination in High Lifetime Regions of Semiconductors", International Journal of Electrons Theoretical and Experimental, vol. 40, No. 4, pp. 393–408 (Apr. 1976).

Baliga et al., "The Preparation and Properties of Tin Oxide Films Formed by Oxidation of Tetramethyltin", Journal of the Electrochemical Society, vol. 123, No. 6, pp. 941–944 (Jun. 1976).

Baliga et al., "Analytical Solutions for the Breakdown Voltage of Abrubt Cylindrical and Spherical Junctions", Solid–State Electronics, vol. 19, No. 9, pp. 739–744 (Sep. 1976).

Baliga et al., "Optimization of Recombination Levels and Their Capture Cross–Section in Power Rectifiers and Thyristors", Solid–State Electronics, vol. 20, No. 3, pp. 225–232 (Mar. 1977).

Baliga et al., "Conductivity of Complementary Error Function n–Type Diffused Layers in Gallium Arsenide", Solid–State Electronics, vol. 20, No. 4, pp. 321–322 (Apr. 1977).

Baliga, "A Novel Photoconductivity Lifetime Measurement Technique", International Journal of Electronics, Theoretical and Experimental, vol. 42, No. 5, pp. 505–510 (May 1977).

Baliga et al., "Comparison of Gold, Platinum, and Electron Irradiation for Controlling Lifetime in Power Rectifiers", IEEE, Transactions on Electron Devices, vol. ED–22, No. 6, pp. 685–688 (Jun. 1977).

Baliga et al., "Electrochemical Patterning of Tin Oxide Films", Journal of Electrochemical Society, vol. 124, No. 7, pp. 1059–1060 (Jul. 1977).

Baliga et al., "Anomalous Diffusion from Doped Oxides Due to Dopant Depletion Effects", Solid–State Electronics, vol. 20, No. 9, pp. 773–774 (Sep. 1977).

Baliga et al., "Kinetics of the Epitaxial Growth of Silicon from a Tin Melt", Journal of the Electrochemical Society, vol. 124, No. 10, pp. 1627–1631 (Oct. 1977).

Baliga, "Morphology of Silicon Epitaxial Layers Grown by Undercooling of Saturated Tin Melt", Journal of Crystal Growth, vol. 41, No. 1, pp. 199–204 (Nov. 1977).

Baliga et al., "Measurement of Carrier Lifetime Profiles in Diffused Layers of Semiconductors," IEEE Transactions on Electron Devices, vol. ED–25, No. 4, pp. 472–477 (Apr. 1978).

Baliga, "Isothermal Silicon Liquid Phase Epitaxy from Supersaturated Tin", Journal of the Electrochemical Society, vol. 125, No. 4, pp. 598–600 (Apr. 1978).

Baliga, "Recombination Level Selection Criteria for Lifetime Reduction in Integrated Circuits", Solid–State Electronics, vol. 21, No. 8, pp. 1033–1038 (Aug. 1978).

Baliga, "An Improved GAMBIT Device Structure", IEEE, Transactions on Electron Devices, vol. ED–25, No. 12, pp. 1411–1412 (Dec. 1978).

Baliga et al., "Planar Diffusion in Gallium Arsenide from Tin–Doped Oxides", Journal of the Electrochemical Society, vol. 126, No. 1, pp. 135–138 (Jan. 1979).

Baliga, "Dopant Distribution in Silicon Liquid Phase Epitaxial Layers: Meltback Effects", Journal of Electrochemical Society, vol. 126, No. 1, pp. 138–143 (Jan. 1979).

Baliga, "Deep Planar Gallium and Aluminum Diffusion in Silicon", Journal of Electrochemical Society, vol. 126, No. 2, pp. 292–296 (Feb. 1979).

Baliga, "Grid Depth Dependence of the Characteristics of Vertical Channel Field Controlled Thyristors", Solid–State Electronics, vol. 22, No. 3, pp. 237–239 (Mar. 1979).

Baliga, "Buried–Grid Fabrication by Silicon Liquid–Phase Epitaxy", Applied Physics Letters, vol. 34, No. 11, pp. 789–790 (Jun. 1979).

Baliga, "Enhancement and Depletion–Mode Vertical–Channel M.O.S. Gated Thyristors", Electronics Letters vol. 15, No. 20, pp. 645 (Sep. 1979).

Baliga, "Power Junction Gate Field Controlled Devices", IEDM Technical Digest, International Electron Devices Meeting, pp. 76–78 (Dec. 1979).

Baliga, "A Power Junction Gate Field–Effect Transistor Structure with High Blocking Gain", IEEE Transactions on Electron Devices, vol. Ed–27, No. 2, pp. 368–373 (Feb. 1980).

Baliga, "Liquid Phase Epitaxial Silicon Diodes: N–Epitaxial Layers on Boron–Doped Substrates", Journal of Electrochemical Society, vol. 127, No. 5 pp. 1168–1172 (May 1980).

Baliga, "Buried–Grid Field–Controlled Thyristors Fabricated Using Silicon Liquid–Phase Epitaxy", IEEE Transaction on Electron Devices, vol. ED–27, No. 11, pp. 2141–2145 (Nov. 1980).

Baliga, B.J., "A Novel Buried Grid Device Fabrication Technology," IEEE Electron Device Letters, vol. EDL–1, No. 12, pp. 250–252 (Dec. 1980).

Baliga, "High Temperature Performance of Field Controlled Thyristors", IEDM International Electron Devices Meeting, 12/80, pp. 654–657 (Dec. 1980).

Baliga, "Recessed Gate Junction Field Transistors", IEDM International Electron Devices Meeting, pp. 784–786 (Dec. 1980).

Baliga, "Boron Autodoping Suring Silicon Liquid Phase Epitaxy", Journal of Electrochemical Society, vol. 128, No. 1, pp. 161–165 (Jan. 1981).

Baliga, "Temperature Dependence of Field–Controlled Thyristor Chracteristics", IEEE Transactions on Electron Devices, vol. Ed–28, No. 3, pp. 257–264 (Mar. 1981).

Baliga, "Switching Lots of Watts at High Speeds", IEEE Spectrum, pp. 42–48 (Dec. 1981).

Baliga, "The MAJIC–FET: A High Speed Power Switch with Low On–Resistance", IEEE Electron Devices Letters, vol. EDL–3, No. 7, pp. 189–191 (Jul. 1982).

Baliga, "Barrier–Controlled Current Conduction in Field–Controlled Thyristors", Solid–State Electronics, vol. 24, No. 7, pp. 617–620 (Jul. 1981).

Baliga et al., "Optimum Semiconductors for Power Field Effect Transistors", IEEE Electron Devices Letters, vol. EDL–2, No. 7, 7/81, pp. 162–164 (Jul. 1981).

Baliga et al., "Breakdown Characteristics of Gallium Arsinide", IEEE Electron Devices Letters, vol. EDL–2, No. 11, pp. 302–304 (Nov. 1981).

Baliga, "Semiconductors for High–Voltage, Vertical Channel Field Effect Transistors", Journal of Applied Physics, vol. 53, No. 3 Part 1, pp. 1759–1764 (Mar. 1982).

Baliga, "Electron Irradiation of Field–Controlled Thyristors", IEEE Transactions on Electron Devices, vol. ED–29, No. 5, pp. 805–811 (May 1982).

Baliga, "High Gain Power Switching Using Field Controlled Thyristors", Solid–State Electronics, vol. 25, No. 5, pp. 345–353 (May 1982).

Baliga, "Defect Conrtrol During Silicon Growth Using Dichlorosilane", Journal of the Electrochemical Society, vol. 129, No. 5, pp. 1078–1084 (May 1982).

Baliga, "The di/dt Capability of Field–Controlled Thyristors", Solid–State Electronics, vol. 25, No. 7, pp. 583–588 (Jul. 1982).

Baliga, "Breakdown Stability of Gold, Aluminum, and Tungsten Schottky Barriers on Gallium Arsinide", IEEE Electron Devices Letters, vol. EDL–3, No. 7, pp. 177–179 (Jul. 1982).

Baliga et al., "High–Voltage Device Termination Techniques, A Comparative Review", IEE Proceedings–I, Solid–State and Electron Devices, vol. 129, No. 5, pp. 173–179 (Oct. 1982).

Baliga et al., "The Insulated Gate Rectifier (IGR): A New Power Switching Device", IEDM Technical Digest, International Electron Devices Meeting, pp. 264–267 (Dec. 1982).

Baliga, "Refilling Silicon Grooves by Liquid Phase Epitaxy", Journal of the Electrochemical Society, vol. 129, No. 12, pp. 2819–2823 (Dec. 1982).

Baliga, "The di/dt Capability of Field–Controlled Thyristors", IEEE Transactions on Electron Devices, vol. ED–30, No. 6, pp. 612–616 (Jun. 1983).

Baliga et al., "Correlation of Lifetime with Recombination Centers in Electron–Irradiated P–Type Silicon", Journal of the Electrochemical Society, vol. 130, No. 9, pp. 1916–1918 (Sep. 1983).

Baliga et al., "Modulated–Conductivity Device Reduce Switching–Losses", EDN, pp. 153–162 (Sep. 1983).

Baliga et al., "The Insulated Gate Transistor (IGT)—A New Power Switching Device", Conference Record, Industry Applications Society, IEEE–IAS–1983 Annual Meeting, pp. 794–803 (1983).

Baliga, "MOS Controlled Bipolar Devices", pp. 1–8.

Baliga, "Neutron Radiation Tolerance of Field–Controlled Thyristors", IEEE Transactions on Electron Devices, vol. ED–30, No. 12, pp. 1832–1834 (Dec. 1983).

Baliga, "High Tenmperature Characteristics of Bipolar Mode Power JFET Operation", IEEE Electron Devices Letters, vol. EDL–4, No. 5, pp. 143–145 (Jul. 1983).

Baliga, "Fast–Switching Insulated Gate Transistors", IEEE Electron Devices Letters, vol. EDL–4, No. 12, pp. 452–454 (Dec. 1983).

Baliga et al., "Improving the Reverse Recovery of Power Mosfet Integral Diodes by Electron Irradiation", Solid–State Electronics, vol. 26, No. 12, pp. 1133–1141 (Dec. 1983).

Baliga, "The Pinch Rectifier: A Low–Forward–Drop High–Speed Power Diode", IEEE Electron Devices Letters, vol. EDL–5, No. 6, pp. 194–196 (Jun. 1984).

Baliga et al., "Suppressing Latchup in Insulated Gate Transistors", IEEE Electron Devices Letters vol. EDL–5 , No. 8, pp. 323–325 (Aug. 1984).

Baliga et al., "Extended Measurements of Gallium Arsinide Breakdown Characteristics Using Punchthrough Structures", IEEE Electron Devices Letters, vol. EDL–5, No. 9, pp. 385–387 (Sep. 1984).

Baliga, "Neutron Transmutation Doped Silicon for Power Semiconductor Devices", Invited Paper, Canada Institute for S.T.I., pp. 167–180 (Oct. 1984).

Baliga, "High–Voltage Junction–Gate Field–Effect Transistor with Recessed Gates", IEEE Transactions on Electron Devices, vol. ED–29, pp. 1560–1570 (Oct. 1982).

Baliga et al., "The Insulated Gate Transistor: A New Three–Terminal MOS–Controlled Bipolar Power Device", IEEE Transactions on Electron Devices, vol. Ed–31, No. 6, pp. 821–828 (Jun. 1984).

Baliga, "Neuzeitliche Kommunikation," Inhalt Elektrinik, pp. 4–5 (Apr. 1984).

Baliga, "Analysis of Insulated Gas Transistor Turn–Off Characteristics", IEEE Electron Device Letters, vol. EDL–6 No. 2, pp. 74–77 (Feb. 1985).

Baliga, "A Novel Buried Grid Device Fabrication Technology", Extended Abstracts of the 17th Conference on Solid–State Devices and Materials, pp. 250–252 (Aug. 1985).

Baliga et al., "Gallium Arsenide Schottky Power Rectifiers", IEEE Transactions on Electron Devices, vol. ED–32, No. 6, pp. 1130–1134 (Jun. 1985).

Baliga, "Temperature Behavior of Insulated Gate Transistor Characteristics", Solid–State Electronics, vol. 28, No. 3, pp. 289–297 (1985).

Baliga, "Analysis of Junction–Barrier–Controlled Schottky (JBS) Rectifier Characteristics", Solid–State Electronics, vol. 28, No. 11, pp. 1089–1093 (1985).

Baliga et al., "High Current JBS Rectifiers and Their Impact on Switching Power Supplies", 16th Annual IEEE Power Electronics Specialists Conferences, pp. 242–246 (Jun. 1985).

Baliga, "Silicon Liquid Phase Epitaxy", Journal of the Electrochemical Society, vol. 133, No. 1, pp. 5C–14C (Jan. 1986).

Baliga, "Revolutionary Innovations in Power Discrete Devices", Invited Paper, IEDM Technical Digest, International Electron Devices Meeting, pp. 102–105 (Dec. 1986).

Baliga, "Analysis of the Output Conductance of Insulated Gate Transistors", IEEE Electron Devices Letters, vol. EDL–7, No. 12, pp. 686–688 (Dec. 1986).

Baliga, "Power Integrated Circuits—A Brief Overview", IEEE Transactions on Electron Devices, vol. ED–33, No. 12, pp. 1936–1939 (Dec. 1986).

Baliga, "Modern Power Devices", A Wiley–Interscience Publication (1987).

Baliga, "Analysis of a High–Voltage Merged p–i–n/Schottky (MPS) Rectifier", IEEE Electron Devices Letters, vol. EDL–8, No. 9, pp. 407–409 (Sep. 1987).

Baliga et al., "The Merged P–I–N Schottky (MPS) Rectifier: A High Voltage, High–Speed Power Diode", IEDM Technical Digest, International Electron Devices Meeting, pp. 658–661 (Dec. 1987).

Baliga, "Evolution of MOS–Bipolar Power Semiconductor Technology", Proceedings of the IEEE, vol. 76, No. 4, pp. 409–418 (Apr. 1988).

Baliga et al., "The MOS Depletion–Mode Thyristor: A New MOS–Controlled Bipolar Power Device", IEEE Electron Devices Letters, vol. 9, No. 8, pp, 411–413 (Aug. 1988).

Baliga et al., "Gate Turn–Off Capability of Depletion–Mode Thyristors", IEEE Electron Devices Letters, vol. 10, No. 10, pp. 464–466 (Oct. 1989).

Baliga, Trench–Gate Base–Resistance–Controlled Thyristors (UMOS–BRT's), IEEE Electron Devices Letters, vol. 13, No. 12, pp. 597–599 (Dec. 1992).

Baliga et al., "The Accumulation–Mode Field–Effect Transistor: A New Ultraflow On–Resistance MOSFET", IEEE Electron Devices Letters, vol. 13, No. 8, pp. 427–429 (Aug. 1992).

Baliga, "Trends in Power Semiconductor Devices", IEEE Electron Devices Letters, vol. 43, No. 10, pp. 1717–1731 (Oct. 1996).

Bampi et al., "A Modified Lightly Doped Drain Structure for VLSI MOSFET's", IEEE Electron Devices Letters, vol. ED–33, No. 11, pp. 1769–1779 (Nov. 1986).

Bampi et al., "Modified LDD Device Structures for VLSI", IEDM Technical Digest, International Electron Devices Meeting, pp. 234–237 (Dec. 1985).

Banerjee et al., "Characterization of Trench Transistors for 3–D Memories", 1986 VLSI Symposium, San Diego, pp. 79–80 (May 1986).

Barry, "Diffusion from Doped–Oxide Sources", Silicon Device Processing, Proceedings of a Symposium, pp. 175–181 (Jun. 1970).

Barry et al., "Advances in Doped Oxides as Diffusion Sources", Solid State Technology, pp. 39–42 (Oct. 1968).

Barton et al., "A Two Level Metal CMOS Process for VLSI Circuits", Semiconductor International, pp. 98–102 (Jan. 1985).

Bashkin et al., "Modelling the Photosynthetic Water Oxidation Center: Preparation and Physical Properties of a Tetranuclear Oxide Bridged Mn Complex Corresponding to the Native $S_2$ State", Journal of the American Chemistry Society, vol. 109, No. 21, pp. 6502–6504 (Oct. 1987).

Bassous, "Fabrication of Novel Three–Dimensional Microstructures by the Anisotropic Etching of (100) and (110) Silicon", IEEE Transactions on Electron Devices, vol. ED–25, No. 10, pp. 1178–1185 (Oct. 1978).

Baumgartner et al., "Severe Cytomegalovirus Infection in Multiply Transfused, Splenectomised, Trauma Patients", The Lancet, No. 8288, vol. II for 1982, pp. 63–65 (Jul. 1982).

Bean, "Anisotropic Etching of Silicon", IEEE Transactions on Electron Devices, vol. ED–25, No. 10, pp. 1185–1193 (Oct. 1978).

Becke et al., "Wartet nicht auf Nulldurchgang," Electro Technike 57, H. 20, 23, pp. 10–12 (Oct. 1975).

Becke et al., "Wartet nicht auf Nulldurchgang," Electro Technike 57, H. 23, 4, pp. 14–16 (Dec. 1975).

Becke et al., "Using Gate–Turn–Off Thyristors", Electron: The Journal for Engineers and Managers in Electronics, pp. 38–40 (Feb. 1976).

Becke, "A High–Speed High–Voltage EPI Base GTO", Technical Digest 1977, International Electron Devices Meeting, pp. 46A–46D (1977).

Becke et al., "A New Approach to the Design of a Gate Turn–Off Thyristor", PESC 75 Record, RCA Solid State Division, Sommerville, N.J., pp. 292–299.

Becke et al., "Investigation of Gate Turn–Off Structures", IEDM Technical Digest, International Electron Devices Meeting, pp. 649–653 (Dec. 1980).

Becke, "Approaches to Isolation in High Voltage Integrated Circuits (Invited Paper)", IEDM 85, pp. 724–727 (1985).

Becke et al., "Applications of COMFETs (IGT) to 40 kHZ Off–Line Switcher", IEEE, pp. 1–7 (1986).

Bell, "The Team and The Players—Japan, the United States, and Western Europe Provide Striking Contrasts in National Interests and Techniques", IEEE Spectrum, pp. 46–46 (Nov. 1983).

Bhat et al., "Vapor–Phase Etching and Polishing of Gallium Arsenide Using Hydrogen Chlorides Gas", Journal of the Electrochemical Society, vol. 122, No. 10, pp. 1378–1382 (Oct. 1975).

Bhatti et al., "Minimization of Parasitic Capacitances in VMOS Transistors", Technical Digest, International Electron Devices Meeting, pp. 565–568 (Dec. 1976).

Bhattacharya et al., "Space–Charge Limited Conduction in n+nn+ Amorphous Hydrogenated Silicon Films", Journal of Applied Physics, 1982 American Institute of Physics, pp. 6285 (1982).

Binder et al., "Doping of Trench Capacitors for 4 Megabit DRAMs", Extended Abstracts of the $18^{th}$ (1986 International) Conference on Solid State Devices and Materials, pp. 299–302 (Aug. 1986).

Black, "Upper Cretaceous and Tertiary Geology of Mangatu State Forest, Raukumara Peninsula, New Zealand", New Zealand Journal of Geology and Geophysics, vol. 23, No. 3, pp. 292–313 (1980).

Black, Reply to a Comment (Letters to the Editor) for the above referenced article by Black; Moore, Letters to the Editor, *Upper Cretaceous and Tertiary Geology of Mangatu State Forest, Raukumara Peninsula,* Comment on the referenced article, New Zealand Journal of Geology and Geophysics, vol. 24, No. 2, pp. 301–303 (1981).

Black et al., "1/f Noise in Silicon Wafers", Journal of Applied Physics, vol. 53, No. 9, pp. 6280–6284 (Sep. 1982).

Black et al., "Stabilization Plant", Water and Sewage Works, pp. 79–81 (Jun. 1974).

Black et al., "1/f Noise in Metal Films Lacks Spatial Correlation", Physcical Review B, Condensed Matter, vol. 24, No. 12, pp. 7454–7456 (Dec. 1981).

Black et al., "Nonscalar 1/f Conductivity Fluctuations in Carbon, Gold, and Chrome Films", Physical Review B, Condensed Matter, vol. 25, No. 4, pp. 2955–2958 (Feb. 1982).

Black et al., "Hall Effect, Anisotropy, and Temperature–Dependence Measurements of 1/f Noise in Silicon on Sapphire", Physical Review B, Condensed Matter, vol. 28, No. 4, pp. 1935–1943 (Aug. 1983).

Black et al., "Nearly Traceless 1/f Noise in Bismuth", Physical Review Letters, vol. 51, No. 16, pp. 1476–1479 (Oct. 1983).

Black, "Comments on A Theory of the Hooge Parameters of Solid–State Devices", Van Der Ziel, "Reply to A Theory of the Hooge Parameters of Solid–State Devices", Handel, "Rebuttal to Comments on A Theory of the Hooge Parameters of Solid–State Devies", IEEE Transactions on Electrons on Electron Devices, vol. ED–33, No. 4, pp. 532–536 (Apr. 1986).

Blanchard, "Optimization of Discrete High Power MOS Transistors", A Dissertation Submitted to the Department of Electrical Engineering and the Committee on Graduate Studies of Stanford University (Dec. 1981).

Blech et al., "Discontinuities in Evaporated Aluminum Interconnections", $8^{th}$ Annual Proceedings Reliability Physics, from IEEE Catalog No. 70 C 59–PHY, pp. 144–157 (Apr. 1970).

Borrego et al., "Extension of Gummel's Charge Control Relation", Solid–State Electronics, vol. 20, No. 5, pp. 441–442 (May 1977).

Bowling et al., "Deposition and Reflow of Phosphosilicate Glass", Journal of the Electrochemical Society, vol. 132, No. 1, pp. 141–145 (Jan. 1985).

Bravman et al., "Structure and Morphology of Polycrystalline Silicon–Single Crystal Silicon Interfaces", Journal of Applied Physics, vol. 57, No. 8, Part 1, pp. 2779–2782 (Apr. 1985).

Bravman et al., "Morphological Studies of Polysilicon Emitter Contacts", Materials Research Society Symposium Proc. vol. 37, pp. 460–466 (1985).

Bronner et al., "Characterization of Transient Process Phenomena Using a Temperature–Tolerant Metallurgy," IEEE Electron Device Letters, vol. EDL–5, No. 3, pp. 75–77 (Mar. 1984).

Bronner et al., "Silicon Interstitial Generation by Argon Implantation", Applied Physics Letters, vol. 46, No. 5, pp. 510–512 (Mar. 1985).

Brown et al., "Refractory Metal Silicon Device Technology", Solid–State Electronics, vol. 11, pp. 1105–1112, Great Britain (May 1968).

Brown et al., "Self–Registered Molybdenum–Gate MOSFET", Solid–State Electronics, Brief Communication, vol. 15, No. 8, pp. 874–876 (Aug. 1968).

Brown et al., "Reactive Ion Beam Etching of $SiO_2$ and Polycrystalline Silicon", Applied Physical Letters, vol. 37, No. 2, pp. 159–161 (Jul. 1980).

Bulucea, "The Influence of Carrier Injection Through Emitter Sidewall on Current Gain Properties of Small Area Double Diffused Planar Transistors, Buletinul Institutului Politehnic Gheorghe Gheorghiu–Dej" Bucuresti, Tomul XXX, Numarul 2, pp. 106–125 (Mar.–Apr. 1968).

Bulucea, "Diffusion Capacitance of p–n Junctions and Transistors", Electronics Letters, vol. 4, No. 25, pp. 559–561 (Dec. 1968).

Bulucea, "Transitoare planare cu siliciu, de mica putere (I)," Automatica Si Electronica, vol. 13, No. 1, pp. 32–38 (1969).

Bulucea, "Transitoare planare cu siliciu, de mica putere (II)," Automatica Si Electronica, vol. 13, No. 2, pp. 63–68 (1969).

Bulucea, "Investigation of Deep–Depletion Régime of M.O.S. Structures Using Ramp–Response Method", Electronics Letters, vol. 6, No. 15, pp. 479–481 (Jul. 1970).

Bulucea et al., "On the MOS Structure in the Avalanche Regime", Alta Frequenza, vol. XXXIX, No. 8, Agosto pp. 734–740 (Aug. 1970).

Bulucea et al., "Particularities of the Avalanche Multiplication in Silicon p–n Junctions Due to Carrier Generation Within the Space–Charge Region", Revue Roumaine De Physique, Tome 18, No. 8, pp. 961–979 (1973).

Bulucea et al., "The Calculation of the Avalanche Multiplication Factor in Silicon P–N Junctions Taking into Account the Carrier Generation (Thermal or Optical) in the Space–Charge Region", IEEE Transactions on Electron Devices, vol. ED–20, No. 8, pp. 692–701 (Aug. 1973).

Bulucea et al., "Surface Breakdown in Silicon Planar Junctions—A Computer–Aided Experimental Determination of the Critical Field", Solid–State Electronics, vol. 17, No. 9, pp. 881–888 (Sep. 1974).

Bulucea et al., "Avalanche–Injected Electron Currents in Thermally Grown $SiO_2$", Revue Roumaine De Physique, Tome 19, No. 10, pp. 1015–1027 (1974).

Bulucea, "Avalanche Injection into the Oxide in Silicon Gate–Controlled Devices—I. Theory", Solid–State Electronics, vol. 18, No. 4, pp. 363–374 (Apr. 1975).

Bulucea, "Avalanche Injection into the Oxide in Silicon Gate–Controlled Devices—II. Experimental Results", Solid–State Electronics, vol. 18, No. 4, pp. 381–391 (May 1975).

Bulucea et al., "Avalanche Injection in Silicon Planar Semiconductor Devices", Japanese Journal of Applied Physics, Supplement 2, Part 2, Proceeding of the Second International Conference on Solid Surfaces, pp. 449–452 (1974).

Bulucea, "An HP–67/97 Network Analyst for EE Students", Computers & Education, An International Journal, vol. 9, No. 3, pp. 145–154 (1985).

Bulucea et al., "A First–Order Theory of the Static Induction Transistor", Solid–State Electronics, vol. 30, No. 12, pp. 1227–1242 (Dec. 1987).

Bulucea et al., "Trench DMOS Transistor Technology for High–Current (100 A Range) Switching", Solid–State Electronics, vol. 34, No. 5, pp. 493–507 (Jun. 1990).

Campbell et al., "The Aluminum Microcrack", The Electrochemical Society, Inc., Fall Meeting, pp. 523–524 (Oct. 1969).

Campbell et al., "Sub–Micron Lateral Diffusion of Beryllium Ion Implanted Junctions in GaAs Using $Si_3N_4$ Encapsulation", Proceedings of the Symposium on Silicon Nitride Thin Insulating Films, Proceedings vol. 83–8, The Electrochemical Society, pp. 150–159 (1983).

Campbell et al., "Process–Induced Defects in High–Purity GaAs", Materials Research Society Symposium Proc. vol. 14, Canada Institute for S.T.I., pp. 283–287 (Sep. 1983).

Campbell et al., "One–Micron Lateral Diffusion of Beryllium Ion–Implanted Junctions on GaAs Using $Si_3N_4$ Encapsulation", Electrochemical Society, Extended Abstracts, Canada Institute for S.T.I., pp. 173–174 (Jan. 1984).

Campbell et al., "Enhanced Protection of GaAs Against Thermal Surface Degradation by Encapsulated Annealing in an Arsine Ambient", Applied Physics Letters, vol. 45, No. 1, pp. 95–97 (Jul. 1984).

Campbell et al., "Trapezoidal–Groove Schottky–Gate Vertical Channel GaAs FET (GaAs Static Induction Transistor)", IEDM Technical Digest, International Electron Devices Meeting, pp. 186–189 (Dec. 1984).

Campbell et al., "Beryllium Ion–Implanted Junctions in GaAs with Submicron Lateral Diffusion", Journal of the Electrochemical Society, vol. 132, No. 1, pp. 186–189 (Jan. 1985).

Campbell et al., "Trapezoidal–Groove Schottky–Gate Vertical Channel GaAs FET (GaAs Static Induction Transistor)", Electron Device Letters, vol. EDL–6, No. 6, pp. 304–306 (Jun. 1985).

Campbell et al., "Prevention of Thermal Surface Damage in GaAs by Encapsulated Annealing in an Arsine Ambient", Journal of Electronic Materials, vol. 15, No. 3, pp. 125–131 (May 1986).

Caughey et al., Carrier mobilities in silicon empirically related to doping and field, Proc. IEEE, vol. 55, p. 2192–2193 ((Dec. 1967).

Cham et al., "Characterization and Modeling of the Trench Surface Inversion Problem for the Trench Isolated CMOS Technology", IEEE, IEDM, pp. 23–26 (1983).

Chang et al., "Thiophene Hydrogenolysis for the Evaluation of Hydrodesulfurization Catalysts", Process Design and Development, vol. 17, No. 3, pp. 310–312 (Jul. 1978).

Chang et al., "Cyclotron Resonance at $Na^+$–Doped $Si$–$SiO_2$ Interfaces", Solid State Communications, vol. 38, No. 12, pp. 1189–1192 (Jun. 1981).

Chang et al., "A Spectroscope Study of $Na^+$–Bound Electrons at $Si$–$SiO_2$ Interfaces", Surface Science, vol. 113, Nos. 1–3, pp. 144–147 (Jan. 1982).

Chang et al., "Spreading–Boiling Model for Instantaneous Spills of Liquefied Petroleum Gas (LPG) on Water", Journal of Hazardous Materials, pp. 19–35 (Jul. 1982).

Chang et al., "25 AMP, 500 Volt Insulated Gate Transistors", IEDM Technical Digest, International Electron Devices Meeting, pp. 83–86 (Dec. 1983).

Chang et al., "Physical Defects in Silicon Vapor Epitaxy", Electrochemical Society, Extended Abstracts, Canada Institute for S.T.I, pp. 290 (Jun. 1984).

Chang et al., "Comparison of N and P Channel IGTs", IEDM Technical Digest, International Electron Devices Meeting, pp. 278–281 (Dec. 1984).

Chang et al., "Effect of Heat Treatment on Contact Resistances of Cr–Ni–Ag and Ti–Ag–Au", The Electrochemical Society, Extended Abstracts, vol. 85–2, pp. 470–471 (Oct. 1985).

Chang et al., "High Quality Thick Epitaxial Films for Power Semiconductor Devices", Solid–State Electronics, vol. 29, No. 1, pp. 39–46 (Jan. 1986).

Chang et al., "High–Current, Low–Forward–Drop JBS Power Rectifiers", Solid–State Electronics, vol. 29, No. 3, pp. 359–363 (Mar. 1986).

Chang et al., "Ultra Low Specific On–Resistance UMOS FET," IDEM Technical Digest, Int'l Electron Devices meeting, Los Angeles, pp. 642–645 (Dec. 1986).

Chang et al., "Effect of Roxithromycin on Acute Toxoplasmosis in Mice", Antimicrobial Agents and Chemotherapy, American Society for Microbiology, vol. 31, No. 7, pp. 1147–1149 (Jul. 1987).

Chang et al., "Self–Aligned UMOSFET's with a Specific On–Resistance of 1 mO–$cm^2$", IEEE Transactions on Electron Devices, vol. ED–34, No. 11, pp. 2329–2334 (Nov. 1987).

Chang et al., "Impact of Cell Breakdown Upon Power DMOSFET On–Resistance", IEEE Transactions on Electron Devices, vol. ED–34, No. 11, pp. 2360 (Nov. 1987).

Chang et al., "Insulated Gate Bipolar Transistor (IGET) with a Trench Gate Structure," IDEM Technical Digest, Int'l Electron Devices meeting, pp. 674–677 (Dec. 1987).

Chang, "Numerical and Experimental Comparison of 60 V Vertical Double–Diffused MOSFETS and MOSFETS with a Trench–Gate Structure", Solid–State Electronics, vol. 32, No. 3, pp. 247–251 (Mar. 1989).

Chang et al., "MOS Trench Field–Controlled Thyristor", IEDM, pp. 293–296 (1989).

Chang et al., "500–V n–Channel Insulated–Gate Bipolar Transistor with a Trench Gate Structure", IEEE Transactions on Electron Devices, vol. 36, No. 9, pp. 1824–1829 (Sep. 1989).

Chang et al., "Ultra Low Specific On–Resistance UMOS FET", IEDM, pp. 642–645 (1986).

Chang et al., "Lateral HVIC with 1200–V Bipolar and Field–Effect Devices",IEEE Transactions on Electron Devices, vol. ED–33, No. 12, pp. 1992–2001 (Dec. 1986).

Chatterjee et al., "Trench and Compact Structures for dRAMS", IEDM, pp. 128–131 (1986).

Chow et al., "Modification of Schottky Barriers in Silicon by Reactive Ion Etching in $NF_3$ Gas Mixtures", Proceedings of the fourth Symposium on Plasma Processing, The Electrochemical Society, vol. 83–10, pp. 100–113 (1983).

Chow et al., "Antimony–Doped Tin Oxide Films Deposited by the Oxidation of Tetramethyltin and Trimethylantimony", Journal of the Electrochemical Society, vol. 129, No. 5, pp. 1040–1045 (May 1982).

Chow et al., "Modification of Schottky Barriers in Silicon by Reactive Ion Etching in $NF_3$ Gas Mixtures", Journal of the Electrochemical Society, vol. 131, No. 1, pp. 156–160 (Jan. 1984).

Chow et al., "The Effect of Hydrogen and Helium Implantation on Silicon MOS Characteristics", Electrochemical Society, Extended Abstracts, Canada Institute for S.T.I., pp. 172 (Jun. 1984).

Chow et al., "Comparison of 300–, 600–, and 1200–V n–Channel Insulated Gate Transistors", IEEE Electron Device Letters, vol. EDL–6, No. 4, pp. 161–163 (Apr. 1985).

Chow et al., "The Effect of MOS Channel Length on the Performance of Insulated Gate Transistors", IEEE Electron Device Letters, vol. EDL–6, No. 8, pp. 413–415 (Aug. 1985).

Chow et al., "The Effect of Channel Length and Gate Oxide Thickness on the Performance of Insulated Gate Transistors", IEEE Transactions on Electron Devices, vol. ED–32, No. 11, pp. 2554 (Nov. 1985).

Chow et al., "A Self–Aligned Short Process for Insulated Gate Transistors", IEDM Technical Digest, International Electron Devices Meeting, pp. 146–149 (Dec. 1985).

Chow et al., "Thin Film Properties of Sputtered Niobium Silicide on $SiO_2$, $Si_3N_4$, and $N^+$ Poly–Si", Journal of the Electrochemical Society, vol. 133, No. 1, pp. 175–178 (Jan. 1986).

Chow et al., "Performance of P–Channel Lateral Insulated Gate Transistors", IEEE Transactions on Electron Devices (Nov. 1986).

Chow et al., "Latching in Lateral Insulated Gate Bipolar Transistors", IEDM Technical Digest, International Electron Devices Meeting, pp. 774–777 (Dec. 1987).

Chow et al., "P–Channel, Vertical Insulated Gate Bipolar Transistors with Collector Short", IEDM Technical Digest, International Electron Devices Meeting, pp. 670–673 (Dec. 1987).

Chow et al., "The Effect of SIPOS on the Performance of Lateral Insulated Gate Bipolar Transistors", IEEE Transactions on Electron Devices, vol. Ed–34, No. 12, pp. 2359 (Dec. 1987).

Chow et al., "A Self–Aligned Short Process for Insulated–Gate Bipolar Transistors", IEEE Transactions on Electron Devices, vol. 39, No. 6, pp. 1317–1321 (Jun. 1992).

Christmas et al., "Support for Model Studies for the Proposed Existence of an $S_{-1}$ Oxidation Level in the Manganese Assembly of the Photosynthetic Water Oxidation Centre", Journal of the Chemical Society, Chemical Communications, No. 17, pp. 1303–1305 (Sep. 1987).

Coen et al., "A High–Performance Planar Power MOSFET", IEEE Transactions on Electron Devices, vol. ED–27, No. 2, pp. 340–343 (Feb. 1980).

Combs et al., "Bimodal MOS–Bipolar Monolithic Kitchip Array", IEEE ISSCC (International Solid State Circuits Conference)77, pp. 224–225 (Feb. 1977).

Cserveny et al., "The Spatial Variation of the QuasiFermi Potentials in Reverse–Biased $p^-+n$ Junctions and Its Implications in Transistion Region Capacitance Calculations", IEEE Transactions on Electron Devices, vol. ED–16, No. 2, pp. 220–222 (Feb. 1969).

Dauksher et al., "Three "Low Dt" Options for Planarizing the Pre–metal Dielectric on an Advanced Double Poly BiCMOS Process", Journal of the Electrochemical Society, vol. 139, No. 2, pp. 532–536 (Feb. 1992).

D'Avanzo et al., "Effects of the Diffused Impurity Profile on the DC Characteristics of VMOS and DMOS Devices," IEEE Journal of Solid–State Circuits, vol. SC–12, No. 4, pp. 356–362 (Aug. 1977).

David, "Computerized Thermal Analysis of Hybrid Circuits", IEEE Transactions on Parts, Hybrids, and Packaging, vol. PHP–13, No. 3, pp. 283–290 (Sep. 1977).

David et al., "A New V–MOS/Bipolar Darlington Transistor for Power Applications", IEEE, IEDM, pp. 83–86 (1980).

Davies et al., "Considerations for High–Speed and Analog–Circuit–Compatible $I^2L$ and the Analysis of Poly $I^2L$", IEEE Journal of Solid–State Circuits, vol. SC–14, No. 5, pp. 876–887 (Oct. 1979).

Davies et al., "Device Characteristics for Poly $I^2L$", Technical Digest 1977, International Electron Devices Meeting, pp. 170–174 (Dec. 1977).

Davies et al., "Evaluating Integrated Injection Logic Performance" IEEE, pp. 506–510 (1979).

Davies et al., "$I^2L$ DC Functional Requirements", IEEE Journal of Solid–State Circuits, pp. 208–210 (Apr. 1977).

Davies et al., "Poly $I^2L$—A High–Speed Linear–Compatible Structure", IEEE Journal of Solid–State Circuits, vol. SC–12, No. 4, pp. 367–3675 (Aug. 1977).

Davies et al., "Solid Logic Technology: Versatile, High–Performance Microelectronics", ISM Journal, pp. 102–114 (Apr. 1964).

Davies et al., "Ion Implantation in InAsxP1–x," IEEE Transactions on Electron Devices, Ed. 22, 1 pg. (Nov. 1975).

Deal et al., "Kinetics of the Thermal Oxidation of Silicon on $O_2/H_2O$ and $O_2/Cl_2$ Mixtures", Journal of the Electrochemical Society, vol. 125, No. 2, pp. 339–346 (Feb. 1978).

Declerck et al., "Some Effects of "Trichloroethylene Oxidation" on the Characteristics of . . . Devices", Journal of the Electrochemical Society, vol. 122, No. 3, pp. 436–439 (Mar. 1975).

Declercq et al., "Avalanche Breakdown in High–Voltage D–MOS Devices", IEEE Transactions on Electron Devices, vol. ED–23, No. 1, pp. 1–4 (Jan. 1976).

Decleroq et al., "Characterization of the Anisotropic Etching of Silicon with the Hydrazine–Water Mixture", Extended Abstracts, Abstract No. 219, vol. 74–2, The Electrochemical Society, pp. 538–541 (Oct. 1974).

Decleroq et al., "Optimization of the Hydrazine–Water Solution for Anisotropic Etching of Silicon in Integrated Circuit Technology", Journal of the Electrochemical Society, vol. 122, No. 4, pp. 542–552 (Apr. 1975).

Dennard et al., "Design of Ion–Implanted MOSFET's with Very Small Physical Dimensions,", IEEE Journal of Solid–State Circuits, pp. 256–268 (Oct. 1974).

Diril et al., "Binuclear Mixed–Valence $Mn^{II}Mn^{III}$ Complexes: Insight About the Resolution of Hyperfine Structure in the EPR Spectrum", Journal of the American Chemical Society, vol. 109, No. 20, pp. 6207–6208 (Sep. 1987).

Dolny et al., "A Spice II Subcircuit Representation for Power MOSFETs Using Emperical Methods", RCA Laboratories, Princeton, NJ 08540, pp. 147–153.

Dolny et al., "Computer–Aided Analytics of Gate–Voltage Propagation Effects in Power MOSFETs", Technical Papers of the First International High Frequency Power Conversion 1986 Conference, pp. 149–154 (1986).

Doo et al., "Chemical Vapor Deposition of Oxides and Glasses", Abstract No. 42, IBM Components Division, pp. 106–110.

Dornfest et al., "Borophosphosilicate Glass Processing Proposed for Devices Breaking the One Micron Barrier", Semi Technology Symposium '85—Breaking the One Micron Barrier, Technical Program Proceedings, Tokyo, pp. F–5–1—F–5–6 (Dec. 1985).

Dumensil et al., "Some Recent Developments in Fused Glass Films on Semiconductor Devices", Fairchild Semiconductor, Abstract No. 41, pp. 103–105.

Dunham et al., "Point–Defect Generation During Oxidation of Silicon in Dry Oxygen. II. Comparison to Experiment", Journal of Applied Physics, vol. 59, No. 7, pp. 2551–2561 (Apr. 1986).

Dunham et al., "Point–Defect Generation During Oxidation of Silicon in Dry Oxygen, I. Theory", Journal of Applied Physics, vol. 59, No. 7, pp. 2541–2550 (Apr. 1986).

Dupuis et al., "Planarization with Spin–On–Glass/LPCVD Composite Films", 1985 Symposium on VLSI Technology Digest of Technical Papers, pp. 52–53 (1985).

Eaton et al., "Effects of Coarse Phase Quantization in Ultrasound Scanners", Ultrasonics Symposium, Cherry Hill, N.J., pp. 784–788 (1978).

Ehle et al., "Low Temperature Aluminum Oxide Deposition Using Trimethylaluminum", Journal of Electronic Materials, pp. 587–601 (Jan. 1983).

Einthoven et al., "On the Proportions of Chip Area for Multistage Darlington Power Transistors", IEEE Power Electronics Specialists Conference—1975, PESC'75 Record, pp. 282–291 (1975).

Endo et al., "Novel Device Isolation Technology with Selective Epitaxial Growth", IEEE Transactions on Electron Devices, vol. ED–31, No. 9, pp. 1283–1288 (Sep. 1984).

Engeler et al., "A High–Temperature Two–Level Interconnection Sysyem," The Electrochemical Society, Inc., Fall Meeting, Detroit, Michigan, pp. 504–507 (Oct. 1969).

Evwaraye et al., "The Dominant Recombination Centers in Electron–Irradiated Semiconductors Devices", Journal of the Electrochemical Society, vol. 124, No. 6, pp. 913–916 (Jun. 1977).

Faggin et al., "Room Temperature Instabilities Observed on Silicon Gate Devices", $8^{th}$ Annual Proceeding Reliability Physics, IEEE Catalog No. 70 C 59–PHY, pp. 35–41 (Apr. 1970).

Fang et al., "Hot Electron Effects and Saturation Velocities in Silicon Inversion Layers", Journal of Applied Physics, vol. 41, No. 4, pp. 1825–1831 (Mar. 1970).

Fieber et al., "Superior Metal Step Coverage and Dielectric Quality in a Simple Two–Level Metal 1.0 μm CMOS Technology", VMIC Conference, IEEE, pp. 55–61 (Jun. 1989).

Findley et al., "Metal Fill Design For Controlling Capacitance Increase," VLSI Technology, Inc. Invention Disclosure Form, 20 pgs. (Jan. 1996).

Firester et al., "Optical Readout of the RCA VideoDisc", RCA Review, VideoDisc Optics, vol. 39, pp. 392–427 (Sep. 1978).

Firester et al., "Optical Recording Techniques for the RCA VideoDisc", RCA Review, VideoDisc Optics, vol. 39, pp. 426–471 (Sep. 1978).

Fonash, "Damage Effects in Dry Etching," Solid State Tech., pp. 201–205 (Apr. 1985).

Fong et al., "An Electrically Reconfigurable Programmable Logic Array Listing Using a CMOS/DMOS Technology,", IEEE Journal of Solid–State Circuits, vol. SC–19, No. 6, pp. 1041–1043 (Dec. 1984).

Foster et al., "A Low Pressure BPSG Deposition Process", Solid–State Science and Technology, Vol. 132, No. 2, pp. 505–507 (Feb. 1985).

Frederiksen, "Intuitive CMOS Electronics: The Revolution in VLSI, Processing, Packaging, and Design," McGraw–Hill Series in Intuitive IC Electronics (1989).

Frohman–Bentchkowsky, "On the Effect of Mobility on MOS Device Characteristics," Proc. IEEE, vol. 56, No. 2, pp. 217–218 (Feb. 1968).

Fujii et al., "A Planarization Technology Using a Bias–Deposited Dielectric Film and an Etch–Back Process", IEEE Transactions on Electron Devices, vol. 35, No. 11, pp. 1829–1833 (Nov. 1988).

Gale et al., "A Colour Micro–Storage and Display System Using Focused Image Holograms", Optics and Laser Technology, OLTCAS 7(5) 193–240, vol. 7 No. 5, pp. 234–236 (1975).

Gardner et al., "Layered and Homogeneous Films of Aluminum and Aluminum/Silicon with Titanium and Tungsten for Multilevel Interconnects", IEEE Transactions on Electron Devices, vol. ED–32, No. 2, pp. 174–183 (Feb. 1985).

Gardner et al., "Aluminum Alloys with Titanium, Tungsten, and Copper for Multilayer Interconnections", V–MIC Conf., IEEE, pp. 68–77 (Jun. 1984).

Gardner et al., "Homogeneous and Layered Films of Aluminum/Silicon with Titanium for Multilevel Interconnects", V–MIC Conf., IEEE, pp. 102–113 (Jun. 1985).

Gardner et al., "Layered and Homogeneous Films of Aluminum and Aluminum/Silicon with Titanium, Zirconium, and Tungsten for Multilevel Interconnects", 1985 International Symposium on VLSI Technology, Systems and Applications, Taiwan, pp. 157–161 (1985).

Garner et al., "An Interdigitated Back Contact Solar Cell wih High–Current Collection," IEEE Electron Device Letters, vol. EDL–1, No. 12, pp. 256–258 (Dec. 1980).

Gerzberg et al., "A monolithic Power–Spectrum Centroid Detector", IEEE International Solid–State Circuits Conference, pp. 164–165 (1981).

Gilbert et al., "A Fully Integrable Insulated Gate Bipolar Transistor with a Trench Gate Structure", IEEE, 5th International Symposium on Power Semiconductor Devices and IC's, pp. 240–245 (1993).

Gimpelson et al., "Plasma Planarization with a Non–Planar Sacrificial Layer", V–MIC Conf., IEEE,37–44 (Jun. 1984).

Glover et al., "Doping Profile Measurements from Avalanche Space–Charge Resistance: A New Technique", Journal of Applied Physics, vol. 46, No. 2, pp. 867–874 (Feb. 1975).

Glover et al., "R–I Profiling: A New Technique for Measuring Semiconductor Doping Profiles", Applied Physics Letters, vol. 25, No. 6, pp. 348–349 (Sep. 1974).

Goodman, "Recent Advances in Discrete Power Transistors", IEDM, pp. 270–273 (1984).

Goodman et al., "Improved COMFETs with Fast Switching Speed and High–Current Capability", IEDM, Technical Digest, International Electron Devices Meeting, pp. 79–82 (Dec. 1983).

Goodwin et al., "The Use of 2D Effects in Locos Structure to Improve Device Isolation", IEDM Technical Digest, International Electron Devices Meeting, pp. 294–297 (Dec. 1982).

Goodwin et al., "Electrical Performance and Physics of Isolation Region Structures for VLSI", IEEE Transactions on Electron Devices, vol. ED–31, No. 7, pp. 681–872 (Jul. 1984).

Goodwin et al., "Trench Isolation Technology and Device Physics", Symposium on VLSI Technology, Maui, Hawaii, pp. 28–29 (1983).

Goto et al., "An Isolation Technology for High Performance Bipolar Memories—IOP–II", IEDM, IEEE, pp. 58–61 (1982).

Grebene, A.B., "Analog integrated circuit design," pp. 1–38 (1972).

Green et al., "A Simplified Computational Treatment of Recombination Centers in the Transmission line Equivalent Circuit Mode of a Semiconductor", Solid–State Electronics, vol. 15, pp. 1027–1029 (1972).

Green et al., "Frequency Response of the Current Multiplication Process in MIS Tunnel Diodes", Solid State Electronics, vol. 18, No. 9, pp. 745–752 (Sep. 1975).

Griffin et al., "Process Physics Determining 2–D Impurity Profiles in VLSI Devices", IEDM Technical Digest, International Electron Devices Meeting, pp. 522–525 (Dec. 1986).

Griffin et al., "The Influence of Point Defects on Two Dimensional Diffusion Kinetics", Materials Research Society Symposium Proc., vol. 71, pp. 75–81 (1966).

Griffin et al., "Measurement of Silicon Interstitial Diffusivity", Applied Physics Letters, American Institute of Physics, pp. 319–321 (Aug. 1985).

Grivna et al., "Dielectric Planarization for VLSI and ULSI Applications", Semiconductor International, pp. 134–137 (Jul. 1994).

Gross et al., "A Digital Radio Command Link for Implantable Biotelemetry Applications", 1984 IEEE International Solid–State Circuits Conference Digest of Technical Papers, pp. 210–211 (Feb. 1984).

Grüning et al., "Properties of a High–Power Field–Controlled Thyristor", IEDM, IEEE, pp. 110–113 (1986).

Hanamura et al., "Operation of Bulk CMOS Devices at Very Low Temperatures", Symposium on VLSI Technology, Maui, Hawaii, pp. 46–47 (1983).

Hanma et al., "An Electronic Still Camera Technology", IEEE Transactions on Consumer Electronics, vol. 30, No. 3, pp. 402–408 (Aug. 1984).

Harada et al., "A Swing CCD Image Sensor", The Institute of Television Engineers of Japan, vol. 37, No. 10, pp. 826–832 (1983).

Hardy et al., "Lattice Dynamics and Second–Order Raman Spectrum of NaF", The Physical Review, vol. 179, No. 3, pp. 837–846 (Mar. 1969).

Hasegawa et al., "A Practical Optical Lithography for Three Quarters Micron Process", Central Research Laboratory, Hitachi Ltd., Kokubunji, Tokyo 185, Japan, pp. 78–79.

Hayasaka et al., "U–Groove Isolation Technique for High Speed Bipolar VLSI's", IEDM, IEEE, pp. 62–65 (1982).

Hayashi et al., "Polysilicon Super–Thin–Film Transistor (SFT)", Japanese Journal of Applied Physics, vol. 23, No. 11, pp. L819–L820 (Nov. 1984).

Hayashi et al., "Transistorized Ionization Vacuum Gauge Circuit", . . . of Japan, pp. 18–23 (Apr. 1971).

Hayashi et al., "Wire Bonding for High–Frequency Devices", Bulletin of the Electrochemical Laboratory, Special Edition: Semiconductor Device V, pp. 41–50 (Jul. 1972).

Hayashi et al., "Design of ED–MOS Buffer", Electronics and Communications in Japan, vol. 55, pp. 107–114 (Oct. 1972).

Hayashi et al., "Design Theory of ED–MOS–IC", Electronics and Communications in Japan, vol. 55, pp. 84–92 (Jul. 1972).

Hayashi et al., "Microfabrication Technology", Electrical Communication Laboratories Technical Journal, vol. 27, No. 9, pp. 19–22 (1978).

Hayashi et al., "Propagation Time and Design Optimization of Complementary MOS Logic Circuits", Bulletin of the Electrotechnical Laboratory, pp. 588–603 (Dec. 1969).

Hayashi et al., "Invited: DSA MOS Transistor and Its Integrated Circuit", Japanese Journal of Applied Physics, vol. 16, (1977) Supplement 16–1, Proceedings of the 8th Conference (1976 International) on Solid State Devices, Tokyo, pp. 163–166 (1976).

Hayashi, "Propagation Delay Time and Delay–Power Product of a Small–Sized DSA–ED Gate Circuit", IEEE Journal of Solid–State Circuits, vol. SC–13, No. 5, pp. 726–728 (Oct. 1978).

Hayashi et al., "High Frequency Inverter Using Power MOSFET", Transactions of the Institute of Electrical Engineers of Japan, vol. 104, No. 7/8, Section E, pp. 153–159 (Jul./Aug. 1984).

Henning et al., "Substrate Current in N–Channel and P–Channel MOSFETs Between 77K and 300K: Characterization and Simulation", IEDM Technical Digest, International Electron Devices Meeting, pp. 573–576 (Dec. 1985).

Ho et al., "Thermal Oxidation of Heavily Phosphorous–Doped Silicon", Journal of the Electrochemical Society, vol. 125, No. 4, pp. 665–671 (Apr. 1978).

Ho et al., "Improved MOS Device Performance Through the Enhanced Oxidation of Heavily Doped $n^+$ Silicon", IEEE Transactions on Electron Devices, vol. ED–26, No. 4, pp. 623–630 (Apr. 1979).

Ho et al., "Si/SiO$_2$ Interface Oxidation Kinetics: A Physical Model for the Influences of High Substrate Doping Levels", Journal of the Electrochemical Society, vol. 126, No. 9, pp. 1516–1522 (Sep. 1979).

Ho et al., "Suprem III—Process Simulation Toward VLSI", Symposium on VLSI Technology, Maui, Hawaii, pp. 72–73 (1983).

Ho et al., "VLSI Process Modeling—SUPREM–III", IEEE Transactions on Electron Devices, vol. ED–30, No. 11, pp. 1438–1453 (Nov. 1983).

Holroyd, "Power Semiconductor Devices for Hybrid Breakers", IEEE Transactions on Power Apparatus and Systems, vol. PAS–10, No. 7, pp. 2103–2108 (Jul. 1982).

Hom–Ma et al., "LSI Surface by RF Sputter Etching", Journal of the Electrochemical Society: Solid–State Science and Technology, vol. 126, No. 9, pp. 1530–1533 (Sep. 1979).

Horiguchi et al., "Extremely High Transconductance (Above 500 mS/mm) MOSFET with 2.5 nm Gate Oxide", IEDM Technical Digest, International Electron Devices Meeting, pp. 761–763 (Dec. 1985).

Hsieh et al., "Image Interpolation by Analogue Circuit", Electronics Letters, vol. 28, No. 9, pp. 867 (Apr. 1992).

Hsu, "Influence of Surface States on the Measurement of Field–Effect Mobility", IEEE Transactions on Electron Devices, vol. ED–25, No. 11, pp. 1331–1332 (Nov. 1978).

Hu et al., "Optimum Design of Power MOSFET's", IEEE Transactions on Electron Devices, vol. ED–31, No. 12, pp. 1693–1700 (Dec. 1984).

Hu, "A Parametric Study of Power MOSFETS", PESC '79 Record, IEEE Power Electronics Specialists Conference—1979, pp. 385–395 (1979).

Hudson et al., "Large–Value Monolithic Resistors for Micropower Integrated Circuits", IEEE Journal of Solid–State Circuits, vol. SC–7, No. 2, pp. 160–167 (Apr. 1972).

Hudson et al., "Monolithic Micropower Command Receiver", IEEE Journal of Solid–State Circuits, vol. SC–7, No. 2, pp. 125–135 (Apr. 1972).

Hui et al., "Scaling Limitations of Submicron Local Oxidation Technology", IEDM, IEEE, pp. 392–395 (1985).

Ifström et al., "A 150–V Multiple Up–Drain VDMOS, CMOS, and Bipolar Process in "Direct–Bonded" Silicon on Insulator on Silicon", IEEE Electron Device Letters, vol. 13, No. 9pp. 460–461 (Sep. 1992).

Ikeda et al., "Power MOS FET", NEC Technical Journal, vol. 35, No. 8, pp. 115–119 (Aug. 1982).

Ikeda et al., "Recent Progress of Power Electronic Devices", The Hitachi Hyoron 8, pp. 5–10 (Aug. 1986).

Ikeda et al., "Power MOS FET", NEC Technical Journal, vol. 34, No. 10, pp. 98–104 (Nov. 1981).

Ishijima et al., "A New Trench Isolation Technique for MOS VLSI", VLSI Symposium, pp. 28–29 (Sep. 1984).

Ishikawa et al., "A 2.45 GH$_z$ Power LD–MOSFET With Reduced Source Inductance by V–Groove Connections", IEDM, IEEE, pp. 166–169 (1985).

Itakura et al., "Design and Fabrication of GaAs Iiall IC", Matsushita Electronics Corporation, Semiconductor Laboratory, pp. 1–5 (1986).

Ito et al., "Development and Application of Power MOS FETS For Power Supply", JICST, vol. 81, No. 96, pp. 1–6 (Jul. 1981).

Jain et al., "Trench j–MOS Power Field–Effect Transistors", Conference of Automotive Power Electronics, IEEE, pp. 3–8 (1989).

Jenné et al., "A Theoretical and Experimental Analysis of the Buried–Source VMOS Dynamic RAM Cell", IEEE Transactions on Electron Devices, vol. ED–25, No. 10, pp. 1204–1213 (Oct. 1978).

Johannessen et al., "Observation of Phosphorus Pile–Up at the SiO$_2$–Si Interface[a]", Journal of Applied Physics, vol. 49, No. 8, pp. 4453–4458 (Aug. 1978).

Jurgensen et al., "Geometry: Points, Lines, Planes, and Angles," pp. 5–6 (2000).

Kamins et al., "Oxidation of Phosphorus–Doped Low Pressure and Atmospheric Pressure CVD Polycrystalline–Silicon Films", Journal of Electrochemical Society: Solid–State Science and Technology, vol. 126, No. 5, pp. 838–844 (May 1979).

Kamiya et al., "Eprom Cell With High Gate Injection Efficiency", IEDM Technical Digest, International Electron Devices Meeting, pp. 741–744 (Dec. 1982).

Kao et al., "Two–Dimensional Silicon Oxidation Experiments and Theory", IEDM, IEEE, pp. 388–391 (1985).

Kasahara et al., "Monolithically Integrated In$_{0.53}$Ga$_{0.47}$As–PIN/InP–MISFET Photoreceiver", Electronics Letters, vol. 20, No. 8, (Apr. 1984).

Kasai et al., "Impurity Profile Measurement Using $V_T$–$V_{SB}$ Characteristics", NEC Research & Development, No. 74, pp. 109–114 (Jul. 1984).

Kasai et al., "1/4pm CMOS Isolation Technique with Sidewall Insulator and Selective Epitaxy", 1985 International Electron Devices Meeting, Technical Digest, pp. 419–422 (1985).

Katz et al., "Sims Analysis of Low Temperature Ohmic Contacts to GaAs", Applications of Surface Science 9 pp. 122–130 (1981).

Kay et al., "A New VMOS Power FET", IEDM, IEEE, pp. 97–101 (1979).

Kendall, "On Etching Very narrow Grooves in Silicon", Applied Physics Letters, vol. 26, No. 4, pp. 195–198 (Feb. 1975).

Kennedy et al., "Analysis of the Impurity Atom Distribution Near the Diffusion Mask for a Planar p–n Junction", IBM Journal of Research and Development, vol. 9, No. 3, pp. 179–186 (May 1965).

Keonjian, "Microelectronics Theory, Design, and Fabrication", pp. 274–276 (1963).

Kern et al., "Chemical Vapor Deposition of Silicate Glasses for Semiconductor Devices", The Electrochemical Society, Inc., Spring Meeting, pp. 234–235 (May 1968).

Kern et al., "Chemical Vapor Deposition of Silicate Glasses for Use with Silicon Devices", The Journal of the Electrochemical Society: Electrochemical Technology, pp. 562–573 (Apr. 1970).

Kern et al., "Chemically Vapor–Deposited Borophosilicate Glasses for Silicon Device Applications", RCA Review, vol. 43, pp. 423–457 (Sep. 1982).

Kern, "Part 2b—Deposited Dielectrics for VLSI: A Critical Review of Deposited Dielectric Materials, Methods and Equipment for VLSI Manufacturing", Seconductor International, pp. 122–129 (Jul. 1985).

Kern et al., "Optimized Chemical Vapor Deposition of Borophosilicate Glass Films," RCA Review, vol. 46, pp. 117–153 (Jun. 1985).

Kerr et al., "Stabilization of SiO$_2$ Passivation Layers with P$_2$O$_5$", IBM Journal, pp. 376–384 (Sep. 1964).

Khandkar et al., "The System AgI–AgBr: Energetic Consequences of Defect Equilibria in Single–Phase and Two–Phase Regions", vol. 131, No. 11, pp. 2683.

Kikuchi et al., "A High–Speed Bipolar LSI Process Using Self–Aligned Double–Diffusion Polysilicon Technology", IEDM, IEEE, pp. 420–423 (1986).

Klein, "The Mechanism of Self–Healing Electrical Breakdown in MOS Structures", IEEE Transactions on Electron Devices, vol. ED–13, No. 11, pp. 778–805 (Nov. 1966).

Knutti et al., "Integrated Circuit Implantable Systems", ISA Transactions, A Publication of the Instrument Society of America, vol. 19, No. 4, pp. 47–53 (1980).

Kooi, "Formation and Composition of Surface Layers and Solubility Limits of Phosphorus During Diffusion on Silicon", Journal of the Electrochemical Society, vol. 111, No. 12, pp. 1383–1387 (Dec. 1964).

Kopp et al., "What's Ahead in Water Processing and Materials", Semiconductor International, pp. 54–58 (Jan. 1989).

Korczynski et al., "Improved Sub–Micron Inter–Metal Dielectric Gap–Filling Using TEOS/Ozone APCVD", Reprinted from Microelectronics Manufacturing Technology (Jan. 1992).

Korman et al., "Low On–Resistance MOSFET for High Efficiency Switching Power Supplies", Power Electronics and Variable–Speed Drives, Conference Publication, No. 264, pp. 1–5 (Nov. 1986).

Kuo et al., "Modeling the Turn–Off Characteristics of the Bipolar–MOS Transistor," IEEE Electron Device Letters, vol. EDL–6, No. 5, pp. 211–214 (May 1985).

Kuo et al., "A 2μm Poly–Gate CMOS Analog/Digital Array", 1984 IEEE Solid–State Circuits Conference Digest of Technical Papers, pp. 262–263 (1984).

Larocquet et al., "Processes for Fabricating a Planar P–N–P Silicon Transistor," IRE Transactions on Component Parts, Sep., pp. 96–101 (Sep. 1962).

Lee, "Threshold Voltage of Short Channel IGFET", Semiconductor Silicon 1973, Electronics Division and Electrothermics and Metallurgy Division, The Electrochemical Society, pp. 791–803 (1973).

Lee, D.B., "Anisotropic Etching of Silicon," Journal of Applied Physics, vol. 40, No. 11, pp. 4569–4574 (Oct. 1969).

Lee et al., "Short–Channel Field–Effect Transistors in V–Grooves", IBM Technical Disclosure Bulletin, vol. 22, No. *B, pp. 3630–3634 (Jan. 1980).

Leff, L.S., "Geometry The Easy Way," $2^{nd}$ Ed., pp. 2, 7, 49 (1990).

Lefferts et al., "Session 1: Device Modeling and Characterization", IEEE International Solid–State Circuits Conference, pp. 16–17 (Feb. 1982).

Leistiko, Jr. et al., "Breakdown Voltage of Planar Silicon Junctions", Solid–State Electronics, An International Journal, vol. 9, pp. 847–852 (1996).

Levy et al., "Reflow Mechanisms of Contact VIAS in VLSI Processing", Journal of the Electrochemical Society: Solid–State Science and Technology, pp. 1417–1424 (Jul. 1986).

Levy, et al., "Evaluation of the Phosphorus Concentration and Its Effect on Viscous Flow and Reflow in Phosphosilicate Glass," Journal of ElectroChem. Soc., vol. 132, No. 6, pp. 1472–1480 (Jun. 1985).

Levy et al., "Viscous Behavior of Phosphosilicate and Borophosphosilicate Glasses in VLSI Processing", Solid–State Technology, pp. 123–130 (Oct. 1986).

Lewyn et al., "An IGFET Inversion Charge Model for VLSI Systems", IEEE Transactions on Electron Devices, vol. ED–32, No. 2, pp. 434–440 (Feb. 1985).

Lewyn et al., "Physical Limits of VLSI dRAM's", IEEE Transactions on Electron Devices, vol. ED–32, No. 2, pp. 311–321 (Feb. 1985).

Lidow et al., "Power MOSFET Technology", IEDM, IEEE, pp. 79–83 (1979).

Lin, "Resistance and Capacitance Calculations", Integrated Electronics, Westinghouse Electric Corporation, Molecular Electronics Division pp. 110–113 (Feb. 1968).

Liu et al., "A Novel Trench–Injector Power Device with Low On Resistance and High Switching Speed," , IEEE Electron Letters, vol. 9, No. 7, pp. 121–123 (Jul. 1988).

Liu et al., "Morphology of Silicon Islands Grown by Selective Epitaxy Over Silicon Dioxide", Materials Research Society Symposium Proc. vol. 33, pp. 169–174 (1986).

Liu et al., "Compositional Analysis and Electrical Property Measurements of CW Laser–Annealed InSb", Copyright 1982 by Elsevier Science Publishing Company, Inc., pp. 713–718 (1982).

Loh et al., "The Sidewall Resistor—A Novel Test Structure to Reliably Extract Specific Contract Resistably", IEEE Electronics Device Letters, vol. EDL–&, No. 9, pp. 477–479 (Aug. 1986).

Lonngren et al., "The Use of Microwaves to Evaluate the Temporal Hydration Behavior of Cement Paste", A Publication of the International Microwave Power Institute, vol. 5, No. 1, pp. 23–24 (1970).

Love et al., "A Large–Area Power MOSFET Designed for Low Conduction Losses", IEEE Transactions on Electron Devices, vol. ED–31, No. 6, pp. 817–820 (Jun. 1984).

Lu et al., "A Quantitative Model of the Effect of Grain Size on the Resistivity of Polycrystalline Silicon Resistors", IEEE Electron Device Letters, vol. EDL–1, No. 2, pp. 38–40 (Feb. 1980).

Lu et al., "A New Conduction Model for Polycrystalline Silicon Films", IEDM Technical Digest, International Electron Devices Meeting, pp. 833–834 (Dec. 1980).

Lu et al., "New Conduction Model for Polycrystalline Silicone Films", IEEE Electron Device Letters, vol. EDL–2; No. 4, pp. 95–98 (Apr. 1981).

Lu et al., "Modeling and Optimization of Monolithic Polycrystalline Silicon Reisitors", IEEE Transactions on Electron Devices, vol. ED–28, No. 7, pp. 818–830 (Jul. 1981).

Lu et al., "The Impact of Polysilicon–Resistor Scaling on the Performance of a VLSI Static RAM Cell", 1981 Symposium on VLSI Technology, Digest of Technical Papers, pp. 46–47 (1981).

Lu et al., "Scaling Limitations of Monolithic Polycrystalline–Silicon Resistors on VLSI Static RAM's and Logic", IEEE Transactions on Electron Devices, vol. ED–29, No. 4, pp. 682–689 (Apr. 1982).

Lu et al., "A Conduction Model for Semiconductor–Grain–Boundary–Semiconductor Barriers in Polycrystalline–Silicon Films", IEEE Transactions on Electron Devices, vol. ED–30, No. 1, pp. 137–149 (Jan. 1983).

MacIver et al., "j–MOS: A Versatile Power Field–Effect Transistor," IEEE Electron Device Letters, vol. EDL–5, No. 5, pp. 154–156 (May 1984).

MacIver et al., "j–MOS Transistors Fabricated in Oxygen–Implanted Silicon–on–Insulator", IEEE Transactions on Electron Devices, vol. ED–33, No. 12, pp. 1953–1955 (Dec. 1986).

MacIver et al., "Characteristics of Trench j–MOS Power Transistors", IEEE Electron Device Letters, vol. 10, No. 8, pp. 380–382 (Aug. 1989).

Machida et al., "SiO$_2$ Planarization Technology with Biasing and Electron Cyclotron Resonance Plasma Deposition for Interconnections", J. Vac. Sci. Technol. B. vol. 4, No. 4, pp. 818–821 (Jul./Aug. 1986).

MacWilliams et al., "Thermal Instability of Schottky Diode Barrier Heights Modified by Inert Ion Sputter–Etching Damage", IEEE Transactions on Electron Devices, EDL–7, No. 4, pp. 247–249 (Apr. 1986).

MacWilliams et al., "Complementary Silicon MESFETs for VLSI", IEDM Technical Digest, International Electron Devices Meeting, pp. 403–406 (Dec. 1986).

Magdo, I., "Vertical p–n–p for Complementary Bipolar Technology," , IEEE Journal of Solid–State Circuits, vol. SC–15, No. 4, pp. 459–461 (Aug. 1980).

Martinelli et al., "A Study of Forward Second–Breakdown in Silicon Bipolar Power Transistors Using the Unit–Cell Concept", IEDM Technical Digest, International Electron Devices Meeting, pp. 504–507 (Dec. 1982).

Massoud et al., "Thermal Oxidation of Silicon in Dry Oxygen, Accurate Determination of the Kinetic Rate Constants", Journal of the Electrochemical Society, vol. 132, No. 7, pp. 1745–1753 (Jul. 1985).

Massoud et al., "Thermal Oxidation of Silicon in Dry Oxygen Growth–Rate Enchancement in the Thin Regime, 1. Experimental Results", Journal of the Electrochemical Society, vol. 132, No. 11, pp. 2685–2693 (Nov. 1985).

Masuhara et al., "Complementary DMOS Process for LSI,", IEEE Journal of Solid–State Circuits, vol. SC–11, No. 4, pp. 452–458 (Aug. 1976).

Matsumoto et al., "Ultralow Specific on Resistance UMOSFET with Trench Contacts for Source and Body Regions Realised by Selfaligned Process", Electronics Letters, An International Publication, vol. 27, No. 18, pp. 1640–1642 (Aug. 1991).

Matsumoto et al., "A High–Performance Self–Aligned UMOSFET With a Vertical Trench Contact Structure", IEEE Transactions on Electron Devices, vol. 41, No. 5, pp. 814–818 (May 1994).

Mazuré et al., "Subband Resonance at Na$^+$–Contaminated Si—SiO$_2$ Interfaces", Solid State Communications, vol. 54, No. 5, pp. 443–446 (May 1985).

Meindl, "Micropower Circuits", Department of Electrical Engineering, Stanford University, pp. 1–259.

Meindl, "Interconnection Limits on Silicon Ultra Large Scale Integration", Center for Integrate Systems, Stanford University, pp. 3–12.

Meindl, et al., "Potential Improvements in Power–Speed Performance of Digital Cicuits", Proceeding of the IEEE, The Institute of Electrical and Electronics Engineers, pp. 815–816 (May 1971).

Meindl, et al., "Silicon Epitaxy and Oxidation", Process and Device Modeling for Integrated Circuit Design pp. 57–113 (Jul. 1977).

Meindl, "Biomedical Implantable Microelectronics", Science, vol. 210, pp. 263–267 (Oct. 1980).

Meindl et al., "Invited: Circuit Scaling Limits for Ultra–Large Scale Integration", 1981 IEEE International Solid–State Circuits Conference Digest of Technical Papers, pp. 36–37 (1981).

Meindl, "Theoretical, Practical and Analogical Limits in ULSI" IEDM, IEEE, pp. 8–13 (1983).

Meindl, "Ultra–Large Scale Integration", IEEE Transactions on Electron Devices, vol. ED–31, No. 11, pp. 1555–1561 (Nov. 1984).

Meindl et al., "Implantable Telemetry in Biomedical Research", IEEE Transactions on Biomedical Engineering, vol. BME–31, No. 12, pp. 817–823 (Dec. 1984).

Melen et al., "CCD and Photosensitive Devices, THPM 11.2: A Transparent–Electrode CCD Image Sensor", 1973 IEEE International Solid–State Circuits Conference, pp. 130–132 (1973).

Melen et al., "One–Phase CCD: A New Approach to Charge–Coupled Device Clocking", IEEE Journal of Solid–State Circuits, pp. 92–93 (Jul. 1971).

Mercier, et al., "Dry Etch–Back of Overthick PSG Films for Step–Coverage Improvement," Journal of ElectroChem. Soc., vol. 132, No. 5, pp. 1219–1222 (May 1985).

Michalka et al., "Modeling Silicon Consumption in a Repairable Wafer Scale Integration System", IEEE, pp. 109–112 (1986).

Mikoshiba et al., "A New Trench Isolation Technology as a Replacement of Locos", IEDM, pp. 578–581 (1984).

Millar et al., "Descriptive Geometry," pp. 54–55 (1930).

Miller, "Ionization Rates for Holes and Electrons in Silicon", The Physical Review, vol. 105, No. 4, Second Series, pp. 1246–1249 (Sep. 1957).

Minato et al., "Session XV: Static Rams, THPM 15:5: A 20ns 64K CMOS SRAM", 1984 IEEE International Solid–State Circuits Conference Digest of Technical Papers, pp. 222–223 and p. 373 (1984).

Minato et al., "A 20 ns 64K CMOS Static RAM", IEEE Journal of Solid–State Circuits, vol. SC–19, No. 6 pp. 1008–10013 (Dec. 1984).

Mogro–Campero et al., "Carrier Lifetime Reduction by Ion Implantation into Silicon", Material Research Symposium Proc. vol. 27, pp. 537–542 (1984).

Mogro–Campero et al., "Carrier Lifetime Reduction in Silicon", International Conference of Defects in Semiconductors (13$^{th}$: 1984), pp. 565–570 (1984).

Mogro–Campero et al., "Silicon–On–Insulator by Oxygen Implantation with a Stationary Beam", Applied Physics Letters, vol. 46, No. 9, pp. 862–864 (May 1985).

Mogro–Campero et al., "Shorter Turn–Off Times in Insulated Gate Transistors by Proton Implantation", IEEE Electron Device Letters, vol. EDL–6, No. 5, pp. 224–228 (May 1985).

Mogro–Campero et al., "Drastic Changes in the Electrical Resistance of Gold–Doped Silicon Produced by a Hydrogen Plasma", Journal of the Electrochemical Society, vol. 132, No. 8, pp. 2006–2009 (Aug. 1985).

Mogro–Campero et al., "Carrier Lifetime Reduction in Silicon by Proton Implantation Through MOS Structures", Journal of the Electrochemical Society, vol. 131, No. 11, pp. 2679–2682 (Nov. 1984).

Mogro–Campero et al., "Buried Oxide in Silicon by Oxygen Implantation into Scanned Wafers", Material Research Society Symposium Proc. vol. 45, pp. 305–309 (1985).

Mogro–Campero et al., "Comparison of Buried Oxide in Silicon by Oxygen Implantation Made by Wafer and Beam Scanning", Applied Physics Letters, vol. 48, No. 13, pp. 858–860 (Mar. 1986).

Mogro–Campero et al., "Carrier Lifetime Reduction in Silicon by High–Energy Neutron Irradiation", Journal of Applied Physics, vol. 59, No. 7, pp. 2592–2596 (Apr. 1986).

Mogro–Campero et al., "High–Temperature Annealing of Implanted Buried Oxide in Silicon", Journal of Applied Physics, vol. 60, No. 6, pp. 2103–2105 (Sep. 1986).

Mogro–Campero et al., "Localized Lifetime Control in Insulated–Gate Transistors by Proton Implantation", IEEE Transactions on Electron Devices, vol. ED–33, No. 11, pp. 1667–1671 (Nov. 1986).

Mohammadi et al., "A High–Voltage MOSFET in Polycrystalline Silicon", IEEE Transactions on Electron Devices, vol. ED–27, No. 1, pp. 293–295 (Jan. 1980).

Mohammadi et al., "Kinetics of the Thermal Oxidation of $Wsi_2$", Applied Physics Letters, vol. 35, No. 7 pp. 529–531 (Oct. 1979).

Mukherjee et al., "TDMOS—An Ultra–Low On–Resistance Power Transistor," IEEE Transactions on Electron Devices. Vo. 35, No. 12, p. 2459 (Dec. 1988).

Mukherjee et al., "A High Current Power IC Technology Using Trench DMOS Power Device", IEDM, IEEE, pp. 145–148 (1991).

Muramoto et al., "New Type of Bipolar–Mode MOS FET", JICST, vol. 40, No. 5, pp. 427–432 (1985).

Nagai et al.; "Capacitance/Voltage Characteristics of Semiconductor–Insulator–Semiconductor (SIS) Structure", Electronics Letters, An International Publication, pp. 376–377 (May 1983).

Nagai et al., "Effect Semiconductor Thickness of Capacitance–Voltage Characteristics of an MOS Capacitor", Japanese Journal of Applied Physics, vol. 23, No. 12, pp. 1659–1660 (Dec. 1984).

Nagai et al., "A High–Frequency Equivalent Circuit of MOS FET", Bulletin of the Electrotechnical Laboratory, Special Edition: Semiconductor Device V, pp. 34–40 (1971).

Nagai et al., "Field Controlled Charge Trapping in Tunnel Oxides", Applied Physics Letters, vol. 44, No. 9 pp. 910–912 (May 1984).

Nagai et al., "Long–term Effects of Injected Electronics in Tunnel Oxide on the Electrical Characteristics of Al Gate/ Thin Oxide/Si Structures—Relatively Low Oxide Field Case", IEEE Transactions on Electron Devices, vol. ED–30, No. 6, pp. 715–717 (Jun. 1983).

Nagata, "High–Power MOSFETS", Solid State Devices, Institute of Physics, Conference Series, No. 32, pp. 101–110 (1976).

Nagatomo et al., "A High Density 4M DRAM Process Using Folded Bitline Adaptive Side–Wall Isolated Capacitor (FASIC) Cell", IEDM, IEEE, pp. 144–147 (1986).

Nakagawa et al., "Experimental and Numerical Study on Non–Latch–Up Bipolar–Mode MOSFET Characteristics, "IDEM Technical Digest, IEEE Electron Devices meeting, pp. 150–153 (Dec. 1985).

Nakajima et al., "A Trench MOSFET With Surface Source/ Drain Contacts", IEDM Technical Digest, International Electron Devices Meeting, pp. 200–203 (Dec. 1985).

Nakajima et al., "An Isolation–Merged Vertical Capacitor Cell for Large Capacity DRAM" IEDM, pp. 240–243 (1984).

Nakamura et al., "290 psec $I^2L$ Circuits with Five–Fold Self–Alignment", IEEE IEDM, pp. 684–687 (1982).

Nakamura et al., "Buried Isolation Capacitor (BIC) Cell for Megabit MOS Dymanic RAM", IEDM, pp. 236–239 (1984).

Nakamura et al., "Ultra High Speed Bipolar Device–SCIOS", Extended Abstracts of the $18^{th}$ (1986 International) Conference on Solid State Devices and Materials, Tokyo, pp. 279–282 (1986).

Nakazato et al., "A 3GHz Lateral PNP Transistor", IEDM, IEEE, pp. 416–419 (1986).

Negrini et al., "Kinetics of Phosphorus Predeposition in Silicon Using $POCL_3$", Journal of the Electrochemical Society: Solid–State Science and Technology, vol. 122, No. 9, pp. 1254–1260 (Sep. 1975).

Nguyen et al., "Physical Mechanisms Responsible for Short Channel Effects in MOS Devices", IEDM, IEEE, pp. 596–599 (1981).

Nordstrom et al., "The Field–Effect Modified Transistor: A High–Responsibilty Photosensor", IEEE Journal of Solid–State Circuits, vol. SC–7, No. 5, pp. 411–417 (Oct. 1972).

Nordstrom et al., "Session XI: Detectors and Imaging Devices, THPM 11.3: The Field–Effect Modified Transistor: A New Compound Transistor", 1971 International Solid–State Circuits Conference, pp. 132–133 (1971).

Oakes et al., "A Power Silicon Microwave MOS Transistor," IEEE Transactions on Microwave Theory and Techniques, vol. MTT–24, No. 5, pp. 305–311 (Jun. 1976).

Ohashi et al., "Improved Dielectrically Isolated Device Integration by Silicon–Wafer Direct Bonding (SDB) Technique", IEDM, IEEE, pp. 210–213 (1986).

Ohkura et al., "Field Intensity Distribution of Reconstructed Image for a Point Object in Long Wavelength Hologram", The Transactions of the IECE of Japan, vol. E 62, No. 2, Abstracts, pp. 111–112 (Feb. 1979).

Ohmi, Power Static Induction Transistor Technology:, IEDM, IEEE, pp. 84–87 (1979).

Ohno et al., "Development of Key Components for SIMOX Intelligent Power LSIs", Electronics Letters, vol. 25, No. 16, pp. 1071–1072 (Aug. 1989).

Ohta et al., "A High–Speed Logic LSI Using Diffusion Self–Aligned Enhancement Depletion MOS IC", IEEE Journal of Solid–State Circuits, vol. SC–10, No. 5, pp. 314–321 (Oct. 1975).

Ohta et al., "Quadruply Self–Aligned MOS (QSA MOS)—A New Short–Channel High–Speed High–Density MOSFET for VLSI," , IEEE Journal of Solid–State Circuits, vol. SC–152, No. 4, pp. 417–423 (Aug. 1980).

Okada et al., "A New "SCIOS" Schottky Device", IEDM, IEEE, pp. 38–41 (1985).

Ou–Yang, P., "Double Ion Implanted V–MOS Technology,", IEEE Journal of Solid–State Circuits, pp. 3–10 (Feb. 1977).

Owyang et al., "Advances in Power MOSFET Technologies for Automotive Applications," THO299–8/89, IEEE, pp. 9–14 (1989).

Ozaki et al., "Contact Resistance Behavior in Borophosphosilicate Glass", V–MIC Conference, IEEE, pp. 323–329 (Jun. 1987).

Ozawa et al., "A Vertical Channel JFET Fabricated Using Silicon Planar Technology,", IEEE Journal of Solid–State Circuits, vol. SC–11, No. 4, pp. 511–518 (Aug. 1976).

Parekh, "On the Uniformity of Phosphorus Emitter Concentration for Shallow Diffused Transistors", Journal of the Electrochemical Society : Solid–State Science and Technology, vol. 119, No. 2, pp. 173–177 (Feb. 1972).

Pattanayak et al., "n–Channel Lateral Insulted Gate Transistors: Part I—Steady–State Characteristics", IEEE Transactions on Electron Devices, vol. ED–33, No. 12, pp. 1956–1963 (Dec. 1986).

Patton et al., "Characterization of Bipolar Transistors with Polysilicon Emitter Contracts", Symposium on VLSI Technology, pp. 54–55 (1984).

Patton et al., "Physics, Technology, and Modeling of Polysilicon Emitter Contracts for VLSI Bipolar Transistors", IEEE Transactions on Electron Devices, vol. ED–33, No. 11, pp. 1754–1768 (Nov. 1986).

Patton et al., "Impact of Processing Parameters on Base Current in Polysilicon Contracted Bipolar Transistors", IEDM Technical Digest, International Electron Devices Meeting, pp. 30–33 (Dec. 1985).

Pearce et al., "Lithologic and Weathering Influences on Slope Form and Process, Eastern Raukumara Range, New Zealand", Erosion and Sediment Transport in Pacific Rim Steeplands Symposium, IAHS–AISH Publication No. 132, pp. 93–123 (Jan. 1981).

Pettengill et al., "Receiving Antenna Design for Miniature Receivers", IEEE Transactions on Antennas and Propagation, pp. 528–530 (Jul. 1977).

Pfiester et al., "Complementary Hybrid MOS Technology", IEEE, pp. 47–50 (1984).

Pfiester et al., "E/D CMOS—A High Speed VLSI Technology", Symposium on VLSI Technology, pp. 44–45 (1983).

Pfiester et al., "Session XI: Scaling and Performance Aspects of Technology, THAM 11.4: Performance Limits of NMOS and CMOS", IEEE 1984 International Solid–State Circuits Conference Digest of Technical Papers, pp. 158–159 (1984).

Pfiester et al., "Performance Limits of CMOS ULSI", IEEE Transactions on Electron Devices, vol. ED–32 No. 2, pp. 333–343 (Feb. 1985).

Pfiester et al., "Pride: A Handheld Tool for IGFET Process and Device Design", IEEE International Conference on Circuits and Computers, ICCC 82, pp. 290–293 (Sep./Oct. 1982).

Phillips, A., "Transistor Engineering and Introduction to Integrated Semiconductor Circuits," McGraw–Hill Book Co., p. 216 (Oct. 1962).

Plummer et al., "High Voltage Monolithic MOS Driver Arrays", International Electron Devices Meeting, pp. 102 (Oct. 1971).

Plummer et al., "A Monolithic 200–V CMOS Analog Switch", IEEE Journal of Solid–State Circuits, vol. SC–11, No. 6 pp. 809–817 (Dec. 1976).

Plummer et al., "Two–Dimensional Transmit/Receive Ceramic Piezoelectric Arrays: Construction and Performance", IEEE Transactions on Sonics and Ultrasonics, vol. SU–25, No. 5, pp. 273–280 (Sep. 1978).

Plummer, "Monolithic MOS High Voltage Integrated Circuits", 1980 International Electron Devices Meeting Technical Digest, pp. 70–74 (1980).

Plummer et al., "Insulated–Gate Planar Thyristors: I—Structure and Basic Operation", IEEE Transactions on Electron Devices, vol. ED–27, No. 2, pp. 380–387 (Feb. 1980).

Plummer et al., "Thermal Oxidation: Kinetics, Charges, Physical Models, and Interaction with Other Processes in VLSI Devices", NATO Advanced Study Institute on Process and Device Simulation for MOS–VLSI Circuits, pp. 48–65 (1982).

Plummer, "Summary Abstract: Current Problems in Silicon Oxidation", Journal of Vacuum Science and Technology A, Second Series, vol. 1, No. 1, pp. 667 (1983).

Plummer, "Process and Device Modeling for VLSI Structures", Semiconductor Processing, ASTM, STP 850, pp. 21–37 (Feb. 1984).

Plummer, "Process Physics: Implications for Manufacturing of Submicron Silicon Device", Solid State Technology, pp. 61–66 (Mar. 1986).

Plummer, "Low Temperature CMOS Devices and Technology", IEDM Technical Digest, International Electron Device Meeting, pp. 378–381 (Dec. 1986).

Pocha et al., "Threshold Voltage Controllability in Double–Diffused–MOS Transistors", IEEE Transactions on Electron Device, vol. ED–21, No. 12, pp. 778–784 (Dec. 1974).

Pocha, "High Voltage Double MOS Transistors for Integrated Circuits", Stanford university, Ph.D., Engineering, electronics, and electrical, Xerox University Microfilms, Ann Arbor, Michigan, pp. 1–244 (1976).

Pocha et al., "A Computer–Aided Design Model for High–Voltage Double Diffused MOS (DMOS) Transistors, " IEEE Journal of Solid–State Circuits, vol. SC–11, No. 5, pp. 718–726 (Oct. 1976).

Pocha et al., "Tradeoff Between Threshold Voltage and Breakdown in High–Voltage Double–Diffused MOS Transistors", IEEE Transactions on Electron Device, vol. ED–25, No. 11, pp. 1325–1327 (Nov. 1978).

Pohlman et al., "Analog Multiplexers Switch High Voltage", Electronic Design, pp. 209–218 (Oct. 1983).

Possin et al., "Measurements of Heavy Doping Parameters in Processed Silicon Devices", IEDM Technical Digest, International Electron Devices Meeting, pp. 518–521 (Dec. 1979).

Possin et al., "Measurement of Heavy Doping Parameters in Silicon by Electron–Beam–Induced Current", IEEE Transactions on Electron Devices, vol. ED–27, No. 5, pp. 983–990 (May 1980).

Possin et al., "Measurements of Band Gap Narrowing in Heavily Doped Epitaxial Emitters and the Modeling of Heavily Doped Silicon", IEDM Technical Digest, International Electron Devices Meeting, pp. 270–275 (Dec. 1980).

Possin et al., "Measurements of the p–n Product in Heavily Doped Epitaxial Emitters", IEEE Transactions on Electron Devices, vol. ED–31, No. 1, pp. 3–17 (Jan. 1984).

Postolache et al., "The Planar/MOS Process for Obtaining Metal–Oxide Semiconductor (MOS) Structures of Minimum Bulk and Surface Defect Densities", Tudii Si Cercetari De Fizica, Tomul 26, 1974, A Acadamiei Republicii Socialiste Romania, pp. 591–604 (1974).

Price, "Anisotropic Etching of Silicon with KOH—$H_2O$–Isopropyl Alcohol", Semiconductor Silicon 1973, The Electrochemical Society, pp. 339–353 (1973).

Pshsenich, A., "MOS thyristor improves power–switching circuits," Electronic Design, pp. 165–170 (May 1983).

Quirk et al., Semiconductor Manufacturing Technology, Prentice–Hall, Chapter 10, pp. 225–255 and Chapter 18, pp. 515–544 (2001).

Rafferty et al., "Modeling LOCOS Effects on Diffusion", Semiconductor Silicon 1986, pp. 426–436 (1986).

Raghuram et al., "Exceptional Microhardness of Subgrain Boundaries in Niobium Single Crystals", Journal of Applied Physics, vol. 10, No. 1, pp. 4666 (Oct. 1969).

Ramo et al., "Fields and Waves in Communication Electronics," John Wiley & Sons, Inc., U.C.D. Library, p. 98 (1965).

Rao et al., "Trench Capacitors Design Issues in VLSI Dram Cells", IEDM, IEEE, pp. 140–143 (1986).

Ratnakumar et al., "High–Resolution Scanning Electron–Beam Annealing of Ion–Implanted Silicon", Applied Physics Letters, vol. 35, No. 6, pp. 463–466 (Sep. 1979).

Ratnakumar et al., "New IGFET Short–Channel Threshold Voltage Model", IEDM, IEEE, pp. 204–206 (1981).

Ratnakumar et al., "Session VII: Design Aids and Technology Limits, WPM 7.2: Performance Limits of E/D NMOS VLSI", Digest of Technical Papers, IEEE International Solid State Circuits Conference, pp. 72–73 (1980).

Rawson et al., "Temporal Frequency Dependence of Modal Noise in Fibres", Electronics Letters, vol. 16, No. 8, pp. 301–302 (May 1980).

Reddi, "Majority Carrier Surface Mobilities in Thermally Oxidized Silicon", IEEE Transactions on Electron Devices, vol. ED–15, No. 3, pp. 151–160 (Mar. 1968).

Reed et al., "Rapid Thermal Annealing of Interface States in Aluminum Gate Metal–Oxide–Silicon Capacitors", Applied Physics Letters, vol. 47, No. 4, pp. 400–402 (Aug. 1985).

Reed et al., "Two Reaction Model of Interface Trap Annealing", IEEE Transactions on Nuclear Science, vol. NS–33, No. 6, 12, pp. 1198–202 (1986).

Reed et al. "Kinetic Studies of Silicon—Silicon Dioxide Interface Trap Annealing Using Rapid Thermal Processing," Materials Research Soc. Symposia Proceedings, vol. 52, pp. 353–340 (1985).

Reid et al., "Wafer Fabrication and Process Automation research at Stanford University", Solid State Technology, Automation/Robotics, pp. 126–133 (Jul. 1984).

Restle et al., "Tests of Gaussian Statistical Properties of 1/f Noise", Journal of Applied Physics, vol. 54, No. 10, pp. 5844–5847 (Oct. 1983).

Reynolds et al., "Coupled TEM Bar Circuit for L–Band Silicon Avalanche Oscillators", IEEE Journal of Solid–State Circuits, vol. SC–5, No. 6, 11/70, pp. 346–353 (Nov. 1970).

Richardson et al., "A Trench Transistor Cross–Point DRAM Cell", IEDM, IEEE, pp. 714–717 (1985).

Robinson et al., "Lateral Insulated Gate Transistors with Improved Latching Characteristics", IEDM Technical Digest, International Electron Devices Meeting, pp. 744–747 (Dec. 1985).

Rodgers et al., "Session VI: MOS Techniques," ISSCC 76, pp. 110–113 (Feb. 1976).

Rodgers et al., "VMOS ROM,", IEEE Journal of Solid–State Circuits, vol. SC–12, No. 5, pp. 614–622 (Oct. 1976).

Rodgers et al., "VMOS: High–Speed TTL Compatible MOS Logic," , IEEE journal of Solid–State Circuits vol. SC–9, No. 5, pp. 239–250 (Oct. 1974).

Rodgers et al., "Session X: Technology Trends: Digital," ISSCC 74/Thursday, Feb.14,1974/Commonwealth, 2 pgs. (Feb. 1974).

Rodgers et al., "Epitaxial V–Groove Bipolar Integrated Circuit Process", IEEE Transactions on Electron Devices, vol. EDD–20, No. 3, pp. 226–232 (Mar. 1973).

Rodgers et al., "An Experimental And Theoretical Analysis of Double–Diffused MOS Transistors", IEEE Journal of Solid–State Circuits, vol. SC–10, No. 5, pp. 322–331 (Oct. 1975).

Rodgers, "Statistical Multiplexing Techniques", New Electronics, pp. 92–93 (Jan. 1980).

Rodgers, "Advanced Integrated Circuits Technology for Micropower Integrated Circuits", A Dissertation Submitted to the Department of Electrical Engineering and the Committee on Graduate Studies of Stanford University . . . , pp. 110–153 (Aug. 1975).

Rodgers et al., "Session Vii: High Speed Memory, WPM 7.4: VMOS Memory Technology", IEEE International Solid State Circuit Conference, pp. 74–75 (1977).

Rodgers et al., "VMOS Memory Technology", IEEE Journal of Solid–State Circuits, vol. SC–12, No. 5, pp. 515–524 (Oct. 1977).

Roggwiller et al., "A Highly Interdigited GTO Power Switch with Recessed Gate Structure", IEDM, pp. 439–442 (1984).

Rommelmann et al., "Noise–Power Studies of the Nearly Commensurate Quasi–One–Dimensional Conductor (N–Methylphenazinium)$_x$(Phenazine)$_{1-x}$(7,7,8,8–Tetracyano–p–Quinodimethane) [(NMP)$_x$(Phen)$_{1-x}$(TCNQ)]", Physical Review B, Condensed Matter, vol. 32, No. 2, pp. 1257–1263 (Jul. 1985).

Ronan, Jr. et al., "Circuit Influences on COMFET™ (IGT) Dynamic Latching Current", IEEE, pp. 73–78 (1986).

Rossen et al., "Ion–Enhanced Gas–Surface Kinetics: The Si—$Cl_2$—$Ar^+$ System", Applied Physics Letters, vol. 45, No. 8, pp. 860–862 (Oct. 1984).

Rung, "Trench Isolation Propects for Application on CMOS VLSI", IEDM Technical Digest, International Electron Devices meeting, pp. 574–577 (Dec. 1985).

Russell et al., "The COMFET—A New High Conductance MOS–Gated Device", IEEE Electron Device Letters, vol. EDL–4, No. 3, pp. 63–65 (Mar. 1983).

Russell et al.; "Level in $^{30}$Si Excited by the $^{26}$Mg(a, n)$^{29}$Si, $^{26}$Mg(a, y)$^{30}$Si and $^{26}$Mg Reactios", Nuclear Physics, North Holland Amsterdam, vol. A187, pp. 449–458 (Feb. 1972).

Russell et al., "Der Durchbruch, Der COMFET—Ein Neuer Hochspannungs–MOSFET", Leistungs–MOSFET, pp. 8–12.

Russell et al., "High–Power Conductivity–Modulated FET's (COMFET's) with a p–Type Channel", IEEE Electron Device Letters, vol. EDL–5, No. 11, pp. 437–439 (Nov. 1984).

Russell et al., "Nuclear Methods for "IN–SITU" Geophysical Investigations, Part I: Methods", Nuclear Science Applications, Section A vol. 2, No. 2, pp. 145–166 (1985).

Rusu et al., "Calculul inaltimii barierei de potential la diodele Schottky aluminiu–siliciu (n) custrat de suprafata dopat", Electrotehnica Electronica Automatica, pp. 93–97 (1980).

Rusu et al., "Tensiunea de strapungere a capacitorulul MOS", Electrotehnica Electronica Automatica pp. 125–130 (1978).

Rusu et al., "Numerical Calculation of Electrical Potential Distribution in Two–Dimensional Semiconductor Structures", Revue Roumaine Des Sciences Techniques, Tome 18, 3, pp. 463–478 (1973).

Rusu et al., "Surface Breakdown in Silicon, Field Distribution and Critical Field in Gate–Controlled Junctions", Revue Roumaine De Physique, Tome 19, No. 8, pp. 871–881 (1974).

Rusu et al., "The Field Distribution and the Critical Field in Surface–Breakdown–Limited Planar Silicon pn Junctions", International Journal of Electronics, Theoretical and Experimental, vol. 38, No. 5, pp. 597–607 (May 1975).

Rusu et al., "Enhanced Breakdown Voltage in Planar Metal–Overlap Laterally Diffused (MOLD) Schottky Diodes", Applied Physics Letters, vol. 27, No. 11, pp. 620–622 (Dec. 1975).

Rusu et al., "A New Uniform–Field Schottky–Barrier Structure", Revue Roumaine De Physique, Tome 21, No. 5, pp. 525–528 (1976).

Rusu et al., "Tenslunea de Strapungere a diodelor Schottky Planare", Electrotehnica Electronica Automatica, vol. 20, Nr. 4, pp. 157–163 (1976).

Rusu et al., "The Metal–Overlap Laterally–Diffused (MOLD) Schottky Diode", Solid–State Electronics, vol. 20, No. 6, pp. 499–506 (Jun. 1977).

Rusu et al., "Tensiunea de Strapungere a Capacitorulul MOS", Electrotehnica Electronica Automatica, vol. 22, nr.4, pp. 125–130 (1978).

Rusu et al., "The Breakdown Voltage of Planar Schottky Diodes", International Journal of Electronics Theoretical and Experimental, vol. 45, No. 5, pp. 523–534 (Nov. 1978).

Rusu et al., "Two–Dimensional Calculation of Avalanche Breakdown Voltage on Deeply–Depleted MOS Capacitors", IEDM Technical Digest, International Electron Devices Meeting, pp. 42–45 (Dec. 1978).

Rusu et al., "Reversible Breakdown Voltage Collapse in Silicon Gate–Controlled Diodes", Solid–State Electronics, vol. 23, No. 5, pp. 473–480 (May 1980).

Rusu et al., "Deep–Depletion Breakdown Voltage of Silicon–Dioxide/Silicon MOS Capacitors", IEEE Transactions on Electron Devices, vol. ED–26, No. 3, pp. 201–205 (Mar. 1979).

Sachelarie et al., "Design graphs for the Intrinsic Alpha Cut–Off Parameters ? $_a$, ?$_T$ and m of Bipolar Transistors", International Journal of Electronics, Theoretical and Experimental, vol. 47, No. 4, pp. 397–414 (Oct. 1979).

Sadamatsu et al., "New Self–Aligned Complemetary Bipolar Transistors Using Selective–Oxidation Mask", IEDM, pp. 753–756 (1984).

Sakai, "Recent Advances in High Speed Bipolar LSI Technology", Extended Abstracts of the 17th Conference on Solid State Devices and Materials, Tokyo, pp. 373–376 (1985).

Sakai et al., "Advanced Hi–CMOS Device Technology", IEDM; IEEE, pp. 534–537 (1981).

Sakai et al., "A 2 μm Hi–CMOS II Technology", 1981 Symposium on VLSI Technology, Digest of Technical Papers, pp. 26–27 (1981).

Sakamoto et al., "Buried Storage Electrode (BSE) Cell for Megabit DRAMS", IEDM, pp. 710–713 (1985).

Sakui et al., "A Simplified Accurate Three–Dimensional Table Look–Up MOSFET Model for VLSI Circuit Simulation", Proceedings of the IEEE 1985 Custom Integrated Circuits Conference, pp. 347–351 (May 1985).

Santoro et al., "Multilayer Metallization for LSI", Proceedings of the IEEE, vol. 59, No. 10, pp. 1403–1409 (OCt. 1971).

Sarace et al., "A Faster Generation of MOS Devices With Low Thresholds is Riding the Crest of the New Wave, Silicon–Gate IC's," p. 88–94 ( Mar. 1970).

Saraswat et al., "Borsenic Bipolar Process", Department of Electrical Engineering, Stanford University, pp. 437–439.

Saraswat et al., "Epitaxial Silicon Growth on Ion Implanted Silicon", Abstract No. 116, Extended Abstracts, vol. 77–1, pp. 310–311 (May 1977).

Saraswat et al., "A High Voltage MOS Switch", IEEE Journal of Solid–State Circuits, vol. SC–10, No. 3. pp. 136–142 (Jun. 1975).

Saraswat et al., "A New Bipolar Process–Borsenic", Technical Digest 1975, International Electron Devices Meeting, pp. 495–500 (Dec. 1975).

Saraswat et al., "Breakdown Walkout in Planar p–n Junctions", Solid–State Electronics, vol. 21, No. 6, pp. 813–819 (Jun. 1978).

Scharf et al., "Insulated–Gate Planar Thyristors: II–Quantitative Modeling", IEEE Transactions on Electron Devices, vol. ED–27, No. 2, pp. 387–394 (Feb. 1980).

Scharf, "An Insulated–Gate Thyristor Structure: Principles of Operation and Design", A Dissertation Submitted to the Department of Electrical Engineering . . . Stanford University, pp. 1–230 (Dec. 1979).

Schiltz et al., "Two–Layer Planarization Process", Journal of the Electrochemical Society: Solid–State Science and Technology, pp. 178–181 (Jan. 1986).

Sears et al., "High Voltage, High Speed, GaAs Schottky Power Rectifier", IEDM Technical Digest, International Electron Devices Meeting, pp. 229–232 (Dec. 1983).

Seela et al., Manganese(III) thiolate chemistry: new structural types, including the first mixed–valence metal thiolate, Inorganic Chemistry, vol. 24, pp. 4454–4458 (Dec. 1985).

Sekigawa et al., "Calculated Threshold–Voltage Characteristics of an XMOS Transistor Having an Additional Bottom Gate," Solid State Electronics, vol. 27, Nos. 8/9, pp. 827–828 (1984).

Sello, "Omnic Contact and Integrated Circuits", Abstract No. 509, Solid–State Electronics, vol. 11, No. 7, The Electrochemical Society, Inc., pp. 476–479 (Oct. 1968).

Shah et al., "Characterization of PSG Films Reflowed in Steam Using Rapid Thermal Processing", A.G. Associates, pp. 1–8.

Shand et al., "Glass Engineering Handbook, Chapter Two, Properties of Glass", second edition, pp. 16–21 (1958).

Sharma et al., "Negative Dynamic Resistance on MOS Devices", IEEE Journal of Solid–State Circuits, vol. SC–13, No. 3, pp. 378–380 (Jun. 1978).

Shealy et al., "Open Tube Diffusion of Zinc in Gallium Arsenide", IEEE Electron Device Letters, vol. EDL–1, No. 6, pp. 119–121 (Jun. 1980).

Shealy et al., "Preparation and Properties of Zinc Oxide Films Grown by the Oxidation of Diethylzinc", Journal of the Electrochemical Society, vol. 128, No. 3, pp. 558–561 (Mar. 1981).

Sheldon et al., "Application of a Two–Layer Planarization Process to VLSI Intermetal Dielectric and Trench Isolation Process", IEEE Transactions on Semiconductor Manufacturing, vol. 1, No. 4, pp. 140–145 (Nov. 1988).

Shenai et al., "A Novel High–Frequency Power FET Structure Fabricated Using LPCVD $WSI_2$–Gate and LPCVD Source Contact Technology," IEEE, pp. 5 pgs. (1988).

Shenai et al., "A Novel Trench Planarization Technique Using Polysilicon Refill, Polysilicon Oxidation, and Oxide Etchback", Symposium Power Semic Dev., IEEE, p. 198 (1991).

Shenai et al., "A 55–V, 0.2–mO· $cm^2$ Vertical Trench Power MOSFET", IEEE Electron Device Letters, vol. 12, No. 3, pp. 108–110 (Mar. 1991).

Shewchun et al., "Theoretical Tunneling Current Characteristics of the SIS (Semiconductor–Insulator–Semiconductor) Diode", Journal of Applied Physics, vol. 43, No. 12, pp. 5051–5061 (Dec. 1972).

Shewchun et al., "Experimentally Observed Admittance Properties of the Semiconductor–Insulator–Semiconductor (SIS) Diode", IEEE Transactions on Electron Devices, vol. ED–19, No. 9, pp. 1044–1050 (Sep. 1972).

Shibayama et al., "Characteristics of Gunn Effect Device on Bulk n–InP", IEEE Transactions on Electron Devices, vol. ED–24, No. 8, p. 1021 (Aug. 1977).

Shichijo et al., "Trench Transistor DRAM Cell", IEEE Electron Device Letters, vol. EDL–7, No. 2, pp. 119–121 (Feb. 1986).

Shikama et al., "Experimental Verification of the Small–Signal Theory of the Lateral Photovoltaic Effect in MOS Structures", Japanese Journal of Applied Physics, vol. 23, No. 1, pp. 55–61 (Jan. 1984).

Shimada et al., "Low Input Capacitance and Low Loss VD–MOSFET Rectifier Element", IEEE Transactions on Electron Devices, vol. ED–29, No. 8, pp. 1332–1334 (Aug. 1982).

Shimotori et al., "Session VII:High–Speed Memory, WPM 7.5: Fully Ion Implanted 4096–Bit High Speed DSA MOS RAM", EEE International Solid–State Circuit Conference, pp. 76–77 (1977).

Shimotori et al., "Dynamic DSA MOS RAM", The Transactions of the IECE of Japan, vol. E 61, No. 7 Abstracts, pp. 571–572 (Jul. 1978).

Shone et al., "A New Silicided Shallow Junction Technology for CMOS VLSI," International Symposium of VLSI Technology, Systems and Applications, pp. 147–151 (1985).

Shone et al., "Modeling Dopant Redistribution in $SiO_2$/$Wsi_2$/Si Structure", IEEE Technical Digest, International Electron Devices Meeting, pp. 534–537 (Dec. 1986).

Shone et al., "Formation of 0.1 μm $N^+$/P and $P^+$/N Junctions by Doped Silicide Technology", IEDM Technical Digest, International Electron Decices Meeting, pp. 407–410 (Dec. 1985).

Shukuri et al., "Submicron Channel MOSFET Using Focused Boron Ion Beam Implantable into Silicon", Extended Abstracts of the $16^{th}$ (1984 International) Conference of Solid State Devices and Materials, Kobe, pp. 91–94 (1984).

Sigg et al., "D–MOS Transistor for Microwave Applications", IEEE Transactions on Electron Devices, vol. ED–19, No. 1, pp. 45–53 (Jan. 1972).

Singh et al., "Hydrogenation by Ion Implantation for Scaled SOI/PMOS Transistors", IEEE Electron Devices Letters, vol. EDL–6, No. 3, pp. 139–141 (Mar. 1985).

Singh et al., "Scaling of SOI/PMOS Transistors", IEDM, IEEE, pp. 67–70 (1983).

Smith et al., "Exact Analysis of the Schmitt Trigger Oscillator", IEEE Journal of Solid–State Circuits, vol. SC–19, No. 6, pp. 1043–1046 (Dec. 1984).

Smith et al., "Metal Fill Pattern Tradeoffs for Reducing Capacitance Effects in CMN5 and CMN5 I Technologies", VLSI Technology, Inc., 10 pages (Nov. 1995).

Smith et al., "A Micropower IC for a Biomedical Pressure Transducer", Tranducers '85, 1985 International Conference on Solid–State Sensor and Actuators, pp. 42–45 (1985).

Smith et al., "Analysis, Design, and Performance of Micropower Circuits for a Capacitive Pressure Sensor IC", IEEE Journal of Solid–State Circuits, vol. SC–21, No. 6, pp. 1045–1056 (Dec. 1986).

Smith et al., "A Custom Analog IC for a Smart Pressure Sensor", Proceedings of the IEEE 1985 Custom Integrated Circuits Conference, pp. 140–143 (May 1985).

Smith et al., "An Analytical Model for the Forward Characteristics of Gate P–I–N Switches Applied to Lateral Structures", IEDM Technical Digest, International Electron Devices Meeting, pp. 488–491 (Dec. 1982).

Snow et al., "Polarization Phenomena and Other Properties of Phosphosilicate Glass Films on Silicon", Journal of the Electrochemical Society, pp. 263–269 (Mar. 1966).

Stork et al., "Process Sensitivity of Depleted Base Bipolar Transistors (BSIT)", 1981 Symposium on VLSI Technology, Digest of Technical Papers, pp. 40–41 (1981).

Stork et al., "Small Geometry Depleted Base Bipolar Transistors (BSIT)—VLSI Devices?" IEEE Transactions on Electron Devices, vol. ED–28, No. 11, pp. 1354–1363 (Nov. 1981).

Strifler et al., "Comparison of Neutron and Electron Irradation for Controlling IGT Switching Speed", IEEE Transactions on Electron Devices, vol. ED–32, No. 9, pp. 1629–1632 (Sep. 1985).

Su et al. "A New Complementary Monolithic Transistor Structure", IEEE Journal of Solid–State Circuits, vol. SC–7, No. 2, pp. 170–171 (Apr. 1972).

Su et al., "A New Complementary Bipolar Transistor Structure", Solid State Technology, pp. 53–58 (Apr. 1973).

Suchyta et al., "Case Report: Chronic Acinetobacter Calcoaceticus Var Anitratus Pneumonia", The American Journal of the Medical Sciences, vol. 294, No. 2, pp. 117–119 (Aug. 1987).

Sun et al., "Electron Mobility on Inversion and Accumulation Layers on Thermally Oxidized Silicon Surfaces", IEEE Transactions on Electron Devices, vol. ED–27, No. 8, pp. 1497–1508 (Aug. 1980).

Sun et al., "Modeling of the On–Resistance of LDMOS, VDMOS, and VMOS Power Transistors", IEEE Transactions on Electron Devices, vol. ED–27, No. 2, pp. 356–367 (Feb. 1980).

Suzuki et al., "A Low–Voltage Alterable Metal–Oxide–Nitride–Oxide–Semiconductor Memory with Nano–Meter Thick Gate Insulators, (NM–MONOS)", Proceedings of the $14^{th}$ Conference (1982 International) on Solid State Devices, Tokyo, 1982, Japanese Journal of Applied Physics, vol. 22, Supplement 22–1, pp. 581–582 (1982).

Suzuki et al., "A 165 ps/gate 5000–Gate ECL Gate Array", Extended Abstracts of the $17^{th}$ Conference on Solid State Devices and Materials, Tokyo, pp. 377–380 (1985).

Sugahara et al., "Power MOS FET for A–C 200–V in Switching Regulator", Toshiba review, vol. 40, No. 1 pp. 28–31 (1985).

Swanson et al., "Ion–Implanted Complementary MOS Transistors in Low–Voltage Circuits", IEEE Journal of Solid–State Circuits, vol. SC–7, No. 2, pp. 146–153 (Apr. 1972).

Swartz et al., "An Improved Wedge–Type Backing for Piezoelectric Transducers", IEEE Transaction on Sonics and Ultrasonics, vol. SU–26, No. 2, pp. 140–142 (Mar. 1979).

Swartz et al., "On the Generation of High–Frequency Acoustic Energy with Polyvinylidene Fluoride", IEEE Transaction on Sonics and Ultrasonics, vol. SU–27, No. 6, pp. 295–303 (Nov. 1980).

Swartz et al., "Integrated Silicon–$PVF_2$ Acoustic Transducer Arrays", IEEE Transactions on Electron Devices, vol. ED–26, No. 12, pp. 1921–1931 (Dec. 1979).

Sze, S.M., "Physics of Semiconductor Devices," p. 79 (1969).

Tamer et al., "Numerical Comparison of DMOS, VMOS, and UMOS Power Transistor", IEEE Transactions on Electron Devices, vol. ED–30, No. 1, pp. 73–76 (Jan. 1983).

Tantraporn, "Simple Measurement Technique for Voltage Dependent Capacitances", Journal of Applied Physics, vol. 10, No. 1, pp. 4665–4666 (Oct. 1969).

Tantraporn, "Determination of Low Barrier Heights in Metal–Semiconductor Contacts", Journal of Applied Physics, vol. 41, No. 11, pp. 4669–4671 (Oct. 1970).

Tantraporn et al., "A New High–Efficient Power Bulk Effect Amplifier", p. 42.

Tantraporn, "On the Study of Metal–Semiconductor Contacts", IEEE Transactions on Electron Devices vol. ED–19, No. 3, pp. 331–338 (Mar. 1972).

Tantraporn et al., "Avalanche Breakdown Criterion from Doping Profile Integral", IEEE Transactions on Electron Devices, vol. ED–19, No. 5, pp. 697–698 (May 1972).

Tantraporn et al., "Efficiencies of Schottky–Barrier GaAs and Both Complementary Structures of Si IMPATT Diodes", IEEE Transactions on Electron Devices, vol. ED–20, No. 5, pp. 492–496 (May 1973).

Tantraporn et al., "GaAs Double–Drift Avalanche Diode from Vapour–Phase Epitaxy", Electronics Letters vol. 11, No. 9, 3 pages (May 1975).

Tantraporn et al., "Si–Controlled Acalanche Logic", IEEE Transactions on Electron Devices, vol. ED–25, No. 5, pp. 520–528 (May 1978).

Tantraporn, "Flexible GaAs Ribbons", Applied Physics Letters, vol. 35, No. 6, pp. 449–451 (Sep. 1979).

Tantraporn et al., "Determination of Barrier Height at Apparently Obmic Contact", Abstract No. 516, Journal of the Electrochemical Society, vol. 127, No. 8, pp. 395C (Aug. 1980).

Tantraporn et al., "Multiple–Zone Single–Mask Junction Termination Extension—A High–Yield Near–Ideal Breakdown Voltage Technology", IEEE Transactions on Electron Devices, vol. ED–34, No. 10, pp. 2200–2210 (Oct. 1987).

Tarui et al., "The Charging Carriers of the Interface States of the MOS Structure and Their Effect on the Static Characteristics of the MOS Transistor", Electronics & Communications in Japan, vol. 53, pp. 146–153 (Feb. 1970).

Tarui et al., "The Charging Carrier of the Interface States of the MOS Structure and the Static Characteristics of the MOS Transistor," The Transactions of the Institute of Electronics and Communications Engineers of Japan, vol. 53, No. 2, pp. 29–30 (Feb. 1970).

Tarui et al., "Electrically Reprogammable Nonvolatile Semiconductor Memory," IEEE Journal of Solid–State Circuits, vol. SC–7, No. 5, pp. 369–375 (Oct. 1972).

Tarui et al., "A 40–ns 144–Bit n–Channel MOS–LSI Memory", IEEE Journal of Solid–State Circuits, vol. SC–4, No. 5, pp. 271–279 (Oct. 1969).

Tarui et al., "Diffusion Self–aligned MOST: A New Approach for High Speed Device," Proceedings of the $1^{st}$ Conf. on Solid State Devices, Tokyo, pp. 105–110 (1969).

Tarui et al., "Graded Gate MOS Capacitance Characteristics", Bulletin of the Electrotechnical Laboratory, pp. 117–124 (Jul. 1972).

Temple et al., "An Investigation of the Effect of Two–Band Model of the Barrier on the Tunnelling Characteristics of Degenerate MIS Diodes", Solid–State Electronics, vol. 17, No. 5, pp. 417–426 (May 1974).

Temple et al., "Equilibrium–to–Nonequilibrium Transition in MOS (Surface Oxide) Tunnel Diode", Journal of Applied Physics, vol. 45, No. 11, pp. 4934–4943 (Nov. 1974).

Temple et al., "Calculation of the Diffusion Curvature Related Avalanche Breakdown on High–Voltage Planar p–n Junctions", IEEE Transactions on Electron Devices, vol. ED–22, No. 10, pp. 910–916 (Oct. 1975).

Temple et al., "A Simple Etch Contour for Near Ideal Breakdown Voltage in Plane and Planar P–N Junctions", Technical Digest 1975, International Electron Devices Meeting, pp. 171–174 (Dec. 1975).

Temple et al., "Enchancement of Breakdown Voltage Using Floating Metal Field Plates", International Journal of Electronics, Theoretical & Experimental, vol. 40, No. 3, pp. 293–302 (Mar. 1976).

Temple et al., "The Theory and Application of a Simple Etch Contour for Near Ideal Breakdown Voltage in Plane and Planar p–n Jucntions", IEEE Transactions on Electron Devices, vol. ED–23, No. 8 pp. 950–955 (Aug. 1976).

Temple et al., "High Power Dual Amplifying Gate Light Triggered Thyristors", IEEE Transactions on Electron Devices, vol. Ed–23, No. 8, pp. 893–898 (Aug. 1976).

Temple et al., "A Substrate Etch Geometry for Near Ideal Breakdown Voltage in p–n Junction Devices," IEEE Transactions on Electron Device, vol. ED–24, No. 8, pp. 1077–1081 (Aug. 1977).

Temple et al., "The Planar Junction Etch for High Voltage and Low Surface Fields in Planar Devices", IEEE Transactions on Electron Devices, vol. ED–24, No. 11, pp. 1304–1310 (Nov. 1977).

Temple et al., "A 600 Volt MOSFET with Near Ideal on Resistance", IEDM Technical Digest, International Electron Devices Meeting, pp. 664–666 (Dec. 1978).

Temple et al., "Theoretical Comparison of DMOS and VMOS Structures for Voltage and On–Resistance", IEDM, IEEE, pp. 88–92 (1979).

Temple et al., "A 600–Volt MOSFET Designed for Low On–Resistance", IEEE Transactions on Electron Devices, vol. ED–27, No. 2, pp. 343–349 (Feb. 1980).

Temple, "Development of a 2.6–kV Light–Triggered Thyristor for Electric Power Systems", IEEE Transactions on Electron Devices, vol. ED–27, No. 3, pp. 583–591 (Mar. 1980).

Temple, "Practical Aspects of the Depletion Etch Method in High–Voltage Devices", IEEE Transactions on Electron Devices, vol. Ed–27, No. 5, pp. 977–982 (May 1980).

Temple, "Inverter Light Triggered Thyristor with Unique Arm–Structure Amplifying Gate", IEEE Transactions on Electron Devices, vol. ED–26, No. 7, pp. 801–807 (Jul. 1981).

Temple, "Comparison of Light Triggered and Electrically Triggered Thyristor Turn–On", IEEE Transactions on Electron Devices, vol. ED–28, No. 7, pp. 860–865 (Jul. 1981).

Temple, "Thyristor Devices for Electric Power Systems", IEEE Transaction on Power Apparatus and Systems, vol. PAS–101, No. 7, pp. 2286–2291 (Jul. 1982).

Temple, "MOS Controlled Thyristors (MCT's ) in Energy Conversion Systems", Volume one of four, $22^{nd}$ Intersociety Energy Conversion Engineering Conference, pp. 293–299 (Aug. 1987).

Temple, "Ideal FET Doping Profile", IEEE Transactions on Electron Devices, vol. ED–30, No. 6, pp. 619–626 (Jun. 1983).

Temple et al., "Optimizing Carrier Lifetime Profile for Improved Trade–Off Between Turn–Off Time and Forward Drop", IEEE Transactions on Electron Devices, vol. ED–30, No. 7, pp. 782–790 (Jul. 1983).

Temple, "Controlled Turn–On Thyristors", IEEE Transactions on Electron Devices, vol. Ed–30, No. 7, pp. 816–824 (Jul. 1983).

Temple, "Increased Avalanche Breakdown Voltage and Controlled Surface Electric Fields Using a Junction termination Extension (JTE) Technique", IEEE Transactions on Electron Devices, vol. ED–30, No. 8, pp. 954–957 (Aug. 1983).

Temple, "MOS–Controlled Thyristors—A New Class of Power Devices", IEEE Transactions on Electron Devices, vol. ED–33, No. 10, pp. 1609–1618 (Oct. 1986).

Temple, "Junction Termination Extension for Near–Ideal Breakdown Voltage in p–n Junctions", IEEE Transactions on Electron Devices, vol. ED–33, No. 10, pp. 1601–1608 (Oct. 1986).

Temple et al., "Effect of Temperature and Load on MCT Turn–Off Capability", IEDM Technical Digest, International Electron Devices Meeting, pp. 118–121 (Dec. 1986).

Terada et al., "Advanced DMOS Memory Cell using Trench Isolation", 1982 Symposium VLSI, pp. 64–65 (1982).

Terada et al., "Advanced DMOS Memory Cell Using a New Isolation Structure", IEEE Transactions on Electron Devices, vol. ED–31, No. 9, pp. 1308–1313 (Sep. 1984).

Thomas et al., "A Planar Multi–Level Tungsten Interconnect Technology", IEDM, IEEE, pp. 811–813 (1986).

Tihanyi, "Smart Power Technologies", Siemens AG, Semiconductor Divison, IEEE, pp. 5–99—5–104 (1989).

Tokuda et al., "Evaluation of Interface States in MOS Structures by DLTS with a Bipolar Rectangular Weighting Function", Journal of Physics D, Applied Physics, vol. 14, No. 5, pp. 895–898 (May 1981).

Tong et al., "Process and Film Characterization of PECVD Borophosphosilicate Films for VLSI Applications", Solid State Technology, pp. 161–170 (Jan. 1984).

Toyoda et al., "Research and Development on LSI in Electrical Communication Laboratories", Review of the Electrical Communication Laboratories, Nippon Telegraph and Telephone Public Corporation, pp. 1–9 (Jan./Feb. 1979).

Ueda et al., "Optimum Design of Vertical Power MOSFET with Thick Drain Oxide", The Transactions of the Institute of Electronics and Communication Engineers of Japan, vol. J69–C, No. 10, pp. 1229–1238 (Oct. 1986).

Ueda et al., "U–MOS Power FET", National Technical Report, vol. 29, No. 2, pp. 143–150 (Apr. 1983).

Ueda et al., "A New Vertical Double Diffused MOSFET— The Self–Aligned Terraced–Gate MOSFET", IEEE Transactions on Electron Devices, vol. ED–31, No. 4, pp. 416–420 (Apr. 1984).

Ueda et al., "A New Vertical Sidewall Channel Power MOSFET with Rectangular Grooves," Solid State Devices and Material, pp. 313–316 (Aug./Sep. 1984).

Ueda et al., "A New Vertical Power MOSFET Structure with Extremely Reduced On–Resistance," IEEE Transactions on Electron Device, vol. ED–32, No. 1, 5 pgs. (Jan. 1985).

Ueda et al., "Deep–Trench Power MOSFET with An Ron Area Product of 160 mO mm$^2$", IEDM, IEEE, pp. 638–641 (1986).

Ueda et al., "A New Injection Suppression Structure for Conductivity Modulated Power MOSFETs", Extended Abstracts of the 18$^{th}$ (1986 International) Conference on Solid State Devices and Materials, Tokyo, pp. 97–100 (1986).

Ueda et al., "Ultra–Low On–Resistance RMOSFET", National Technical Report vol. 32, No. 2, pp. 18–24 (Apr. 1986).

Ueda et al., "A New Channel–Doping Technique For High– Voltage Depletion–Mode Power MOSFET's", IEEE Electron Device Letters, vol. EDL–7, No. 5, pp. 311–313 (May 1986).

Ueda et al., "An Ultra–Low On–Resistance Power MOSFET Fabricated by Using a Fully Self–Aligned Process", IEEE Transactions on Electron Devices, vol. ED–34, No. 4, pp. 926–930 (Apr. 1997).

Ueda et al., "GaAs Lateral Bipolar Transistor with Field– Separated Carriers", Electronics Letters, vol. 23, No. 17, pp. 899–900 (Aug. 1987).

Ueda et al., "Design of Power U–MOSFET", JICST, vol. 81, pp. 87–93 (Feb. 1982).

Usunaga et al., "Power VD MOS FET Design and Application", JICST, vol. 82, No. 5, pp. 17–21 (Apr. 1982).

Vincent et al., "Preparation and Physical Properties of Trinuclear Oxo–Centered Manganese Complexes of the General Formulation $[Mn_3O(O_2CR)_6L_3]^{0,+}$ [R = Me or Ph; L = a Neutral Donor Group] and the Crystal Structures of $[Mn_3O(O_2Cme)_6(pyr)_3](pyr)$ and $[Mn_3O(O_2CPh)_6(pyr)_2(H_2O)]$ ·0.5MeCN", Journal of the American Chemical Society, vol. 109, No. 19, pp. 5703–5710 (Sep. 1987).

Vladimirescu et al., "Calculul de Prolectare a Frecventei fa la Tranzistoare", Electrontehnica Electronica Automatica, pp. 64–67 (1976).

Vora et al., "A Sub–100 Picosecond Bipolar ECL Technology", IEDM, IEEE, pp. 34–37 (1985).

Wei et al., "Reduction in the Effective Barrier Height in PtSi–p–Si Schottky Diodes by Using Low Energy Ion Implantation", Thin Solid Films, vol. 93, No. 93, No. 3/4, pp. 407–412 (Jul. 1982).

Weissman et al., "Calculations of Experimental Implications of Tensor Properties of Resistance Fluctuations", Journal of Applied Physics, vol. 53, No. 9, pp. 6276–6279 (Sep. 1982).

Weissman et al., "Thermally Activated Features in l/f Noise in Silicon on Sapphire", Physical Review B, Condensed Matter, vol. 27, No. 2, pp. 1428–1431 (Jan. 1983).

Wessels et al., "Vertical Channel Field–Controlled Thyristors with High Gain and Fast Switching Speeds", IEEE, Transactions on Electron Devices, vol. ED–25, No. 10, pp. 1261–1265 (Oct. 1978).

Weston et al., "Monolithic High Voltage Gated Diode Crosspoint Array IC", IEDM Technical Digest, International Electron Devices Meeting, pp. 85–88 (Dec. 1982).

Wheatley, Jr. et al., "On the Proportioning of Chip Area for Multistage Darlington Power Transistors", IEEE Transactions on Electron Devices, vol. ED–23, No. 8, pp. 870–878 (Aug. 1976).

Wheatley, Jr. et al., "COMFET: l'ultime commutateur de puissance ?", Electronique De Puissance, pp. 32–40.

Wheatley, Jr., "Integrated Solid–State Devices", Automotive Electronics, pp. 38–66 (Feb. 1974).

Wheatley, Jr. et al., "COMFET—The Ultimate Power Device: A General Study of Power Devices", Solid State Technology, pp. 121–128 (Nov. 1985).

Wheatley, Jr. et al., "Switching Waveforms of the L$^2$FET: A 5–Volt Gate–Drive Power MOSFET", PESC'84 Record, 15$^{th}$ Annual IEEE Power Electronics Specialists Conference, pp. 238–246 (Jun. 1984).

Wheatley, "Observation of the Influence of Base Widening Upon Beta and $f_T$", RCA Review vol. 32, pp. 247–250 (Jun. 1971).

White, "Planarization Properties of Resist and Polyimide Coatings", Journal of the Electrochemical Society, Solid– State Science and Technology, pp. 1543–1548 (Jul. 1983).

Wieder et al., "2–D Analysis of the Negative Resistance Region of Vertical Power MOS–Transistors", IEDM Technical Digest, International Electron Devices Meeting, pp. 95–99 (Dec. 1980).

Wiedmann, "Status and Trends of I²L/MTL Technology", IEDM, IEEE, pp. 47–50 (1983).

Wildi et al., "A Micropower, Small Input–to–Output Delay, High–Voltage Bipolar Driver/Demultiplexer IC", IEEE Journal of Solid–State Circuits, vol. SC–16, No. 1, pp. 23–30 (Feb. 1981).

Williams et al., "LPCVD of Borophosphosilicate Glass from Organic Reactants", Journal of the Electrochemical Society: Solid–State Science and Technology, pp. 657–664 (Mar. 1997).

Williams et al., "A DI/JI–Compatible Monolithic High–Voltage Multiplexer," IEEE Transactions on Electron Device, vol. ED–33, No. 12, pp. 1977–1984 (Dec. 1986).

Wils et al., "Rapid Thermal Annealing of BRSG: Influence on Flow Characteristics and Electrical Properties", VMIC Conference, pp. 173–179 (Jun. 1992).

Wolf et al., "Silicon Processing for the VLSI Era," vol. 1, pp. 188–189 (1986).

Woo et al., "Short–Channel Effects in MOSFET's at Liquid–Nitrogen Temperature", IEEE Transactions on Electron Devices, vol. ED–33, No. 7, pp. 1012–1019 (Jul. 1986).

Xian–E, et al., "L–Band Si Power V–Pet," IEEE MTT–S Digest 1982, pp. 74–75 (1982).

Yamaguchi et al., "Process and Device Performance of Sub-micrometer–Channel CMOS Devices Using Deep–Trench Isolation and Self–Aligned TiSi2 Technologies," , IEEE Journal of Solid–State Circuits, vol. SC–20, No. 1, pp. 104–133 (Feb. 1985).

Yamaguchi et al., "Two–Dimensional Analysis of Triode–Like Operation of Junction Gate FET's," IEEE Electron Device Letters, vo. ED–22, No. 11, pp. 1047–1049 (Nov. 1975).

Yanagawa et al., "Failure Analysis of Evaporated Metal Interconnections at Contact Windows", 8$^{th}$ Annual Proceedings, Reliability Physics, pp. 133–143 ( Apr. 1970).

Yanagisawa et al., "Trench Transistor Cell With Self–Aligned Contact (TSAC) for Megabit MOS DRAM", IEDM, IEEE, pp. 132–135 (1986).

Yatsuo et al., "Ultrahigh–Voltage High–Current Gate Turn–Off Thyristors," IEEE Transactions on Electron Devices, vol. ED–31, No. 12, pp. 1681 (Dec. 1984).

Yilmaz et al., "Insulated Gate Transistor Modeling and Optimization", IEDM Technical Digest, International Electron Devices Meeting, pp. 274–277 (1984).

Yilmaz et al., "Floating Metal Rings (FMR), A Novel High–Voltage Blocking Technique", IEEE Electron Device Letters, vol. EDL–6, No. 1, pp. 600–601 (Jan. 1985).

Yilmaz et al., "Insulated Gate Transistor Physics: Modeling and Optimization of the On–State Characteristics", IEEE Transactions on Electron Devices, vol. ED–32, No. 12, pp. 2812–2818 (Dec. 1985).

Yilmaz et al., "Comparison of the Punch–Through and Non–Punch–Through IGT Structures", IEEE Transactions on Industry Applications, vol. IA–22, No. 3, pp. 466–470 (May 1986).

Yoshida et al., "Low–On–Resistance and High–Reliability Power MOSFETS," PESC/88 Record 4/88, pp. 674–680 (Apr. 1988).

Yoshida et al., "A High Power MOSFET with a Vertical Drain Electrode and a Meshed Gate Structure,", IEEE Journal of Solid–State Circuits, vol. SC–_, No. 4, pp. 472–477 (Aug. 1976).

Yoshida et al., "Thermal Stability and Secondary Breakdown in Planar Power MOSFET's", IEEE Transactions on Electron Devices, vol. ED–27, No. 2, pp. 395–398 (Feb. 1980).

Yu et al., "Dynamic Two–Dimensional Computer Simulation of Three–Thermal Semiconductor Devices", General Electric Coporate Reseacrh and Development, pp. 617–628.

Yu et al., "Series–Parallel Operation of Gunn Diodes—A New Approach to High Power Solid–State Microwave Sources", International Electron Devices Meeting, pp. 134 (Oct. 1968).

Yu et al., "Transit–Time Negative Conductance in GaAs Bulk–Effect Diodes", IEEE Transactions on Electron Devices, vol. ED–18, No. 2, pp. 89–93 (Feb. 1971).

Yu et al., "Device Physics of a New Trapatt Oscillator", IEEE Transactions on Electron Devices, vol. ED–22, No.3, pp. 140–145 (Mar. 1975).

Yu et al., "A Computer Simulation Scheme for Various Solid–State Devices", IEEE Transactions on Electron Devices, vol. ED_22, No. 8, pp. 515–522 (Aug. 1975).

Yu et al., Hot Hole Effects and Experimental Results on the Controlled Avalanche Transactionssit–time triode at S–band, IEEE Transactions on Electron Devices, p. 1066 (Nov. 1975).

Yu et al., "Theory of a New Three–Terminal Microwave Power Amplifier", IEEE Transactions on Electron Devices, vol. ED–23, No. 3, pp. 332–343 (Mar. 1976).

Yu et al., "Planarized Deep–Trench Process for Self–Aligned Double Polysilicon Bipolar Device Isolation", Journal of the Electrochemical Society, vol. 137, No. 6, pp. 1942–1950 (Jun. 1990).

Yusa et al., "The Operational Characteristics of a Static Induction Transistor (SIT) Image Sensor", IEDM, IEEE, pp. 440–443 (1985).

Yuuki et al., "600V VD–MOS FET", JICST, vol. 81, No. 232, pp. 39–45 (Jan. 1982).

Zeitzoff et al., An Isolated Vertical n–p–n Transistor in an n–Well CMOS Process, IEEE Journal of Solid–State Circuits, vol. SC–20, No. 2, pp. 489–494 (Apr. 1985).

Zeng et al., "An Ultra Dense Trench–Gated Power MOSFET Technology Using a Self–Aligned Process", ISPSD'01, Proceeding of the 13$^{th}$ International Symposium on Power Semiconductor Devices & Ics, pp. 147–150 (Jun. 2001).

Int'l Electron Devices Meeting, Abstracts, p. 14 (Oct. 1966).

Watkins–Johnson's New Intermetal Dielectric Planarization Process featuring Superior Antihillock Control, 1 pg.

Microcontrol Electronic Wafer Handling System, "The solution to increase your yields is in your hands," distributed by R. Howard Strasbaugh, Inc., 4 pgs.

R. Howard Strasbaugh, Inc., Model 6DS, Wafer Polisher and Planarizer, 6 pgs.

Electrotech Product Line–Up, 6 pgs.

Genus Incorporated, Intoducing Multilevel VIAS Planarized with Low Rc Selective Tungsten Plugs, 3 pgs.

Toshiba document, Journal of the Inst. Of Elect. Engineers of Japan, vol. 100, No. 10, pp. 889–892 (Oct. 1980).

Journ. Of the Institute of Electrical Engineers of Japan, vol. 98, No. 4, Ultranslated pp. 38–42 (Apr. 1978).

Nikkei Electronics, MOSFET, pp. 101–103 (Jan. 1986).

IBM Technical Disclosure Bulletin, "Inversion Charge Transistor," pp. 86–87 (Jun. 1978).
IBM Technical Disclosure Bulletin, "Trench Transistor with Independent Gate Control," vol. 29, No. 3, p. 1028 (Aug. 1986).
IBM Technical Disclosure Bulletin, "Process for Trench Planarization," (Aug. 1986).
V–FET, Untranslated Japanese pp. 36–39 (1975).
Electronics, Solid State–Seaming Flaw, 3 pgs. (Apr. 1969).
Journal of the Electrochemical Soc. Abstracts of "Recent News" Papers, p. 301C, Nov. 1972).
McGraw–Hill Dictionary of Scientific and Technical Terms, Fifth Edition, pp. AOS–0012395–0012414 (1994).
Universal Dictionary of the English Language, Henry Cecil Wytd, London, George Routledge & Sons, LTD., 28 pages.
IEEE Standard Dictionary of Electrical and Electronics Terms, ANSI/IEEE Std 100–1984, 12 pages (1984).
Random House College Dictionary, Revised Edition, 35 pages (1975).
Electronics and Nucleonics Dictionary, Cooke and Markus, McGraw–Hill, 8 pages (1960).
The Oxford illustrated Dictionary, Second Edition, Oxford University Press, Ely House, London, 20 pages (1975).
P–H Tech Ref Series, Encyclopedic Dictionary Electronic Terms, John E. Traister, Robert J. Traister, Prentice–Hall, Inc. 8 pages (1984).
The Digital Dictionary, A Guide to Digital Equipment Coporation's Technical Terminology, Second Edition, Revised and Expanded, 5 pages (1986).
McGraw–Hill, Dictionary of Scientific and Technical Terms, Third Edition, 26 pages (1984).
Webster's Ninth New Collegiate Dictionary, A Merriam–Webster, 27 pages (1984).
Webster's New Collegiate Dictionary, A Merriam–Webster, 6 pages (1981).
NewWorld Dictionary, Simon & Schuster, Inc., 4 pages (1983).
The Concise Oxford Dictionary,, Oxford University Press, © Oxford University Press, 32 pages (1982).
Sams, Modern Dictionary of Electronics, Sixth Edition, Rudolf F. Graf, Sixth Printing—1991, 18 pages (1991).
The Concise Oxford Dictionary, p. 782 (1982).
Webster's Ninth New Collegiate Dictionary, A Marriam–Webster, p. 898.
Sams, Rudolf F. Graf, Modern Dictionary of Electronics, Sixth Edition, p. 1056.
Millar et al., "Descriptive Geometry", pp. 54–55 (1930).
Trapp et al., "Semiconductor Technology Handbook", Technology Associates, Complete handbook pp. 1 to the end of the glossary (1987).
Severns et al., "MOSPOWER," Siliconix Applications Handbook, 499 pgs. (1985).

* cited by examiner

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claim 11 is confirmed.

Claims 1–10 are cancelled.

\* \* \* \* \*